US012610707B2

(12) United States Patent
Ito et al.

(10) Patent No.: US 12,610,707 B2
(45) Date of Patent: Apr. 21, 2026

(54) DISPLAY APPARATUS, ELECTRONIC DEVICE, AND METHOD OF MANUFACTURING SEMICONDUCTOR DEVICE

(71) Applicant: Semiconductor Energy Laboratory Co., Ltd., Kanagawa-ken (JP)

(72) Inventors: Minato Ito, Atsugi (JP); Munehiro Kozuma, Atsugi (JP); Yuki Okamoto, Atsugi (JP); Yusuke Koumura, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 386 days.

(21) Appl. No.: 18/284,622

(22) PCT Filed: Mar. 18, 2022

(86) PCT No.: PCT/IB2022/052461
§ 371 (c)(1),
(2) Date: Sep. 28, 2023

(87) PCT Pub. No.: WO2022/208221
PCT Pub. Date: Oct. 6, 2022

(65) Prior Publication Data
US 2024/0179987 A1 May 30, 2024

(30) Foreign Application Priority Data
Mar. 31, 2021 (JP) ................................. 2021-060330

(51) Int. Cl.
*H10K 59/131* (2023.01)
*H10K 59/12* (2023.01)
(Continued)

(52) U.S. Cl.
CPC ..... *H10K 59/1315* (2023.02); *H10K 59/1201* (2023.02); *H10K 59/1213* (2023.02); *H10K 59/127* (2023.02)

(58) Field of Classification Search
None
See application file for complete search history.

(56) References Cited

U.S. PATENT DOCUMENTS

| | | | |
|---|---|---|---|
| 8,520,312 B2 | 8/2013 | Miyano | |
| 9,496,408 B2 | 11/2016 | Yamazaki et al. | |

(Continued)

FOREIGN PATENT DOCUMENTS

| | | |
|---|---|---|
| CN | 111833801 A | 10/2020 |
| EP | 3716258 A | 9/2020 |

(Continued)

OTHER PUBLICATIONS

International Search Report (Application No. PCT/IB2022/052461) Dated Jun. 21, 2022.

(Continued)

*Primary Examiner* — Khaja Ahmad
(74) *Attorney, Agent, or Firm* — Husch Blackwell LLP

(57) ABSTRACT

A display apparatus with a driver circuit having redundancy is provided. The display apparatus includes a first layer and a second layer positioned above the first layer. The first layer includes a first driver circuit and a second driver circuit. The second layer includes a first pixel region and a second pixel region. The first pixel region includes a first pixel circuit and the second pixel region includes a second pixel circuit. The first pixel region includes a region overlapping with the first circuit and the second pixel region includes a region overlapping with the second circuit. The first pixel circuit is electrically connected to the first driver circuit through a first wiring, the second pixel circuit is electrically connected to (Continued)

the second driver circuit through a second wiring, and the first wiring is electrically connected to the second wiring through a switch.

6 Claims, 36 Drawing Sheets

(51) Int. Cl.
H10K 59/121 (2023.01)
H10K 59/127 (2023.01)

(56) References Cited

U.S. PATENT DOCUMENTS

| | | | | |
|---|---|---|---|---|
| 10,586,495 | B2 * | 3/2020 | Kobayashi | G09G 3/2003 |
| 11,132,939 | B2 | 9/2021 | Yen et al. | |
| 11,132,940 | B2 | 9/2021 | Yen et al. | |
| 2003/0112204 | A1 | 6/2003 | Pettersen | |
| 2003/0166336 | A1 | 9/2003 | Kato et al. | |
| 2012/0223978 | A1 | 9/2012 | Yamamoto et al. | |
| 2015/0228666 | A1 | 8/2015 | Paolini, Jr. | |
| 2017/0025098 | A1 | 1/2017 | Keramidas et al. | |
| 2017/0092177 | A1 | 3/2017 | Kobayashi et al. | |
| 2018/0012549 | A1 | 1/2018 | Lee et al. | |
| 2018/0033696 | A1 * | 2/2018 | Nakagawa | G09G 3/3426 |
| 2020/0312232 | A1 | 10/2020 | Yen et al. | |
| 2020/0312233 | A1 | 10/2020 | Yen et al. | |
| 2021/0090513 | A1 * | 3/2021 | Takahashi | G09G 3/3659 |
| 2021/0174734 | A1 * | 6/2021 | Takahashi | G09G 3/2014 |
| 2021/0295780 | A1 | 9/2021 | Ikeda et al. | |
| 2022/0336570 | A1 * | 10/2022 | Nakagawa | G09G 3/3233 |
| 2024/0090284 | A1 | 3/2024 | Kozuma et al. | |

FOREIGN PATENT DOCUMENTS

| | | |
|---|---|---|
| EP | 3745387 A | 12/2020 |
| JP | 2012-138712 A | 7/2012 |
| JP | 2018-146730 A | 9/2018 |
| JP | 2020-166265 A | 10/2020 |
| JP | 2020-177228 A | 10/2020 |
| KR | 2020-0116063 A | 10/2020 |
| KR | 2020-0116064 A | 10/2020 |
| TW | I692747 | 5/2020 |
| TW | I697883 | 7/2020 |
| TW | 202036511 | 10/2020 |
| TW | 202036512 | 10/2020 |
| WO | WO-2003/042750 | 5/2003 |
| WO | WO-2019/220278 | 11/2019 |

OTHER PUBLICATIONS

Written Opinion (Application No. PCT/IB2022/052461) Dated Jun. 21, 2022.

* cited by examiner

10

PXAL

LINL

SICL

LIA  ALP  DRV  BS1 BS2  LIA

10

PXAL

LINL

SICL

LIA  ALP  DRV  BS1  LIA

FIG. 4A <u>SICL</u>
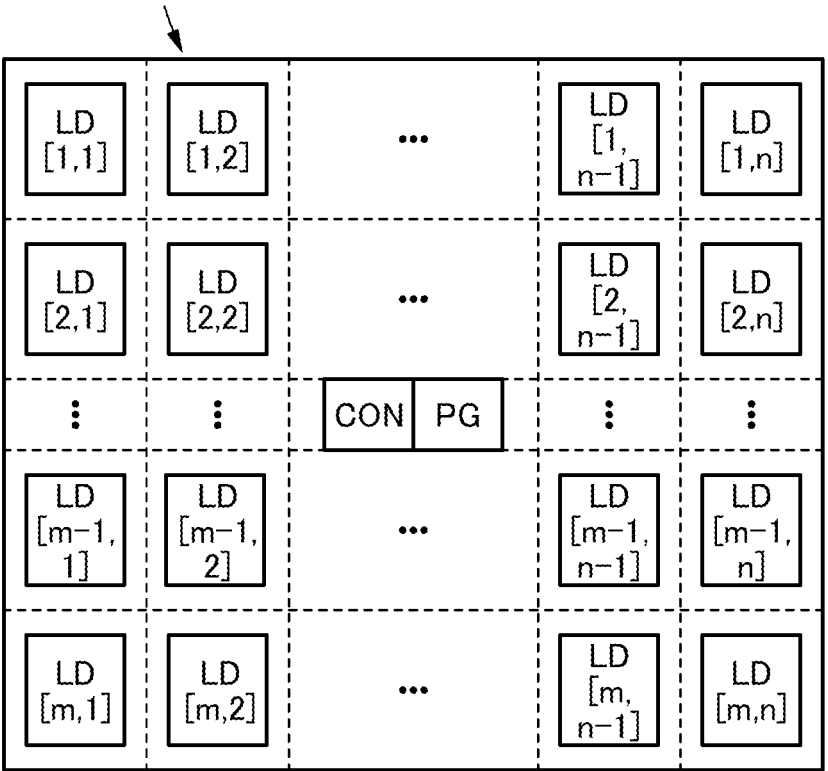
FIG. 4B
<u>PXAL</u>
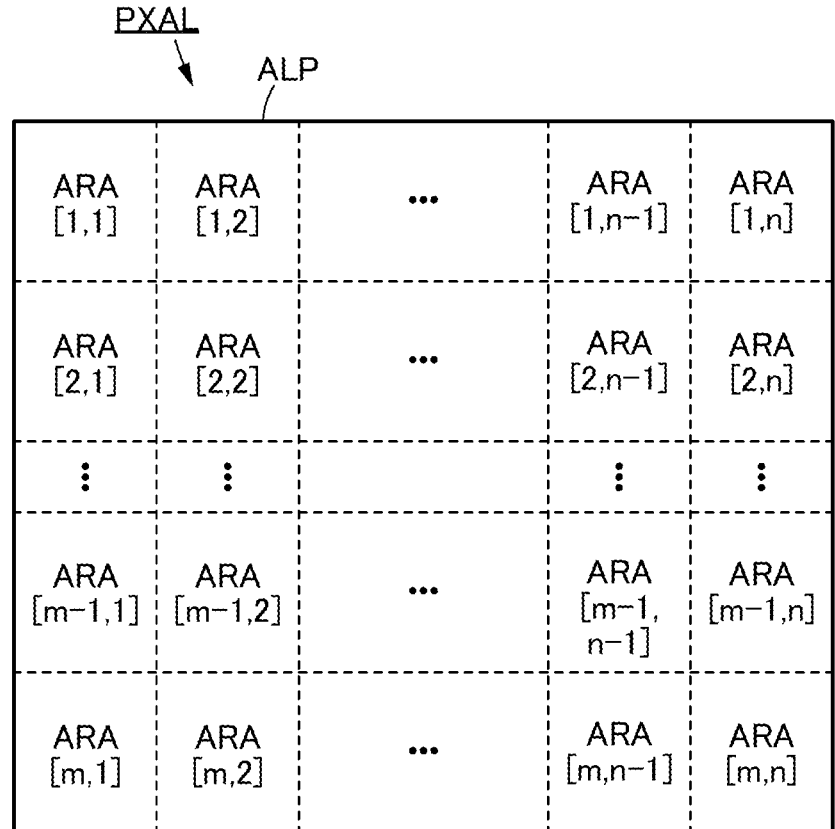

FIG. 13

```
        START
          │
          ▼
        ┌──────┐
        │ ST1  │
        └──────┘
          │
          ▼
        ┌──────┐
        │ ST2  │
        └──────┘
          │
          ▼
        ┌──────┐
        │ ST3  │
        └──────┘
          │
          ▼
        ┌──────┐
        │ ST4  │
        └──────┘
          │
          ▼
        ╱────────╲   YES
       ╱   ST5    ╲─────────┐
       ╲          ╱         │
        ╲────────╱          │
          │ NO              │
          ▼                 │
        ┌──────┐            │
        │ ST6  │            │
        └──────┘            │
          │◄────────────────┘
          ▼
        ┌──────┐
        │ ST7  │
        └──────┘
          │
          ▼
        ┌──────┐
        │ ST8  │
        └──────┘
          │
          ▼
        ┌──────┐
        │ ST9  │
        └──────┘
          │
          ▼
        ┌──────┐
        │ ST10 │
        └──────┘
          │
          ▼
         END
```

PXAL

LINL

SICL

100

121a  141a 150a                  121b  141b 150b

102

161

113
122

111

581

500

512

364
362
360
354
352
350
326
324

322
328
320

310

366

356

330

PXAL

LINL

SICL 300              312  314a 315      317
                      313   316      314b

100

102   161   121a   141a 150a 164        111      113 122     121CM

PXAL

100

102   161   121a   141a 150a 164   165      111     113 122     121CM

PXAL

FIG. 30A
FIG. 30B
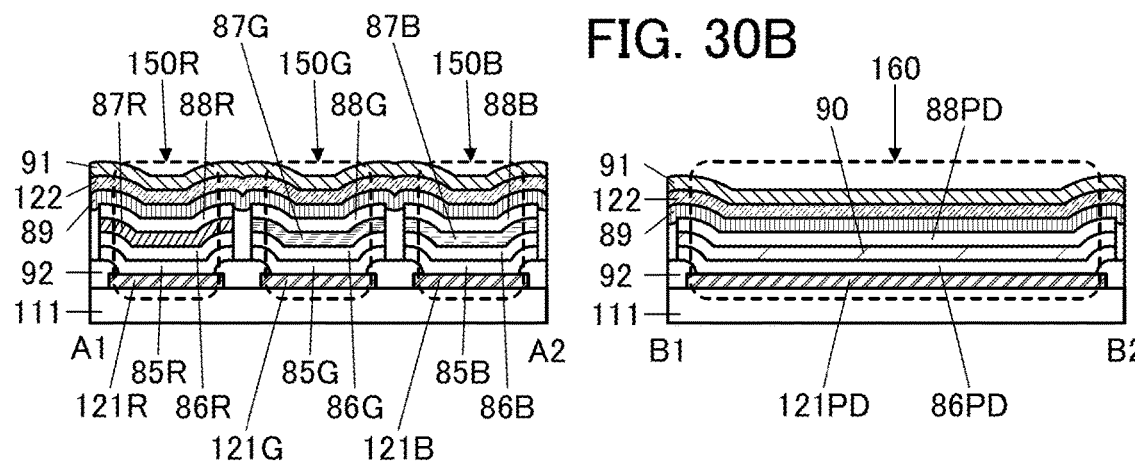
FIG. 30C
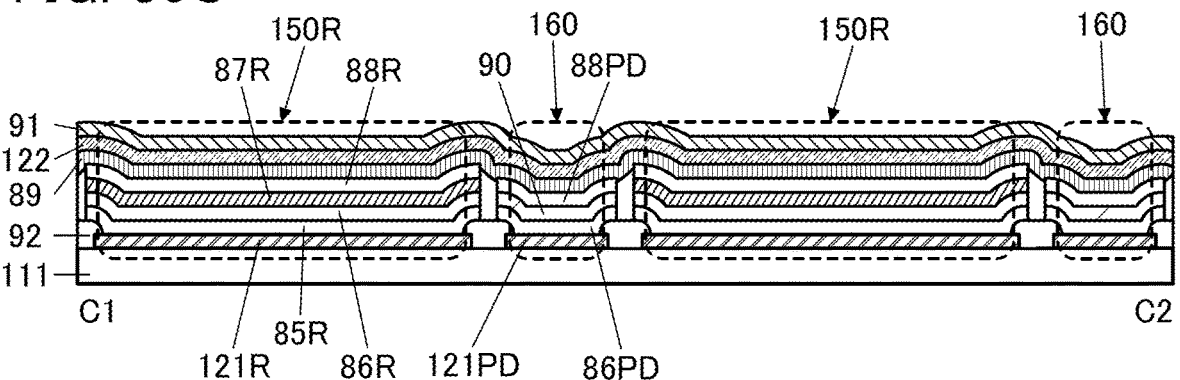
FIG. 30D
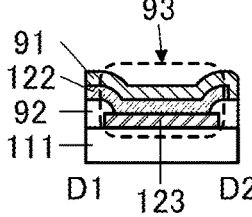

8300

8302    8303    8304
8301

8300

8302
8301    8304
8303

8300

8302
8305
8306
8307
8301    8304
8303

8300

8302
8301    8304
8303

8301
8308    8302    8310

8301
8308    8302    8311

6001

6005

6006

6000

6009

6010

6011

6002

6000

6018    6001

6017a 6015    6006    6010    6011    6009    6016    6002

6017b

6500

6501

6505

6507

6508

6502

6503

6504

6506

6502

6510  6513  6512  6511

6515  6516  6517  6518  6501

DISPLAY APPARATUS, ELECTRONIC DEVICE, AND METHOD OF MANUFACTURING SEMICONDUCTOR DEVICE

This application is a 371 of international application PCT/IB2022/052461 filed on Mar. 18, 2022, which is incorporated herein by reference.

TECHNICAL FIELD

One embodiment of the present invention relates to a display apparatus, an electronic device, and a method of manufacturing a semiconductor device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

BACKGROUND ART

Display apparatuses applicable to XR (Cross Reality or Extended Reality) such as VR (Virtual Reality) or AR (Augmented Reality) have been required. Specifically, such display apparatuses have been desired to have high resolution, high color reproducibility, and the like so as to offer enhanced realistic feeling and an enhanced sense of immersion, for example.

Examples of devices applicable to such display apparatuses include a liquid crystal display apparatus and a light-emitting apparatus including a light-emitting device such as organic EL (Electro Luminescence) or a light-emitting diode (LED). Patent Document 1 discloses a display device with a large number of pixels and high resolution, which includes a light-emitting device containing organic EL.

REFERENCE

Patent Document

[Patent Document 1] PCT International Publication No. 2019/220278

SUMMARY OF THE INVENTION

Problems to be Solved by the Invention

As described above, a display apparatus having high display quality is required for XR equipment. Since a display apparatus for XR needs to be provided in a glasses-type housing, a goggle-type housing, or the like, the size of the display apparatus is preferably reduced, for example. Specifically, for example, in the case of VR equipment, the size (the length of a diagonal line) of the display apparatus is preferably greater than or equal to 1 inch and less than or equal to 2 inches. For another example, in the case of AR equipment, it is preferable that the size of the display apparatus be less than or equal to 3 inches, further preferably less than or equal to 2 inches, still further preferably less than or equal to 1.5 inches.

The display apparatus provided in the XR equipment needs to have high definition so as to offer an enhanced sense of reality and an enhanced sense of immersion. In that case, designing a smaller pitch width between pixels, wirings, or the like or a smaller pixel size in a predetermined size, for example, can increase the number of pixels provided in the size. Note that when the number of pixels in the display apparatus is large, the amount of data per frame is increased; therefore, the speed of a driver circuit (e.g., a source driver circuit or a gate driver circuit) that drives the display apparatus is required to be increased.

In the case where the resolution of the display apparatus is increased, the number of pixels included in the display apparatus is increased, which increases the scale of a driver circuit for driving the display apparatus. Thus, in a display apparatus included in a device for XR, the circuit area of the driver circuit is preferably small. For decreasing the circuit area of the driver circuit, a means of reducing the size of a circuit element such as a transistor is given, for example. However, in the case where the size of the circuit element is reduced, variations in characteristics of the circuit elements might occur; as a result, there is a possibility that the driver circuit does not operate as appropriate (a malfunction might occur in the driver circuit).

An object of one embodiment of the present invention is to provide a display apparatus with a driver circuit having redundancy. Another object of one embodiment of the present invention is to provide a display apparatus with a high yield. Another object of one embodiment of the present invention is to provide a display apparatus having high display quality. Another object of one embodiment of the present invention is to provide a novel display apparatus. Another object of one embodiment of the present invention is to provide an electronic device including any of the above display apparatuses. Another object of one embodiment of the present invention is to provide a method of manufacturing a semiconductor device with a driver circuit having redundancy. Another object of one embodiment of the present invention is to provide a method of manufacturing a novel semiconductor device.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1) One embodiment of the present invention is a display apparatus including a first layer and a second layer positioned above the first layer. The first layer includes a first driver circuit and a second driver circuit, and the second layer includes a first pixel region and a second pixel region. The first pixel region includes a first pixel circuit, and the second pixel region includes a second pixel circuit. The first pixel region includes a region overlapping with a first circuit, and the second pixel region includes a region overlapping with a second circuit. The first pixel circuit is electrically connected to the first driver circuit through a first wiring, the second pixel circuit is electrically connected to the second driver circuit through a second wiring, and the first wiring is electrically connected to the second wiring through a switch. The first driver circuit has a function of transmitting image data to the first pixel circuit when the switch is off, and has a function of transmitting image data to the second pixel circuit when the switch is on. The second driver circuit has a function of transmitting image data to the second pixel circuit when the switch is off, and has a function of transmitting image data to the first pixel circuit when the switch is on.

(2) As another embodiment of the present invention, in the above description (1), the switch may be included in the first layer or the second layer.

(3) As another embodiment of the present invention, in the above description (1) or (2), the first layer may include a first substrate and the second layer may include a second substrate. Each of the first substrate and the second substrate is preferably a semiconductor substrate containing silicon as a material. A channel formation region of a transistor included in each of the first driver circuit and the second driver circuit preferably contains silicon included in the first substrate, and a channel formation region of a transistor included in each of the first pixel region and the second pixel region preferably contains silicon included in the second substrate.

(4) As another embodiment of the present invention, in the above description (1) or (2), the first layer may include a first substrate. The first substrate is preferably a semiconductor substrate containing silicon as a material. A transistor included in each of the first driver circuit and the second driver circuit is preferably a transistor formed over the first substrate, and a transistor included in each of the first pixel region and the second pixel region is preferably a transistor containing metal oxide in a channel formation region.

(5) Another embodiment of the present invention is an electronic device including the display apparatus described in any one of the above descriptions (1) to (4) and a housing.

(6) Another embodiment of the present invention is a method of manufacturing a semiconductor device including a second substrate. In the semiconductor device, the second substrate is a semiconductor substrate containing silicon as a material. The method of manufacturing a semiconductor device includes a first step to a seventh step. The first step includes a step of forming a separation layer over the second substrate. The second step includes a step of forming a well in a region other than a region of the second substrate where the separation layer is formed. The third step includes a step of forming a first insulator over a part of a region of the second substrate where the well is formed. The fourth step includes a step of forming a first low-resistance region and a second low-resistance region in a region other than the regions of the second substrate where the separation layer and the first insulator are formed. The fifth step includes a step of transferring the process to the sixth step in the case where a malfunction occurs in one of a first driver circuit and a second driver circuit included in a first substrate, and transferring the process to the seventh step in the case where a malfunction occurs in neither the first driver circuit nor the second driver circuit included in the first substrate. The sixth step includes a step of removing the first insulator and a step of forming a third low-resistance region in a region of the second substrate where the first insulator is formed. The seventh step includes a step of forming a second insulator over the second substrate and a step of providing an opening in a region of the second insulator overlapping with the separation layer, the first low-resistance region, and the second low-resistance region and forming a conductor in the opening.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display apparatus, a light-emitting apparatus, a lighting device, an electronic device, and the like themselves are semiconductor devices or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, or a NOR circuit); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

This specification describes a circuit configuration in which a plurality of elements are electrically connected to a wiring (a wiring for supplying a constant potential or a wiring for transmitting a signal). For example, in the case in which X is directly electrically connected to a wiring and Y is directly electrically connected to the wiring, this specification may describe that X and Y are directly electrically connected to each other.

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element having a resistance value higher than $0\Omega$ or a wiring having a resistance value higher than $0\Omega$. Therefore, in this specification and the like, a "resistor" sometimes includes a wiring having a resistance value, a transistor in which current flows between its source and drain, a diode, and a coil. Thus, the term "resistor" can be sometimes replaced with the terms "resistance", "load", "region having a resistance value", and the like; conversely, the terms "resistance", "load", and "region having a resistance value" can be sometimes replaced with the term "resistor" and the like. The resistance value can be, for example, preferably higher than or equal to 1 m$\Omega$ and lower than or equal to 10$\Omega$, further preferably higher than or equal to 5 m$\Omega$ and lower than or equal to 5$\Omega$, still further preferably higher than or equal to 10 m$\Omega$ and lower than or equal to 1$\Omega$. As another example, the resistance value may be higher than or equal to 1$\Omega$ and lower than or equal to $1\times10^9\Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The terms "capacitor", "parasitic capacitance", "gate capacitance", and the like can be replaced with the term "capacitance" and the like in some cases. Conversely, the term "capacitance" can be replaced with the terms "capacitor", "parasitic capacitance", "gate capacitance", and the like in some cases. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 µF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be sometimes replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. As another example, the case where a single capacitor is illustrated in a circuit diagram may indicate a case where two or more capacitors are electrically connected to each other in parallel. As another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, components arranged in a matrix and their positional relation are sometimes described using terms such as "row" and "column". The positional relation between components is changed as appropriate in accordance with the direction in which the components are described. Thus, the positional relation is not limited to the terms described in the specification and the like, and can be described with another term as appropriate depending on the situation. For example, the term "row direction" can be replaced with the term "column direction" when the direction of the diagram is rotated by 90°.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. As another example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" can also mean, for example, the case where a plurality of "electrodes" or "wirings" are formed in an integrated manner. For example, a "terminal" is used as part of a "wiring", an "electrode", or the like in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited, a state where current can be made to flow between the source electrode and the drain electrode, or the like. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device with a single structure includes one light-emitting unit between a pair of electrodes, and the light-emitting unit preferably includes one or more light-emitting layers. When white light emission is obtained using two light-emitting layers, the two light-emitting layers are selected such that emission colors of the light-emitting layers are complementary colors. For example, when emission colors of a first light-emitting layer and a second light-emitting layer are complementary colors, the light-emitting device can be configured to emit white light as a whole. When white light emission is obtained using three or more light-emitting layers, the light-emitting device is configured to emit white light as a whole by combining emission colors of the three or more light-emitting layers.

A device with a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the case of a single structure. In the device with a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. The light-emitting device having an SBS structure is suitable for the case where the power consumption is required to be low. Meanwhile, the white-light-emitting device is suitable in terms of lower manufacturing cost or higher manufacturing yield because the manufacturing process of the white-light-emitting device is simpler than that of the light-emitting device having an SBS structure.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

One embodiment of the present invention can provide a display apparatus with a driver circuit having redundancy. Another embodiment of the present invention can provide a display apparatus with a high yield. Another embodiment of the present invention can provide a display apparatus having high display quality. Another embodiment of the present invention can provide a novel display apparatus. Another embodiment of the present invention can provide an electronic device including any of the above display apparatuses. Another embodiment of the present invention can provide a method of manufacturing a semiconductor device with a driver circuit having redundancy. Another embodiment of the present invention can provide a method of manufacturing a novel semiconductor device.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 4A and FIG. 4B are schematic plan views illustrating structure examples of a display apparatus.

FIG. 13 is a flow chart showing an example of a method of manufacturing a display apparatus.

FIG. 14 is a flow chart showing an example of a method of manufacturing a display apparatus.

FIG. 27A to FIG. 27D are circuit diagrams each showing a configuration example of a pixel circuit included in a display apparatus.

FIG. 30A to FIG. 30D are schematic cross-sectional views illustrating a structure example of a light-emitting device, a light-receiving device, and a connection electrode included in a display apparatus.

MODE FOR CARRYING OUT THE INVENTION

Figures 1A, 1B:
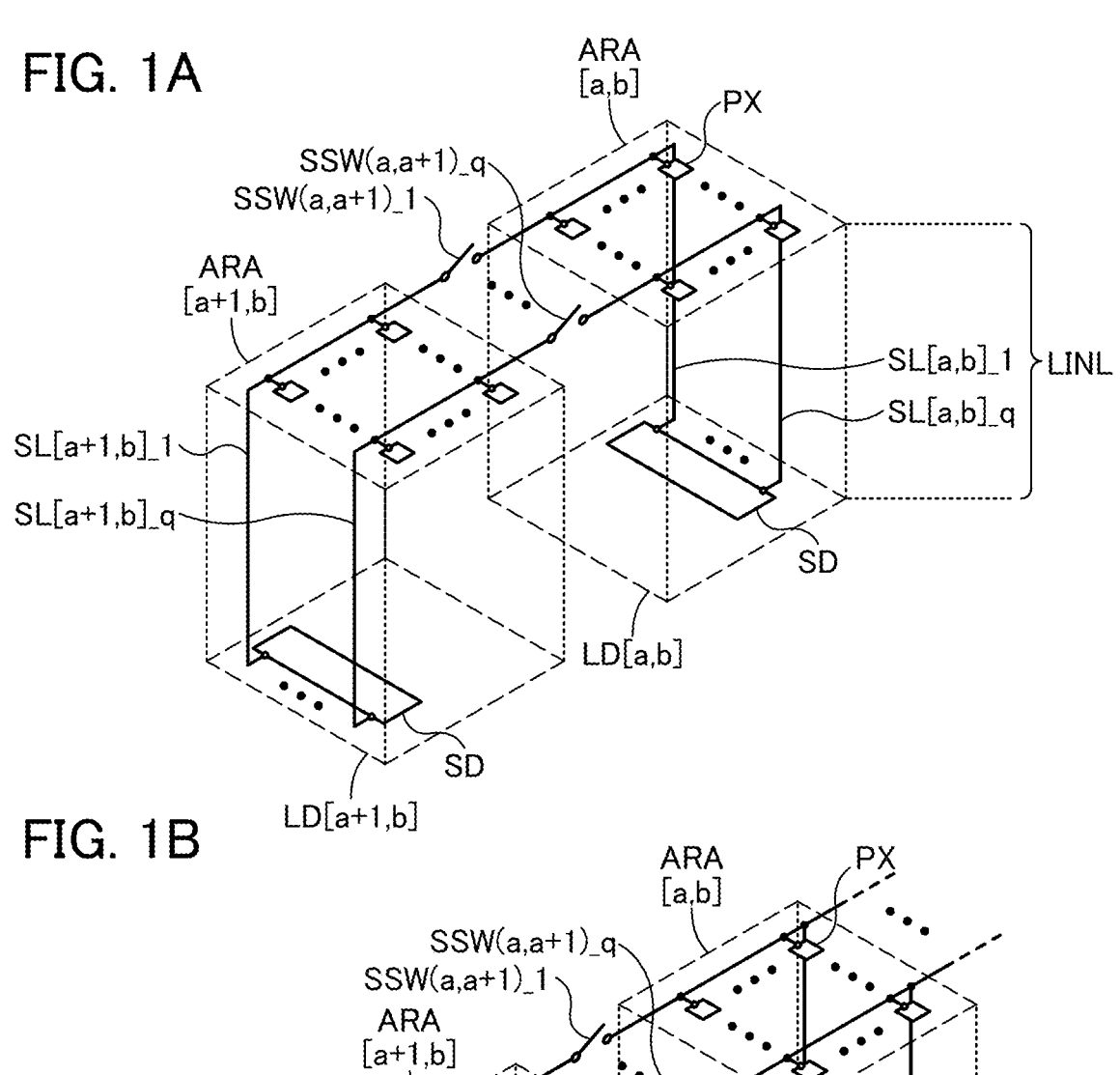
FIG. 1A and FIG. 1B are schematic perspective views illustrating structure examples of a display apparatus.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification, a plan view is sometimes used to explain a structure in each embodiment. A plan view is a diagram showing the appearance of a plane (section) of a structure cut in the horizontal direction, for example. Hidden lines (e.g., dashed lines) in a plan view can indicate the positional relation between a plurality of components included in a structure or the overlapping relation between the plurality of components. In this specification and the like, the term "plan view" can be replaced with the term "schematic plan view", "projection view", "top view", or "bottom view". A plane (section) of a structure cut in a direction other than the horizontal direction may be referred to as a plan view depending on circumstances.

In this specification, a cross-sectional view is sometimes used to explain a structure in each embodiment. A cross-sectional view is a diagram illustrating the appearance of a plane (section) of a structure cut in the vertical direction, for example. Note that in this specification and the like, the term "cross-sectional view" can be replaced with the term "front view" or "side view". A plane (section) of a structure cut in a direction other than the vertical direction is sometimes referred to as a cross-sectional view depending on the situation.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a display apparatus of one embodiment of the present invention will be described.

Structure Example

Figure 2A:
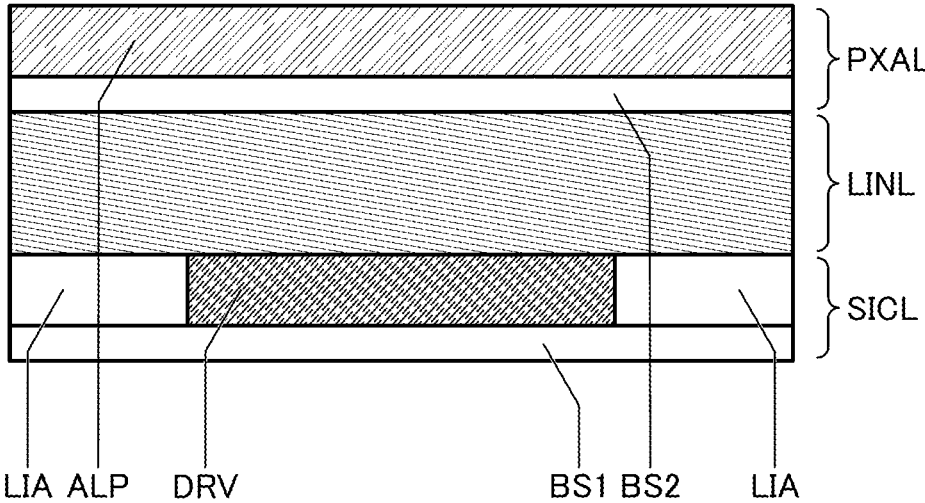
FIG. 2A and FIG. 2B are schematic cross-sectional views illustrating structure examples of a display apparatus.

FIG. 2A is a schematic cross-sectional view of the display apparatus of one embodiment of the present invention. A display apparatus 10 includes a pixel layer PXAL, a wiring layer LINL, and a circuit layer SICL.

The wiring layer LINL is provided over the circuit layer SICL, and the pixel layer PXAL is provided over the wiring layer LINL. Note that the pixel layer PXAL overlaps with a region including a driver circuit region DRV and a region LIA which are described later.

The circuit layer SICL includes a substrate BS1, the driver circuit region DRV, and the region LIA, as an example.

As the substrate BS1, a single crystal substrate (e.g., a semiconductor substrate containing silicon or germanium as a material) can be used, for example. Besides the single crystal substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper containing a fibrous material, or a base material film can be used as the substrate BS1. Note that examples of the glass substrate include barium borosilicate glass, aluminoborosilicate glass, and soda lime glass. As examples of the flexible substrate, the attachment film, and the base material film, the following is given. Examples include plastics typified by polyethylene terephthalate (PET), polyethylene naphthalate (PEN), polyether sulfone (PES), and polytetrafluoroethylene (PTFE). Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the manufacturing process of the display apparatus 10 includes heat treatment, a highly heat-resistant material is preferably selected for the substrate BS1.

Note that in the description of this embodiment, the substrate BS1 is a semiconductor substrate containing silicon as a material. Therefore, a transistor included in the driver circuit region DRV can be a transistor including silicon in a channel formation region (hereinafter referred to as a Si transistor).

The driver circuit region DRV and the region LIA are provided over the substrate BS1.

The driver circuit region DRV includes, for example, a driver circuit for driving a pixel included in the pixel layer PXAL to be described later. Note that a specific structure example of the driver circuit region DRV will be described later.

A wiring is provided in the region LIA, as an example. The wiring included in the region LIA may be electrically connected to a wiring included in the wiring layer LINL. At this time, the display apparatus 10 may have a structure in which a circuit included in the driver circuit region DRV and a circuit included in the pixel layer PXAL are electrically connected to each other through the wiring included in the region LIA and the wiring included in the wiring layer LINL. The display apparatus 10 may have a structure in which the circuit included in the driver circuit region DRV is electrically connected to the wiring or a circuit included in the region LIA through the wiring included in the wiring layer LINL.

The region LIA may include a GPU (Graphics Processing Unit), as an example. In the case where the display apparatus 10 includes a touch panel, the region LIA may include a sensor controller that controls a touch sensor included in the touch panel. In the case where a light-emitting device containing an EL material is used as a display element of the display apparatus 10, an EL correction circuit may be included in the region LIA. The EL correction circuit has a function of appropriately adjusting the amount of current input to the light-emitting device containing an EL material. Since the emission luminance of the light-emitting device containing an EL material is proportional to the current, when the characteristics of a driving transistor electrically connected to the light-emitting device are not favorable, the luminance of light emitted from the light-emitting device might be lower than a desired luminance. For example, the EL correction circuit monitors the amount of current flowing through the light-emitting device and increases the amount of current when the amount of current is smaller than a desired amount, whereby the luminance of light emitted from the light-emitting device can be increased. By contrast, when the amount of current is larger than a desired amount, the amount of current flowing through the light-emitting device may be adjusted to be small. In the case where a liquid crystal element is used as the display element of the display apparatus 10, a gamma correction circuit may be included in the region LIA.

For example, a wiring is provided in the wiring layer LINL. The wiring included in the wiring layer LINL functions as, for example, a wiring that electrically connects a driver circuit included in the driver circuit region DRV provided below the wiring layer LINL and a circuit included in the pixel layer PXAL provided above the wiring layer LINL.

The pixel layer PXAL includes a substrate BS2 and a pixel array ALP, as an example. The pixel array ALP includes a plurality of pixels, and the plurality of pixels are provided over the substrate BS2. The plurality of pixels may be arranged in a matrix in the pixel array ALP.

As the substrate BS2, a substrate applicable to the substrate BS1 can be used, as an example. Note that in the description of this embodiment, the substrate BS2 is a semiconductor substrate containing silicon or the like as a material. Therefore, transistors included in the plurality of pixels in the pixel array ALP can be Si transistors.

Since the pixel layer PXAL is provided above the wiring layer LINL, the substrate BS2 is provided to be positioned over the wiring layer LINL. Note that the substrate BS2 and the wiring layer LINL can be bonded to each other by a bonding step described later, for example.

Each of the plurality of pixels included in the pixel array ALP can express one color or a plurality of colors. In particular, the plurality of colors can be, for example, three colors of red (R), green (G), and blue (B). Alternatively, the plurality of colors may be at least one color selected from, for example, red (R), green (G), blue (B), cyan, magenta, yellow, and white. Note that in the case where each of pixels expressing different colors is called a subpixel and white is expressed by a plurality of subpixels expressing different colors, the plurality of subpixels are collectively called a pixel in some cases. In this specification and the like, a subpixel is referred to as a pixel for convenience.

Figure 2B:
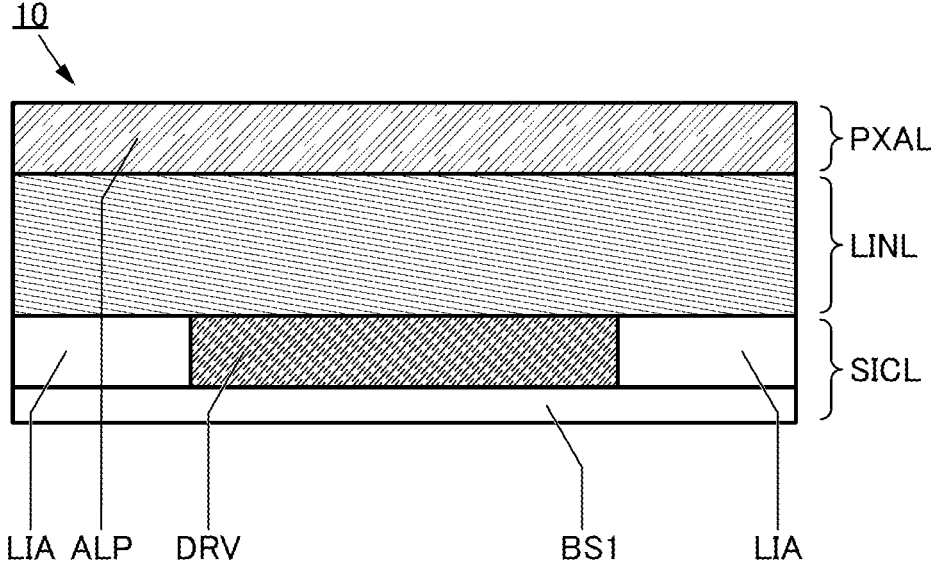

Note that the display apparatus of one embodiment of the present invention is not limited to the structure example illustrated in FIG. 2A. The structure of the display apparatus of one embodiment of the present invention may be changed as appropriate as long as an object of one embodiment of the present invention is achieved. For example, in the structure of the display apparatus 10 illustrated in FIG. 2A, the substrate BS2 is not necessarily provided. FIG. 2B illustrates a structure in which the substrate BS2 is not provided in the display apparatus 10 in FIG. 2A. In the case of the display apparatus 10 illustrated in FIG. 2B, an OS transistor can be used as a transistor included in the pixel layer PXAL. Metal oxide contained in a channel formation region of the OS transistor can be formed by a sputtering method, for example; accordingly, in a method of manufacturing the display apparatus 10 in FIG. 2B, a step of bonding the substrate BS2 provided with a transistor to the above of the wiring layer LINL of the substrate BS1 as in the display apparatus 10 in FIG. 2A can be omitted.

Figure 3A:
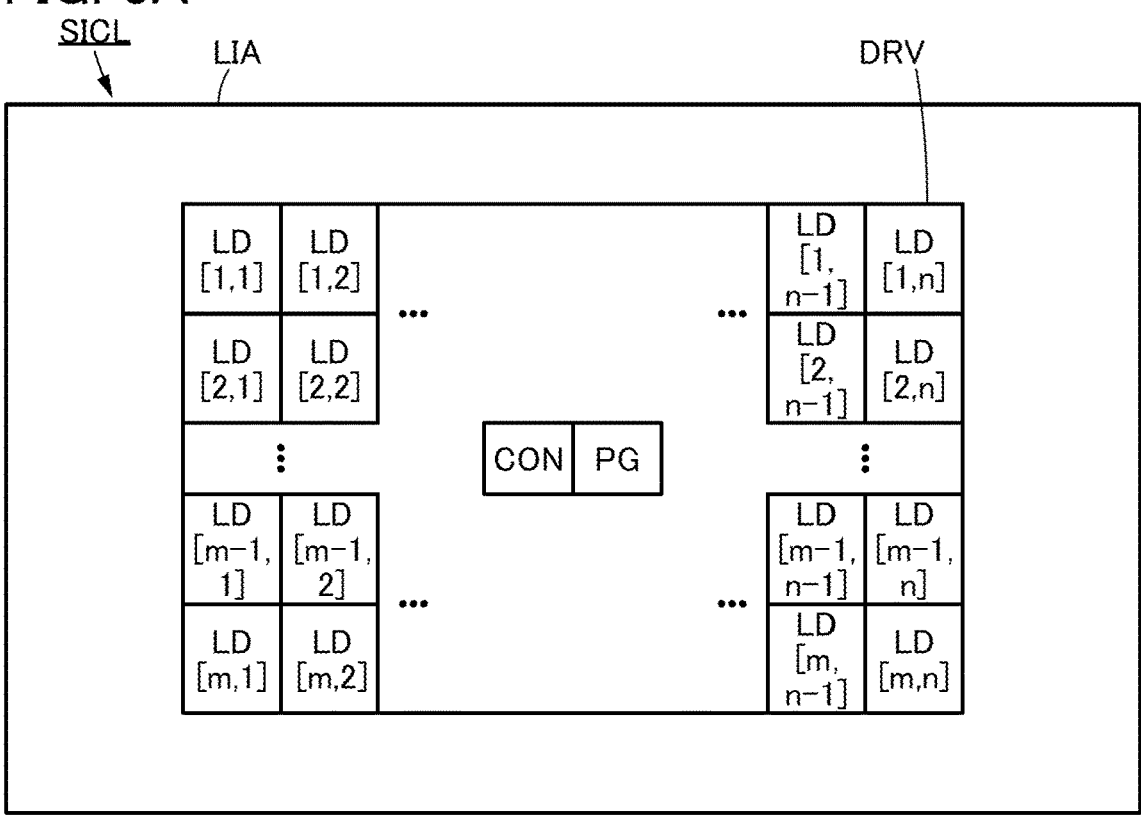
FIG. 3A and FIG. 3B are schematic plan views illustrating structure examples of a display apparatus.

FIG. 3A is an example of a plan view of the display apparatus 10, illustrating only the circuit layer SICL. The display apparatus 10 illustrated in FIG. 3A has a structure in which the driver circuit region DRV is surrounded by the region LIA, as an example.

In FIG. 3A, the driver circuit region DRV includes, for example, a plurality of local driver circuits LD, a controller CON, and a voltage generation circuit PG.

The controller CON has a function of processing an input signal from the outside of the display apparatus 10, for example. Examples of the input signal include an image signal and an address signal including the destination of the image signal. In accordance with the address signal, the controller CON selects the local driver circuit LD included in the driver circuit region DRV and transmits an image signal to the selected local driver circuit LD.

Since the plurality of local driver circuits LD are provided in the driver circuit region DRV, the controller CON may be configured to transmit image signals to a plurality of local driver circuits LD at the same time.

The voltage generation circuit PG functions as a circuit that generates a power supply voltage for driving circuits (e.g., a source driver circuit and a gate driver circuit described later) included in the driver circuit region DRV, for example. Furthermore, the voltage generation circuit PG may have a function of generating a voltage to be supplied to pixels included in the pixel layer PXAL described later.

Each of the plurality of local driver circuits LD has a function of driving pixels included in the pixel layer PXAL, as an example. That is, for example, each of the plurality of local driver circuits LD can include a source driver circuit and a gate driver circuit. Since the plurality of local driver circuits LD are provided in the driver circuit region DRV, a region of the pixel layer PXAL where pixels are to be driven can be determined for each of the local driver circuits.

For example, consider a case where a pixel array ALP included in the pixel layer PXAL is divided into regions of m rows and n columns (m is an integer of 1 or more and n is an integer of 1 or more) in the display apparatus 10. In this case, the number of local driver circuits included in the driver circuit region DRV is m×n. Note that as an example, FIG. 3A selectively illustrates a local driver circuit LD[1,1], a local driver circuit LD[1,2], a local driver circuit LD[2,1], a local driver circuit LD[2,2], a local driver circuit LD[m−1,1], a local driver circuit LD[m−1,2], a local driver circuit LD[m,1], a local driver circuit LD[m,2], a local driver circuit LD[1,n−1], a local driver circuit LD[1,n], a local driver circuit LD[2,n−1], local driver circuit LD[2,n], a local driver circuit LD[m−1,n−1], a local driver circuit LD[m−1, n], a local driver circuit LD[m,n−1], and a local driver circuit LD[m,n].

Figure 3B:
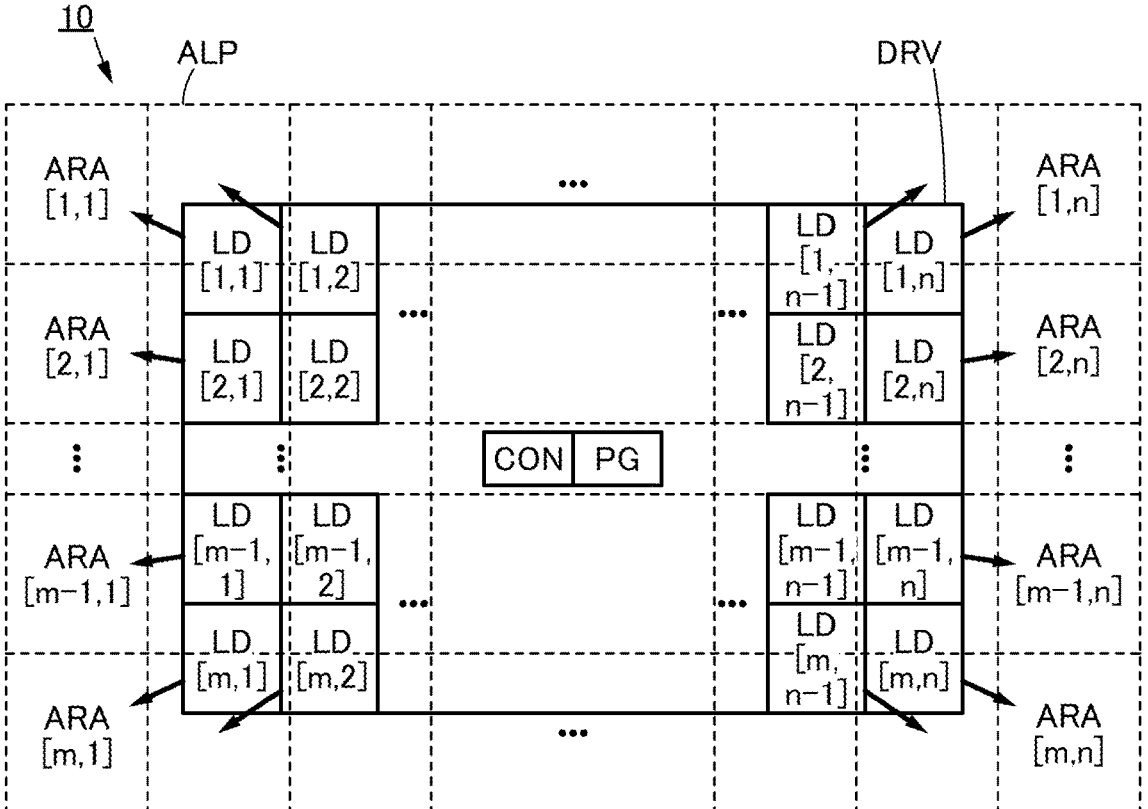

FIG. 3B illustrates pixel regions obtained by dividing the pixel array ALP included in the pixel layer PXAL into regions of m rows and n columns. FIG. 3B is a plan view of the display apparatus 10, and only illustrates the driver circuit region DRV and the pixel array ALP. In particular, in FIG. 3B, the driver circuit region DRV is denoted by a solid line and the pixel array ALP is denoted by a dashed line. As illustrated in FIG. 3B, the driver circuit region DRV overlaps with the pixel array ALP. In particular, in the plan view of FIG. 3B, an end portion of the driver circuit region DRV overlaps with the inside of the pixel array ALP. In addition, for example, the pixel array ALP is divided into a pixel region ARA[1,1] to a pixel region ARA[m,n] in FIG. 3B. Note that as an example, FIG. 3B selectively shows the reference numerals of the pixel region ARA[1,1], the pixel region ARA[2,1], the pixel region ARA[m−1,1], the pixel region ARA[m, 1], the pixel region ARA[1,n], the pixel region ARA[2,n], the pixel region ARA[m−1,n], and the pixel region ARA[m,n].

For example, in the case where the pixel array ALP is divided into 32 regions, m and n are 4 and 8, respectively, in FIG. 3A and FIG. 3B. In the case where the display apparatus 10 has a resolution of 8K4K, the number of pixels is 7680×4320. In the case where the colors of subpixels of the display apparatus 10 are three colors, red (R), green (G), and blue (B), the total number of subpixels is 7680×4320×3. Here, in the case where a pixel array of the display apparatus 10 with a resolution of 8K4K is divided into 32 regions, the number of pixels per region is 960×1080, and when the colors of the subpixels of the display apparatus 10 are three colors, red (R), green (G), and blue (B), the number of subpixels per region is 960×1080×3.

As illustrated in FIG. 3B, for example, the local driver circuit LD[1,1] drives pixels included in the pixel region ARA[1,1], and the local driver circuit LD[2,1] drives pixels included in the pixel region ARA[2,1]. The local driver circuit LD[m−1,1] drives pixels included in the pixel region ARA[m−1,1], and the local driver circuit LD[m,1] drives pixels included in the pixel region ARA[m,1]. The local driver circuit LD[1,n] drives pixels included in the pixel region ARA[1,n], and the local driver circuit LD[2,n] drives pixels included in the pixel region ARA[2,n]. The local driver circuit LD[m−1,n] drives pixels included in the pixel region ARA[m−1,n], and the local driver circuit LD[m,n] drives pixels included in the pixel region ARA[m,n]. That is, although not illustrated in FIG. 3B, a local driver circuit LD[i,j] positioned in the i-th row and j-th column (i is an integer greater than or equal to 1 and less than or equal to m and j is an integer greater than or equal to 1 and less than or equal to n) drives a pixel region ARA[i,j]. Note that, as an example, the relationship between the pixel region ARA and the local driver circuit LD that drives the pixels included in the pixel region ARA is indicated by a thick arrow in FIG. 3B.

Note that the display apparatus of one embodiment of the present invention is not limited to the structure illustrated in FIG. 3A and FIG. 3B. The structure of the display apparatus of one embodiment of the present invention may be changed as appropriate as long as an object of one embodiment of the present invention is achieved. For example, the local driver circuit LD may be provided in a region overlapping with the corresponding pixel region ARA. Specifically, the display apparatus 10 can have a structure illustrated in FIG. 4A and FIG. 4B, for example. FIG. 4A illustrates a structure example of the circuit layer SICL in the display apparatus 10, and FIG. 4B illustrates a structure example of the pixel layer PXAL in the display apparatus 10. As illustrated in FIG. 4A and FIG. 4B, the local driver circuit LD[i,j] corresponding to the pixel region ARA[i,j] is provided in a region overlapping with the pixel region ARA[i,j].

Note that the driver circuit region DRV in the circuit layer SICL in FIG. 4A can be a region where the local driver circuit LD[1,1] to the local driver circuit LD[m,n] are provided. The controller CON and the voltage generation circuit PG in the circuit layer SICL in FIG. 4A can be provided in a region where the local driver circuit LD[1,1] to the local driver circuit LD[m,n] are not provided.

The region LIA in the circuit layer SICL in FIG. 4A can be a region where the local driver circuit LD[1,1] to the local driver circuit LD[m,n], the controller CON, and the voltage generation circuit PG are not provided.

In the case where the resolution of the pixel array ALP included in the pixel layer PXAL is increased, the number of pixels included in the pixel array ALP is increased, which increases the area of the local driver circuit LD that drives the display apparatus 10 in some cases. By reducing the sizes of circuit elements, such as transistors, included in the local driver circuit LD, the area of the local driver circuit LD can be reduced. However, in the case where the sizes of the circuit elements are reduced, characteristics of the circuit elements might be likely to vary, and thus there is a possibility that a desired operation is not operated in the local driver circuit LD. Furthermore, even when the sizes of the circuit elements are not reduced, there is a possibility that a desired operation is not operated in the local driver circuit LD due to the process of manufacturing the display apparatus 10.

Therefore, the display apparatus 10 preferably has redundancy for the case where the local driver circuit LD does not operate normally.

FIG. 1A is a schematic perspective view illustrating a structure example of the pixel region ARA and the local driver circuit LD included in the display apparatus of one embodiment of the present invention. The structure example illustrated in FIG. 1A is a perspective view of a part of the plan view of each of FIG. 4A and FIG. 4B. The structure example of the pixel region ARA and the local driver circuit LD in FIG. 1A has a circuit configuration with redundancy for the case where the local driver circuit LD does not operate normally.

In the structure example in FIG. 1A, a local driver circuit LD[a,b] (here, a is an integer greater than or equal to 1 and less than or equal to m−1, and b is an integer greater than or equal to 1 and less than or equal to n), a pixel region ARA[a,b] overlapping with the local driver circuit LD[a,b], a local driver circuit LD[a+1,b], and a pixel region ARA[a+1,b] overlapping with the local driver circuit LD[a+1,b] are selectively illustrated.

A driver circuit SD is included in each of the local driver circuit LD[a,b] and the local driver circuit LD[a+1,b].

A plurality of pixel circuits PX are included in each of the pixel region ARA[a,b] and the pixel region ARA[a+1,b]. The plurality of pixel circuits PX in each of the pixel region ARA[a,b] and the pixel region ARA[a+1,b] are arranged in a matrix, for example. Note that in this embodiment, in each of the pixel region ARA[a,b] and the pixel region ARA[a+1,b], the plurality of pixel circuits PX are arranged in a matrix of p rows and q columns (p is an integer greater than or equal to 1 and q is an integer greater than or equal to 1).

The pixel layer PXAL includes a switch SSW(a,a+1)_1 to a switch SSW(a,a+1)_q. The switch SSW(a,a+1)_1 to the switch SSW(a,a+1)_q are preferably provided between the pixel region ARA[a,b] and the pixel region ARA[a+1,b].

The driver circuit SD included in the local driver circuit LD[a,b] is electrically connected to a wiring SL[a,b]_1 to a wiring SL[a,b]_q, as an example. The wiring SL[a,b]_1 to the wiring SL[a,b]_q are extended in the column direction of the pixel region ARA [a,b] through the wiring layer LINL, as an example. Similarly, the driver circuit SD included in the local driver circuit LD[a+1,b] is electrically connected to a wiring SL[a+1,b]_1 to a wiring SL[a+1,b]_q, as an example. The wiring SL[a+1,b]_1 to the wiring SL[a+1,b]_q are extended in the column direction of the pixel region ARA[a+1,b] through the wiring layer LINL, as an example.

In the pixel region ARA[a,b], each of the wiring SL[a,b]_1 to the wiring SL[a,b]_q is electrically connected to the plurality of pixel circuits PX provided for each column. Similarly, in the pixel region ARA[a+1,b], each of the wiring SL[a+1,b]_1 to the wiring SL[a+1,b]_q is electrically connected to the plurality of pixel circuits PX provided for each column.

In the pixel layer PXAL (the pixel region ARA[a,b] and the pixel region ARA[a+1,b]), the wiring SL[a,b]_1 to the wiring SL[a,b]_q are electrically connected to first terminals of a switch SSW(a,a+1)_1 to a switch SSW(a,a+1)_q, respectively. Specifically, for example, in FIG. 1A, the wiring SL[a,b]_1 is electrically connected to the first terminal of the switch SSW(a,a+1)_1, and the wiring SL[a,b]_q is electrically connected to the first terminal of the switch SSW(a,a+1)_q.

Similarly, in the pixel layer PXAL (the pixel region ARA[a,b] and the pixel region ARA[a+1,b]), the wiring SL[a+1,b]_1 to the wiring SL[a+1,b]_q are electrically connected to second terminals of the switch SSW(a,a+1)_1 to the switch SSW(a,a+1)_q, respectively. Specifically, for example, in FIG. 1A, the wiring SL[a+1,b]_1 is electrically connected to the second terminal of the switch SSW(a,a+1)_1, and the wiring SL[a+1,b]_q is electrically connected to the second terminal of the switch SSW(a,a+1)_q.

The driver circuit SD has a function of a source driver circuit that transmits image data to the pixel circuit PX included in the pixel array ALP, for example.

The pixel circuit PX includes a display device, for example. As the display device, a light-emitting device can be used, for example. A light-emitting device described in this embodiment refers to a self-luminous light-emitting device such as an organic EL element (also referred to as an OLED (Organic Light Emitting Diode)). The light-emitting device electrically connected to the pixel circuit can be a self-luminous light-emitting device such as an LED (Light Emitting Diode), a micro LED, a QLED (Quantum-dot Light Emitting Diode), or a semiconductor laser.

The pixel circuit PX has functions of receiving image data transmitted by the driver circuit SD through the wiring SL, and making the light-emitting device emit light with the emission intensity corresponding to the image data.

As the switch SSW(a,a+1)_1 to the switch SSW(a,a+1)_q, electrical switches such as an analog switch and a transistor can be used, for example. Note that in the case where transistors are used as the switch SSW(a,a+1)_1 to the switch SSW(a,a+1)_q, for example, the transistors can be transistors with the similar structures, such as Si transistors or OS transistors. Other than the electrical switch, a mechanical switch may be used.

In FIG. 1A, when the driver circuits SD in the local driver circuit LD[a,b] and the local driver circuit LD[a+1,b] operate as appropriate, the switch SSW(a,a+1)_1 to the switch SSW(a,a+1)_q are turned off. Specifically, for example, when the driver circuit SD in the local driver circuit LD[a,b] transmits image data to the plurality of pixel circuits PX included in the pixel region ARA[a,b] and the driver circuit SD in the local driver circuit LD[a+1,b] transmits image data to the plurality of pixel circuits PX included in the pixel region ARA[a+1,b], the switch SSW(a,a+1)_1 to the switch SSW(a,a+1)_q are turned off.

In FIG. 1A, when the driver circuit SD in one of the local driver circuit LD[a,b] and the local driver circuit LD[a+1,6] does not operate as appropriate (a malfunction occurs in one of the driver circuits SD), the switch SSW(a,a+1)_1 to the switch SSW(a,a+1)_q are turned on. Specifically, for example, in the case where a malfunction occurs in the driver circuit SD in the local driver circuit LD[a+1,b] and image data cannot be transmitted to the plurality of pixel circuits PX included in the pixel region ARA[a+1,b], the driver circuit SD in the local driver circuit LD[a,b] transmits image data to the plurality of pixel circuits PX included in each of the pixel region ARA[a,b] and the pixel region ARA[a+1,b]. For another example, in the case where a malfunction occurs in the driver circuit SD in the local driver circuit LD[a,b] and image data cannot be transmitted to the plurality of pixel circuits PX included in the pixel region ARA[a,b], the driver circuit SD in the local driver circuit LD[a+1,b] transmits image data to the plurality of pixel circuits PX included in each of the pixel region ARA[a,b] and the pixel region ARA[a+1,b].

That is, by applying the structure example illustrated in FIG. 1A to the display apparatus 10, in the case where a malfunction occurs in one of the driver circuits SD included in the adjacent local driver circuits LD, the wiring SL[a,b] and the wiring SL[a+1,b] which are extended in the same row are brought into conduction by a switch SSW(a,a+1), and thus the other of the driver circuits SD included in the adjacent local driver circuits LD can transmit image data to the pixel circuits PX included in each of the pixel region ARA[a,b] and the pixel region ARA[a+1,b]. Accordingly, by applying the structure example illustrated in FIG. 1A to the display apparatus 10, the driver circuit SD included in each of the local driver circuit LD[a,b] and the local driver circuit LD[a+1,b] can have redundancy.

Although FIG. 1A illustrates the structure example in which the driver circuit SD included in each of the local driver circuit LD[a,b] and the local driver circuit LD[a+1,b] has redundancy, for example, the driver circuit SD included in each of the local driver circuit LD[a,b] and a local driver circuit LD[a,b+1] may have redundancy.

One embodiment of the present invention is not limited to the display apparatus to which the structure example in FIG. 1A is applied. The structure of the display apparatus of one embodiment of the present invention may be changed as appropriate as long as an object of one embodiment of the present invention is achieved.

Although FIG. 1A illustrates, for example, a structure in which the switch SSW(a,a+1)_1 to the switch SSW(a,a+1)_q are provided between the pixel region ARA[a,b] and the pixel region ARA[a+1,b], the display apparatus of one embodiment of the present invention can have a structure in which three or more pixel regions ARA are consecutively aligned and switches similar to the switch SSW(a,a+1)_1 to the switch SSW(a,a+1)_q are provided between each two pixel regions ARA. For example, as illustrated in FIG. 1B, as to consecutively-aligned three pixel regions ARA[a,b] to ARA[a+2,b] (here, a is an integer greater than or equal to 1 and less than or equal to m−2), the switch SSW(a,a+1)_1 to the switch SSW(a,a+1)_q may be provided between the pixel region ARA[a,b] and the pixel region ARA[a+1,b] and a switch SSW(a+1,a+2)_1 to a switch SSW(a+1,a+2)_q may be provided between the pixel region ARA[a+1,b] and the pixel region ARA[a+2,b]. Note that in FIG. 1B, the driver circuit SD included in the local driver circuit LD[a+2,b] is electrically connected to the pixel circuits PX included in the pixel region ARA[a+2,b] through a wiring SL[a+2,b]_1 to a wiring SL[a+2,b]_q.

When the display apparatus of one embodiment of the present invention employs the structure example in FIG. 1B and a malfunction occurs in two among the local driver circuit LD[a,b] to the local driver circuit LD[a+2,6], the other of the local driver circuits LD can transmit image data to the pixel circuit PX included in each of the pixel region ARA[a,b] to the pixel region ARA[a+2,b].

In the display apparatus 10 in FIG. 4, the switches SSW may be provided between all of the adjacent pixel regions ARA as in the above description. In the case where the driver circuits SD included in all of the local driver circuits LD operate as appropriate in the display apparatus 10 in FIG. 4, all of switches SSW included in the display apparatus 10 are turned off; in the case where some of the driver circuits SD included in all of the local driver circuits LD do not operate as appropriate, image data can be transmitted to a pixel included in the pixel region ARA overlapping with the driver circuit SD that does not operate as appropriate by the driver circuit SD in the local driver circuit LD other than the local driver circuit LD including the driver circuit SD that does not operate as appropriate.

Figure 5A:
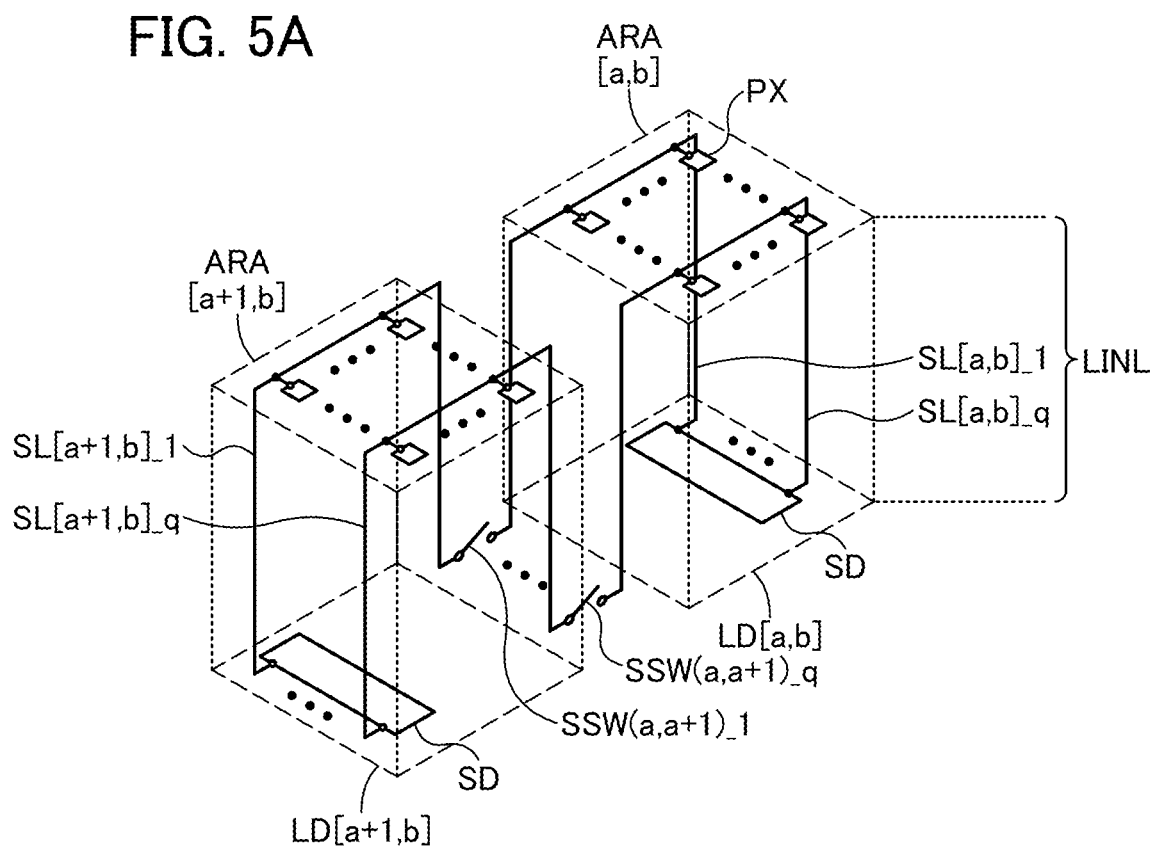
FIG. 5A and FIG. 5B are schematic perspective views illustrating structure examples of a display apparatus.

For example, although FIG. 1A illustrates the structure in which the switch SSW(a,a+1)_1 to the switch SSW(a,a+1)_q are provided between the pixel region ARA[a,b] and the pixel region ARA[a+1,b] in the pixel layer PXAL, in the display apparatus of one embodiment of the present invention, the switch SSW(a,a+1)_1 to the switch SSW(a,a+1)_q may be provided between the local driver circuit LD[a,b] and the local driver circuit LD[a+1,b] in the circuit layer SICL. FIG. 5A illustrates a specific example of such a structure. Since the switch SSW(a,a+1)_1 to the switch SSW(a,a+1)_q are provided in the circuit layer SICL, the area for providing the switch SSW(a,a+1)_1 to the switch SSW(a,a+1)_q is unnecessary in the pixel layer PXAL. Thus, for example, an additional pixel circuit can be disposed in the area of the pixel array ALP in the pixel layer PXAL where the switch SSW(a,a+1)_1 to the switch SSW (a,a+1)_q do not need to be provided. In particular, with the additional pixel circuit, the resolution of the display apparatus can be increased.

For example, FIG. 1A illustrates an example in which one of the driver circuits SD in the local driver circuit LD[a,b] and the local driver circuit LD[a+1,b] transmits image data to the pixel circuits PX included in the pixel region ARA [a,b] and the pixel region ARA[a+1,b]; in the display apparatus of one embodiment of the present invention, however, switches may be provided between the pixel region ARA [a,b] and a pixel region ARA[a,b+1] in order that driver circuits included in the local driver circuit LD[a,b] and the local driver circuit LD[a,b+1] may have redundancy. The driver circuit may be the driver circuit SD or a driver circuit GD that transmits a selection signal for selecting the pixel circuit PX that is the destination of image data. Specifically, for example, in the display apparatus of one embodiment of the present invention, a switch GSW(b,b+1)_1 to a switch GSW(b,b+1)_p may be provided between the pixel region ARA[a,b] and the pixel region ARA[a,b+1], as illustrated in FIG. 5B.

Figure 5B:
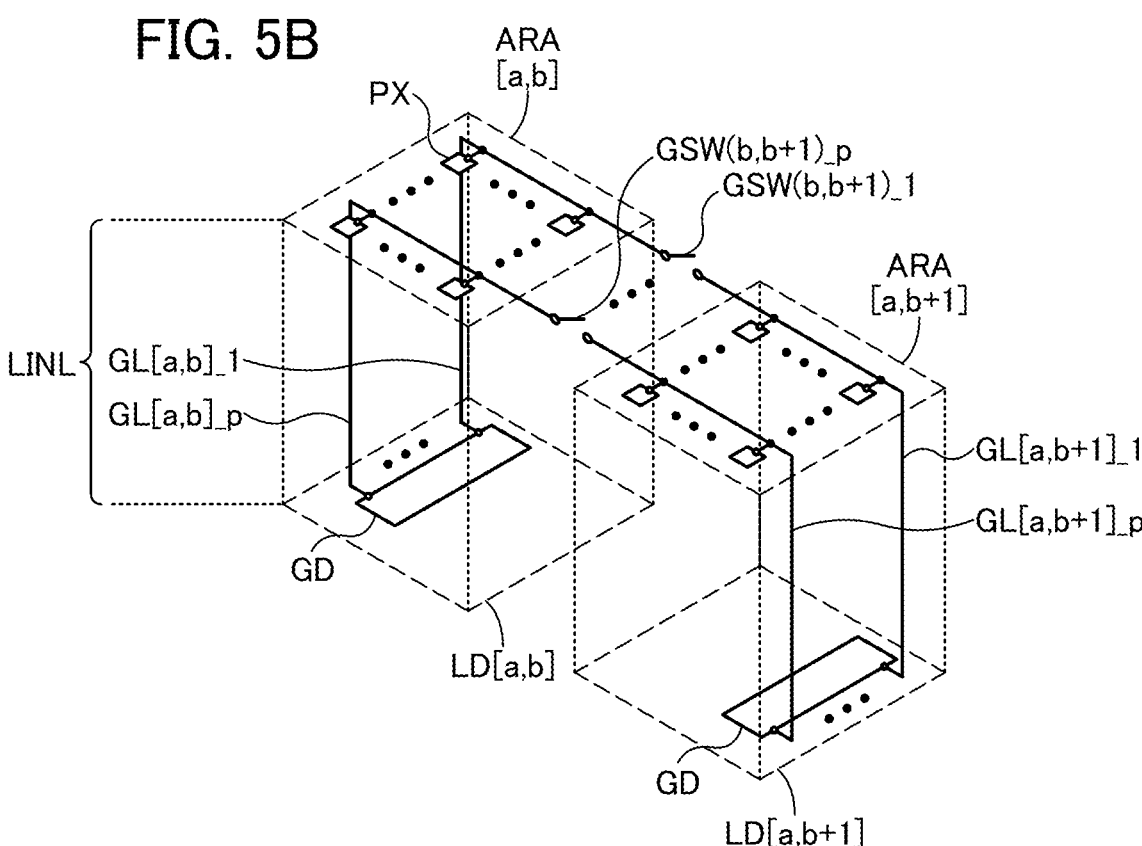

In FIG. 5B, each of the local driver circuit LD[a,b] and the local driver circuit LD[a,b+1] includes the driver circuit GD. The driver circuit GD included in the local driver circuit LD[a,b] is electrically connected to a wiring GL[a,b]_1 to a wiring GL[a,b]_p, as an example. The wiring GL[a,b]_1 to the wiring GL[a,b]_p are extended in the row direction of the pixel region ARA[a,b] through the wiring layer LINL, as an example. Similarly, the driver circuit GD included in the local driver circuit LD[a,b+1] is electrically connected to a wiring GL[a,b+1]_1 to a wiring GL[a,b+1]_p, as an example. The wiring GL[a,b]_1 to the wiring GL[a,b+1]_p are extended in the row direction of the pixel region ARA [a,b+1] through the wiring layer LINL, as an example.

In the pixel region ARA[a, b], each of the wiring GL[a, b]_1 to the wiring GL[a,b]_p is electrically connected to the plurality of pixel circuits PX provided for each row. Similarly, in the pixel region ARA[a,b+1], each of the wiring GL[a,b+1]_1 to the wiring GL[a,b+1]_p is electrically connected to the plurality of pixel circuits PX provided for each row.

In the pixel layer PXAL (the pixel region ARA[a,b] and the pixel region ARA[a,b+1]), the wiring GL[a,b]_1 to the wiring GL[a,b]_p are electrically connected to first terminals of a switch GSW(b,b+1)_1 to a switch GSW(b,b+1)_p, respectively. Specifically, for example, in FIG. 5B, the wiring GL[a,b]_1 is electrically connected to the first terminal of the switch GSW(b,b+1)_1, and the wiring GL[a, b]_p is electrically connected to the first terminal of the switch GSW(b,b+1)_p.

Similarly, in the pixel layer PXAL (the pixel region ARA[a,b] and the pixel region ARA[a,b+1]), the wiring GL[a,b+1]_1 to the wiring GL[a,b+1]_p are electrically connected to second terminals of the switch GSW(b,b+1)_1 to the switch GSW(b,b+1)_p, respectively. Specifically, for example, in FIG. 5B, the wiring GL[a,b+1]_1 is electrically connected to the second terminal of the switch GSW(b,b+1)_1, and the wiring GL[a,b+1]_p is electrically connected to the second terminal of the switch GSW(b,b+1)_p.

The driver circuit GD has a function of a gate driver circuit that transmits a selection signal line for selecting the pixel circuit PX included in the destination to which image data is transmitted in the pixel array ALP, as an example.

For example, switches applicable to the switch SSW(a, a+1)_1 to the switch SSW(a,a+1)_q can be used as the switch GSW(b,b+1)_1 to the switch GSW(b,b+1)_p.

In FIG. 5B, when the driver circuits GD in the local driver circuit LD[a,b] and the local driver circuit LD[a,b+1] operate as appropriate, the switch GSW(b,b+1)_1 to the switch GSW(b,b+1)_p are turned off. Specifically, for example, in the case where the driver circuit GD in the local driver circuit LD[a,b] transmits a selection signal to the plurality of pixel circuits PX included in the pixel region ARA[a,b] and the driver circuit GD in the local driver circuit LD[a,b+1] transmits image data to the plurality of pixel circuits PX included in the pixel region ARA[a,b+1], the switch GSW (b,b+1)_1 to a switch SSW(b,b+1)_p are turned off.

In FIG. 5B, in the case where the driver circuit GD in one of the local driver circuit LD[a,b] and the local driver circuit LD[a,b+1] does not operate as appropriate (a malfunction occurs in one of the driver circuits GD), the switch GSW (b,b+1)_1 to the switch GSW(b,b+1)_p are turned on. Specifically, for example, in the case where a malfunction occurs in the driver circuit GD in the local driver circuit LD[a,b+1] and the selection signal cannot be transmitted to the plurality of pixel circuits PX included in the pixel region ARA[a,b+1], the driver circuit GD in the local driver circuit LD[a,b] transmits the selection signal to the plurality of pixel circuits PX included in each of the pixel region ARA[a,b] and the pixel region ARA[a,b+1]. For another example, in the case where a malfunction occurs in the driver circuit GD in the local driver circuit LD[a,b] and the selection signal cannot be transmitted to the plurality of pixel circuits PX included in the pixel region ARA[a,b], the driver circuit GD in the local driver circuit LD[a,b+1] transmits the selection signal to the plurality of pixel circuits PX included in each of the pixel region ARA[a,b] and the pixel region ARA[a,b+1].

That is, with the structure of the display apparatus 10 illustrated in FIG. 5B, in the case where a malfunction occurs in one of the driver circuits GD included in the adjacent local driver circuits LD, the wiring GL[a,b] and the wiring GL[a,b+1] which are extended in the same row are brought into conduction by a GSW(b,b+1), and thus the other of the driver circuits GD included in the adjacent local driver circuits LD can transmit the selection signal to the pixel circuits PX included in each of the pixel region ARA[a,b] and the pixel region ARA[a,b+1]. Accordingly, with the structure of the display apparatus 10 illustrated in FIG. 5B, the driver circuit GD included in each of the local driver circuit LD[a,b] and the local driver circuit LD[a,b+1] can have redundancy.

Although FIG. 5B illustrates the structure example in which the driver circuit GD included in each of the local driver circuit LD[a,b] and the local driver circuit LD[a,b+1] has redundancy, for example, the driver circuit GD included in each of the local driver circuit LD[a,b] and the local driver circuit LD[a+1,b] may have redundancy.

Operation Example 1

Next, an operation example of the above-described display apparatus 10 is described. Note that an operation example of a display apparatus 10A illustrated in FIG. 6 is described as an example.

Figure 6:
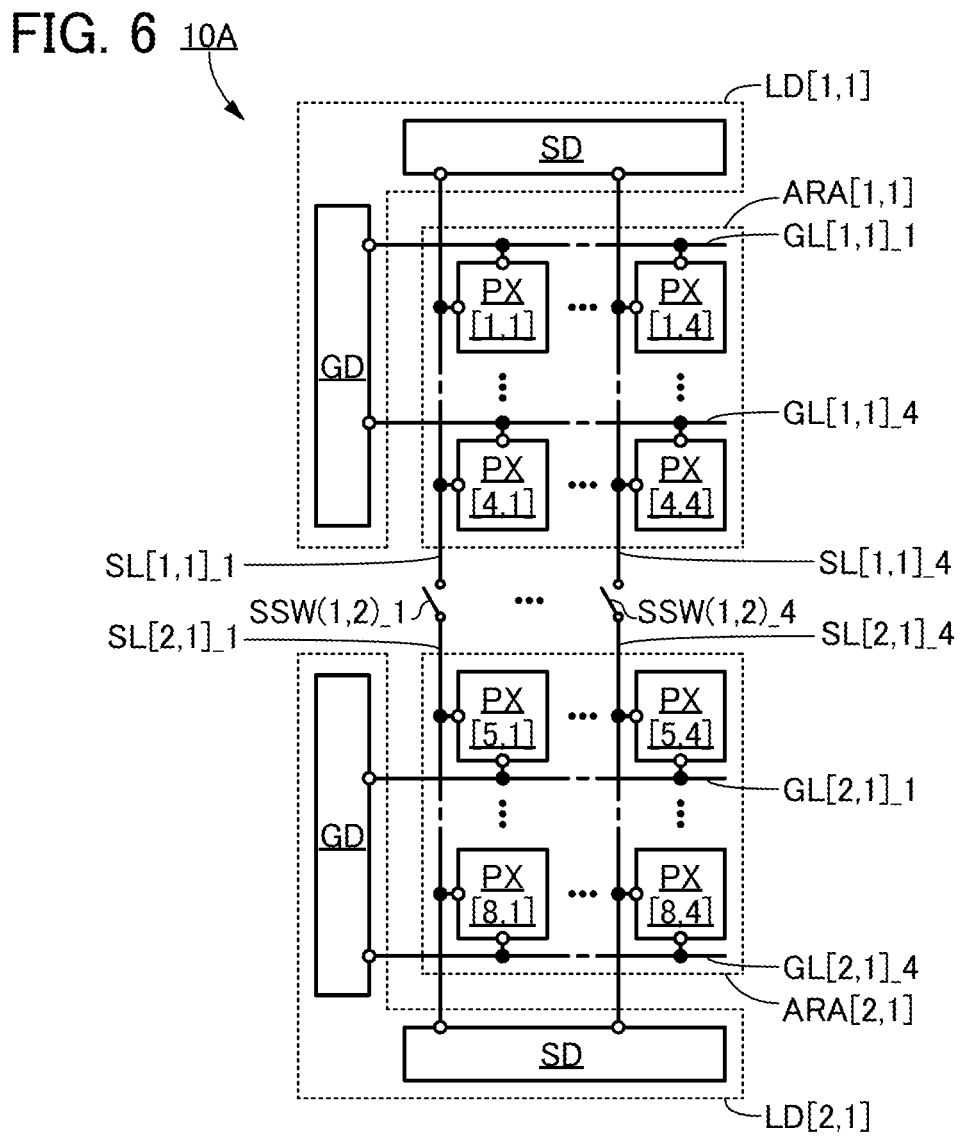
FIG. 6 is a block diagram illustrating a structure example of a display apparatus.

The display apparatus 10A illustrated in FIG. 6 is a modification example of the structure illustrated in FIG. 1A, and shows the case where a is 1 and b is 1. That is, the display apparatus 10A includes the pixel region ARA[1,1] and the pixel region ARA[2,1]. The display apparatus 10A includes a pixel circuit PX[1,1] to a pixel circuit PX[8,4] arranged in a matrix of eight rows and four columns. Note that the pixel region ARA[1,1] includes the pixel circuit PX[1,1] to the pixel circuit PX[4,4] arranged in a matrix of four rows and four columns, and the pixel region ARA[2,1] includes a pixel circuit PX[5,1] to the pixel circuit PX[8,4] arranged in a matrix of four rows and four columns.

In the pixel region ARA[1,1], each of a wiring SL[1,1]_1 to a wiring SL[1,1]_4 is extended in the column direction and each of a wiring GL[1,1]_1 to a wiring GL[1,1]_4 is extended in the row direction. In the pixel region ARA[2,1], each of a wiring SL[2,1]_1 to a wiring SL[2,1]_4 is extended in the column direction and each of a wiring GL[2,1]_1 to a wiring GL[2,1]_4 is extended in the row direction.

In the pixel region ARA[1,1], the wiring SL[1,1]_1 to the wiring SL[1,1]_4 are electrically connected to the pixel circuits PX provided in the respective columns. For example, the wiring SL[1,1]_1 is electrically connected to the pixel circuit PX[1,1] to the pixel circuit PX[4,1], and the wiring SL[1,1]_4 is electrically connected to the pixel circuit PX[1,4] to the pixel circuit PX[4,4]. In the pixel region ARA[1,1], the wiring GL[1,1]_1 to the wiring GL[1, 1]_4 are electrically connected to the pixel circuits PX provided in the respective rows. For example, the wiring GL[1,1]_1 is electrically connected to the pixel circuit PX[1,1] to the pixel circuit PX[1,4], and the wiring GL[1, 1]_4 is electrically connected to the pixel circuit PX[4,1] to the pixel circuit PX[4,4].

In the pixel region ARA[2,1], the wiring SL[2,1]_1 to the wiring SL[2,1]_4 are electrically connected to the pixel circuits PX provided in the respective columns. For example, the wiring SL[2,1]_1 is electrically connected to the pixel circuit PX[5,1] to the pixel circuit PX[8,1], and the wiring SL[2,1]_4 is electrically connected to the pixel circuit PX[5,4] to the pixel circuit PX[8,4]. In the pixel region ARA[2,1], the wiring GL[2,1]_1 to the wiring GL[2, 1]_4 are electrically connected to the pixel circuits PX provided in the respective rows. For example, the wiring GL[2,1]_1 is electrically connected to the pixel circuit PX[5,1] to the pixel circuit PX[5,4], and the wiring GL[2, 1]_4 is electrically connected to the pixel circuit PX[8,1] to the pixel circuit PX[8,4].

The driver circuit SD included in the local driver circuit LD[1,1] is electrically connected to the wiring SL[1,1]_1 to the wiring SL[1,1]_4. The driver circuit GD included in the local driver circuit LD[1,1] is electrically connected to the wiring GL[1,1]_1 to the wiring GL[1,1]_4. The driver circuit SD included in the local driver circuit LD[2,1] is electrically connected to the wiring SL[2,1]_1 to the wiring SL[2,1]_4. The driver circuit GD included in the local driver circuit LD[2,1] is electrically connected to the wiring GL[2, 1]_1 to the wiring GL[2,1]_4.

The display apparatus 10A includes a switch SSW(1,2)_1 to a switch SSW(1,2)_4. First terminals of the switch SSW(1,2)_1 to the switch SSW(1,2)_4 are electrically connected to the wiring SL[1,1]_1 to the wiring SL[1,1]_4 in the pixel region ARA[1,1], respectively, and second terminals of the switch SSW(1,2)_1 to the switch SSW(1,2)_4 are electrically connected to the wiring SL[2,1]_1 to the wiring SL[2,1]_4 in the pixel region ARA[2,1], respectively. Specifically, the first terminal of the switch SSW(1,2)_1 is electrically connected to the wiring SL[1,1]_1, and the second terminal of the switch SSW(1,2)_1 is electrically connected to the wiring SL[2,1]_1. The first terminal of the switch SSW(1,2)_4 is electrically connected to the wiring SL[1,1]_4, and the second terminal of the switch SSW(1,2)_4 is electrically connected to the wiring SL[2,1]_4.

Figure 7:
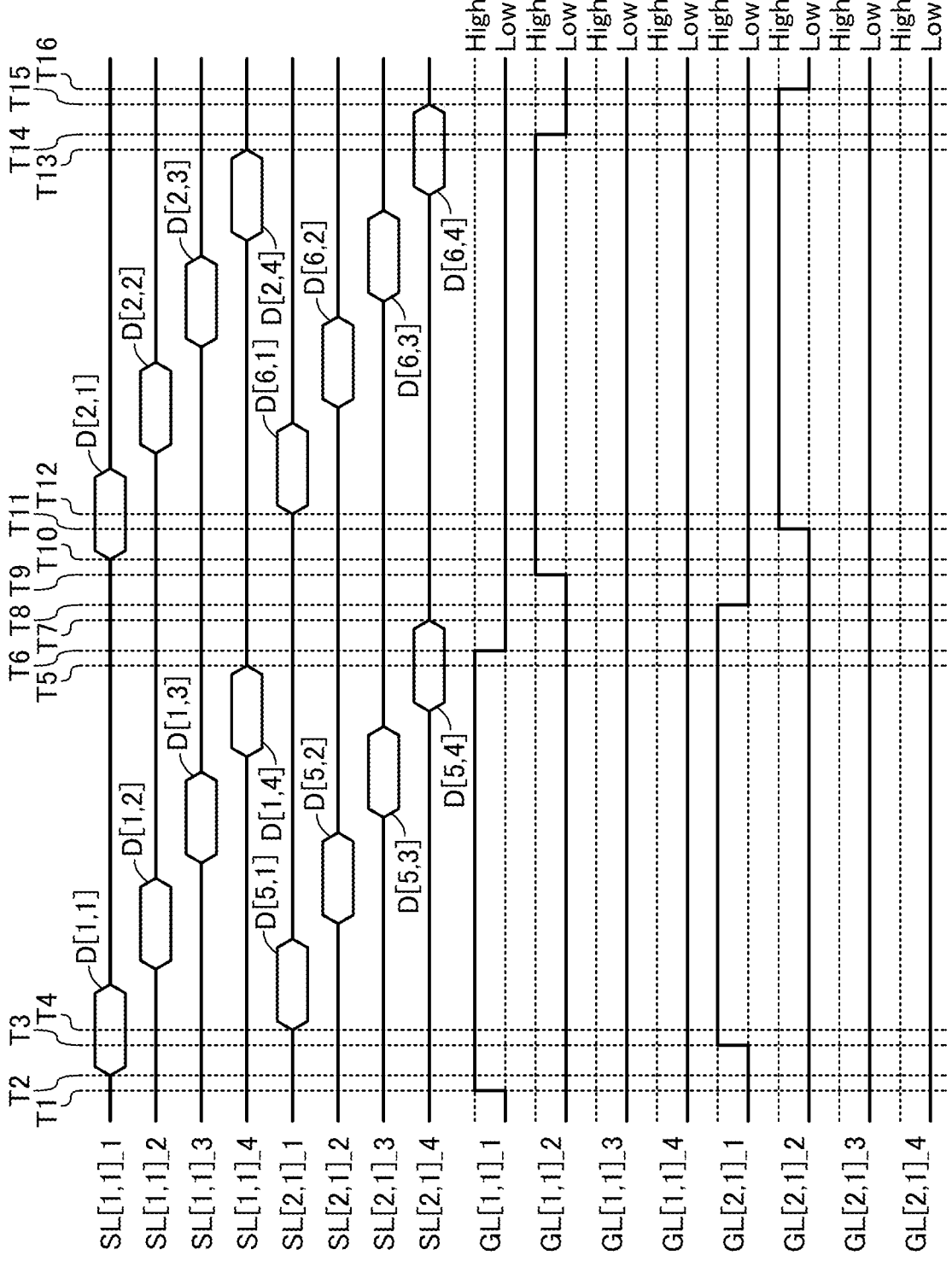
FIG. 7 is a timing chart showing an operation example of a display apparatus.

Next, the case where both the driver circuit SD and the driver circuit GD included in each of the local driver circuit LD[1,1] and the local driver circuit LD[2,1] in the display apparatus 10A in FIG. 6 operate as appropriate is described. FIG. 7 is a timing chart showing an operation example of the display apparatus 10A in the case where the local driver circuit LD[1,1] and the local driver circuit LD[2,1] operate as appropriate. The timing chart of FIG. 7 shows changes in data signals input to the wiring SL[1,1]_1 to the wiring SL[1,1]_4, the wiring SL[2,1]_1 to the wiring SL[2,1]_4 and potentials input to the wiring GL[1,1]_1 to the wiring GL[1,1]_4 and the wiring GL[2,1]_1 to the wiring GL[2,1]_4 in a period from Time T1 to Time T16 and time around the period.

Note that in the operation example in the timing chart of FIG. 7, the switch SSW(1,2)_1 to the switch SSW(1,2)_4 are turned off.

Note that in the timing chart of FIG. 7, time elapses from Time T1 to Time T2, Time T3, Time T4, Time T5, Time T6, Time T7, Time T8, Time T9, Time T10, Time T11, Time T12, Time T13, Time T14, Time T15, and Time T16 in this order.

In the case where a high-level potential is applied to at least one of the wiring GL[1,1]_1 to the wiring GL[1,1]_4 or the wiring GL[2,1]_1 to the wiring GL[2,1]_4, a writing transistor in the pixel circuit PX electrically connected to the wiring GL to which the high-level potential is applied is turned on. That is, in a period when the high-level potential is applied to any one of the wiring GL[1,1]_1 to the wiring GL[1,1]_4 and the wiring GL[2,1]_1 to the wiring GL[2,1]_4, image data can be written to the pixel circuit PX electrically connected to the wiring GL to which the high-level potential is applied.

Before Time T1, the low-level potential is input to the wiring GL[1,1]_1 to the wiring GL[1,1]_4 and the wiring GL[2,1]_1 to the wiring GL[2,1]_4 from the driver circuits GD in the local driver circuit LD[1,1] and the local driver circuit LD[1,2]. Note that in FIG. 7, the low-level potential is denoted as Low. Therefore, the writing transistors in the pixel circuits PX electrically connected to the wiring GL[1,1]_1 to the wiring GL[1,1]_4 and the wiring GL[2,1]_1 to the wiring GL[2,1]_4 are turned off. That is, image data is not written to the pixel circuits PX included in the pixel region ARA[1,1] and the pixel region ARA[2,1].

In a period from Time T1 to Time T6, the high-level potential is input from the driver circuit GD in the local driver circuit LD[1,1] to the wiring GL[1,1]_1. Note that in FIG. 7, the high-level potential is denoted as High. Therefore, in the period from Time T1 to Time T6, image data can be written to the pixel circuit PX[1,1] to the pixel circuit PX[1,4] electrically connected to the wiring GL[1,1]_1.

In a period from Time T2 to Time T5, data D[1,1], data D[1,2], data D[1,3], and data D[1,4] are sequentially input as image data to the wiring SL[1,1]_1 to the wiring SL[1,1]_4 from the driver circuit SD in the local driver circuit LD[1,1]. Thus, the data D[1,1] is written to the pixel circuit PX[1,1], the data D[1,2] is written to the pixel circuit PX[1,2], the data D[1,3] is written to the pixel circuit PX[1,3], and the data D[1,4] is written to the pixel circuit PX[1,4].

After Time T6, the low-level potential is input from the driver circuit GD in the local driver circuit LD[1,1] to the wiring GL[1,1]_1. Therefore, after Time T6, the writing transistors in the pixel circuit PX[1,1] to the pixel circuit PX[1,4] electrically connected to the wiring GL[1,1]_1 are turned off, whereby the data D[1,1] to the data D[1,4] which have been written before Time T6 are retained in the pixel circuit PX[1,1] to the pixel circuit PX[1,4], respectively.

In a period from Time T3 to Time T8, the high-level potential is input from the driver circuit GD in the local driver circuit LD[2,1] to the wiring GL[2,1]_1. Therefore, in the period from Time T3 to Time T8, image data can be written to the pixel circuit PX[5,1] to the pixel circuit PX[5,4] electrically connected to the wiring GL[2,1]_1.

In a period from Time T4 to Time T7, data D[5,1], data D[5,2], data D[5,3], and data D[5,4] are sequentially input as image data to the wiring SL[2,1]_1 to the wiring SL[2,1]_4 from the driver circuit SD in the local driver circuit LD[2,1]. Thus, the data D[5,1] is written to the pixel circuit PX[5,1], the data D[5,2] is written to the pixel circuit PX[5,2], the data D[5,3] is written to the pixel circuit PX[5,3], and the data D[5,4] is written to the pixel circuit PX[5,4].

After Time T8, the low-level potential is input from the driver circuit GD in the local driver circuit LD[2,1] to the wiring GL[2,1]_1. Therefore, after Time T8, the writing transistors in the pixel circuit PX[5,1] to the pixel circuit PX[5,4] electrically connected to the wiring GL[2,1]_1 are turned off, whereby the data D[5,1] to the data D[5,4] which have been written before Time T8 are retained in the pixel circuit PX[5,1] to the pixel circuit PX[5,4], respectively.

In a period from Time T9 to Time T14, the high-level potential is input from the driver circuit GD in the local driver circuit LD[1,1] to the wiring GL[1,1]_2. Therefore, in the period from Time T9 to Time T14, image data can be written to the pixel circuit PX[2,1] to the pixel circuit PX[2,4] electrically connected to the wiring GL[1,1]_2.

In a period from Time T10 to Time T13, data D[2,1], data D[2,2], data D[2,3], and data D[2,4] are sequentially input as image data to the wiring SL[1,1]_1 to the wiring SL[1,1]_4 from the driver circuit SD in the local driver circuit LD[1,1]. Thus, the data D[2,1] is written to the pixel circuit PX[2,1], the data D[2,2] is written to the pixel circuit PX[2,2], the data D[2,3] is written to the pixel circuit PX[2,3], and the data D[2,4] is written to the pixel circuit PX[2,4].

After Time T14, the low-level potential is input from the driver circuit GD in the local driver circuit LD[1, 1] to the wiring GL[1,1]_2. Therefore, after Time T14, the writing transistors in the pixel circuit PX[2,1] to the pixel circuit PX[2,4] electrically connected to the wiring GL[1,1]_2 are turned off, whereby the data D[2,1] to the data D[2,4] which have been written before Time T14 are retained in the pixel circuit PX[2, 1] to the pixel circuit PX[2,4], respectively.

In a period from Time T11 to Time T16, the high-level potential is input from the driver circuit GD in the local driver circuit LD[2,1] to the wiring GL[2,1]_1. Therefore, in the period from Time T3 to Time T8, image data can be written to the pixel circuit PX[5,1] to the pixel circuit PX[5,4] electrically connected to the wiring GL[2,1]_1.

In a period from Time T12 to Time T15, data D[6,1], data D[6,2], data D[6,3], and data D[6,4] are sequentially input as image data to the wiring SL[2,1]_1 to the wiring SL[2,1]_4 from the driver circuit SD in the local driver circuit LD[2,1]. Thus, the data D[6,1] is written to the pixel circuit PX[6,1], the data D[6,2] is written to the pixel circuit PX[6,2], the data D[6,3] is written to the pixel circuit PX[6,3], and the data D[6,4] is written to the pixel circuit PX[6,4].

After Time T16, the low-level potential is input from the driver circuit GD in the local driver circuit LD[2,1] to the wiring GL[2,1]_2. Therefore, after Time T16, the writing transistors in the pixel circuit PX[6,1] to the pixel circuit PX[6,4] electrically connected to the wiring GL[2,1]_2 are turned off, whereby the data D[6,1] to the data D[6,4] which have been written before Time T8 are retained in the pixel circuit PX[6,1] to the pixel circuit PX[6,4], respectively.

After Time T16, the selection signal is transmitted (the high-level potential is input) to any of the wiring GL[1,1]_3, the wiring GL[1,1]_4, the wiring GL[2,1]_3, and the wiring GL[2,1]_4 in a manner similar to operation in a period from Time T1 to Time T8 and operation in a period from Time T9 to Time T16, whereby image data can be written also to the pixel circuit PX[3,1] to the pixel circuit PX[4,4] included in the pixel region ARA[1,1] and a pixel circuit PX[7,1] to the pixel circuit PX[8,4] included in the pixel region ARA[2,1].

Figure 8:
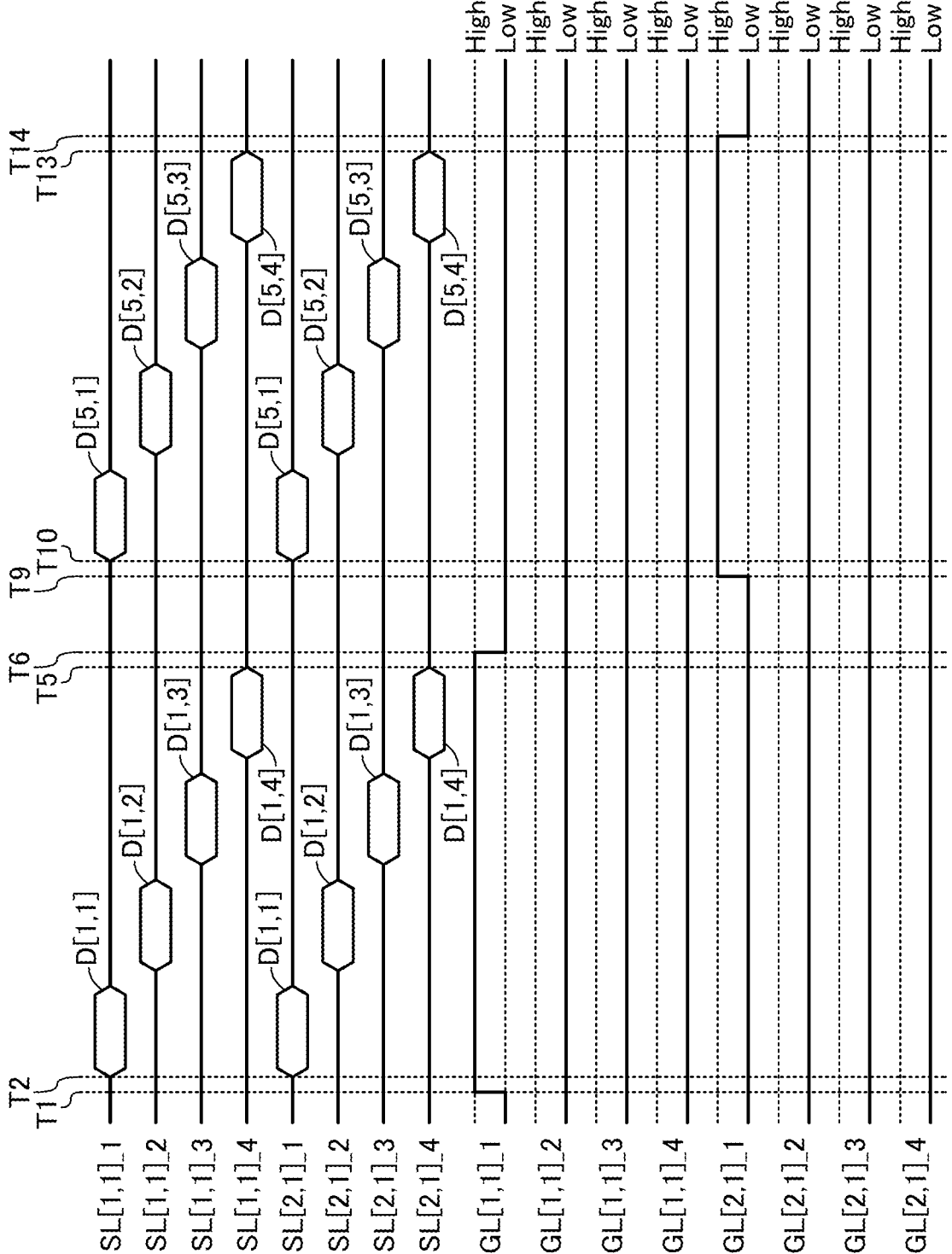
FIG. 8 is a timing chart showing an operation example of a display apparatus.

Next, the case where one of the driver circuits SD included in the local driver circuit LD[1,1] and the local driver circuit LD[2, 1] in the display apparatus 10A in FIG. 6 does not operate as appropriate is described. FIG. 8 is a timing chart showing an operation example of the display apparatus 10A in the case where one of the driver circuits SD included in the local driver circuit LD[1,1] and the local driver circuit LD[2,1] does not operate as appropriate. Note that for wirings, potentials, and data shown in the timing chart of FIG. 8, the timing chart of FIG. 7 is referred to.

Note that in the operation example in the timing chart of FIG. 8, the switch SSW(1,2)_1 to the switch SSW(1,2)_4 are turned on. Thus, in the operation example in the timing chart of FIG. 8, the same data is input to the wiring SL[1,1]_1 and the wiring SL[2, 1]_1. Similarly, the same data is input to the wiring SL[1,1]_2 and the wiring SL[2, 1]_2, the same data is input to the wiring SL[1, 1]_3 and the wiring SL[2, 1]_3, and the same data is input to the wiring SL[1,1]_4 and the wiring SL[2,1]_4.

Before Time T1, the low-level potential is input to the wiring GL[1,1]_1 to the wiring GL[1,1]_4 and the wiring GL[2,1]_1 to the wiring GL[2,1]_4 from the driver circuits GD in the local driver circuit LD[1,1] and the local driver circuit LD[1,2]. Note that in FIG. 8, the low-level potential is denoted as Low. Therefore, the writing transistors in the pixel circuits PX electrically connected to the wiring GL[1, 1]_1 to the wiring GL[1, 1]_4 and the wiring GL[2, 1]_1 to the wiring GL[2, 1]_4 are turned off. That is, image data is not written to the pixel circuits PX included in the pixel region ARA[1,1] and the pixel region ARA[2,1].

In the period from Time T1 to Time T6, the high-level potential is input from the driver circuit GD in the local driver circuit LD[1,1] to the wiring GL[1,1]_1. Note that in FIG. 8, the high-level potential is denoted as High. Therefore, in the period from Time T1 to Time T6, image data can be written to the pixel circuit PX[1,1] to the pixel circuit PX[1,4] electrically connected to the wiring GL[1,1]_1.

In a period from Time T2 to Time T5, the data D[1,1], the data D[1,2], the data D[1,3], and the data D[1,4] are sequentially input as image data to the wiring SL[1,1]_1 to the wiring SL[1,1]_4 and the wiring SL[2, 1]_1 to the wiring SL[2, 1]_4 from the driver circuit SD in the local driver circuit LD[1,1] or the local driver circuit LD[2,1]. Thus, the data D[1, 1] is written to the pixel circuit PX[1,1], the data D[1,2] is written to the pixel circuit PX[1,2], the data D[1,3] is written to the pixel circuit PX[1,3], and the data D[1,4] is written to the pixel circuit PX[1,4].

After Time T6, the low-level potential is input from the driver circuit GD in the local driver circuit LD[1,1] to the wiring GL[1,1]_1. Therefore, after Time T6, the writing transistors in the pixel circuit PX[1,1] to the pixel circuit PX[1,4] electrically connected to the wiring GL[1,1]_1 are turned off, whereby the data D[1,1] to the data D[1,4] which have been written before Time T6 are retained in the pixel circuit PX[1,1] to the pixel circuit PX[1,4], respectively.

In a period from Time T9 to Time T14, the high-level potential is input from the driver circuit GD in the local driver circuit LD[2,1] to the wiring GL[2,1]_1. Therefore, in the period from Time T9 to Time T14, image data can be written to the pixel circuit PX[5,1] to the pixel circuit PX[5,4] electrically connected to the wiring GL[2,1]_1.

In a period from Time T10 to Time T13, the data D[5,1], the data D[5,2], the data D[5,3], and the data D[5,4] are sequentially input as image data to the wiring SL[1,1]_1 to the wiring SL[1,1]_4 and the wiring SL[2,1]_1 to the wiring SL[2, 1]_4 from the driver circuit SD in the local driver circuit LD[1,1] or the local driver circuit LD[2,1]. Thus, the data D[5,1] is written to the pixel circuit PX[5,1], the data D[5,2] is written to the pixel circuit PX[5,2], the data D[5,3] is written to the pixel circuit PX[5,3], and the data D[5,4] is written to the pixel circuit PX[5,4].

After Time T14, the low-level potential is input from the driver circuit GD in the local driver circuit LD[2, 1] to the wiring GL[2, 1]_1. Therefore, after Time T14, the writing transistors in the pixel circuit PX[5,1] to the pixel circuit PX[5,4] electrically connected to the wiring GL[2,1]_1 are turned off, whereby the data D[5,1] to the data D[5,4] which have been written before Time T14 are retained in the pixel circuit PX[5,1] to the pixel circuit PX[5,4], respectively.

After Time T14, the selection signal is transmitted (the high-level potential is input) to any of the wiring GL[1,1]_2, the wiring GL[1,1]_3, the wiring GL[1,1]_4, the wiring GL[2,1]_2, the wiring GL[2, 1]_3, and the wiring GL[2, 1]_4 in a manner similar to operation in a period from Time T1 to Time T6 and operation in a period from Time T9 to Time T14, whereby image data can be written also to the pixel circuit PX[2,1] to the pixel circuit PX[4,4] included in the pixel region ARA[1,1] and a pixel circuit PX[6,1] to the pixel circuit PX[8,4] included in the pixel region ARA[2,1].

Even in the case where one of the driver circuits SD included in the local driver circuit LD[1,1] and the local driver circuit LD[2,1] does not operate as appropriate in the display apparatus 10A, by performing the operation example in the timing chart of FIG. 8, image data can be written to the plurality of pixel circuits PX included in the display apparatus 10A.

Operation Example 2

The operation example of the display apparatus 10 in the case where one of the driver circuits SD included in the local driver circuits LD in the adjacent pixel regions ARA does not operate as appropriate is described above; here, an operation example of the display apparatus 10 in the case where one of the driver circuits GD included in the local driver circuits LD in the adjacent pixel regions ARA does not operate as appropriate is described. Here, an operation example of a display apparatus 10B illustrated in FIG. 9 is described as an example.

Figure 9:
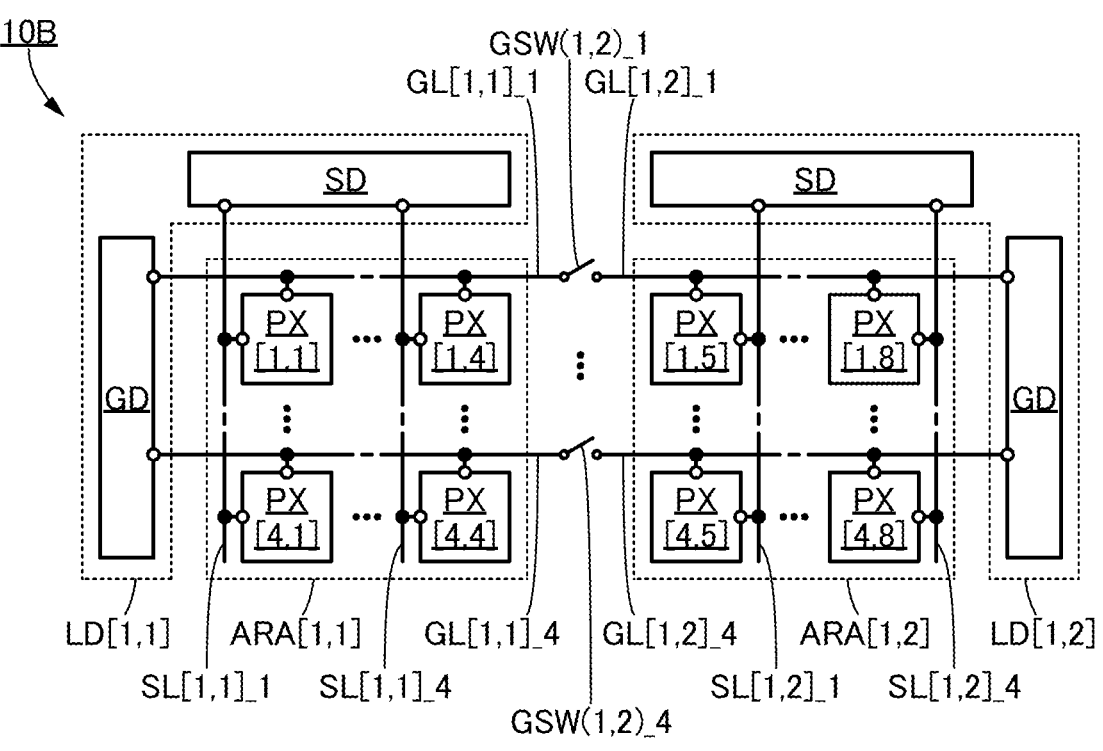
FIG. 9 is a block diagram illustrating a structure example of a display apparatus.

The display apparatus 10B illustrated in FIG. 9 is a modification example of the display apparatus 10 illustrated in FIG. 5B, and shows the case where a is 1 and b is 1. That is, the display apparatus 10B includes the pixel region ARA[1,1] and the pixel region ARA[1,2]. The display apparatus 10B includes a pixel circuit PX[1,1] to a pixel circuit PX[4,8] arranged in a matrix of four rows and eight columns. Note that the pixel region ARA[1,1] includes the pixel circuit PX[1,1] to the pixel circuit PX[4,4] arranged in a matrix of four rows and four columns, and the pixel region ARA[1,2] includes a pixel circuit PX[1,5] to a pixel circuit PX[4,8] arranged in a matrix of four rows and four columns.

In the pixel region ARA[1,1], each of a wiring SL[1,1]_1 to a wiring SL[1,1]_4 is extended in the column direction and each of a wiring GL[1,1]_1 to a wiring GL[1,1]_4 is extended in the row direction. In the pixel region ARA[1,2], each of a wiring SL[1,2]_1 to a wiring SL[1,2]_4 is extended in the column direction and each of a wiring GL[1,2]_1 to a wiring GL[1,2]_4 is extended in the row direction.

In the pixel region ARA[1,1], the wiring SL[1,1]_1 to the wiring SL[1,1]_4 are electrically connected to the pixel circuits PX provided in the respective columns. For example, the wiring SL[1,1]_1 is electrically connected to the pixel circuit PX[1,1] to the pixel circuit PX[4,1], and the wiring SL[1, 1]_4 is electrically connected to the pixel circuit PX[1,4] to the pixel circuit PX[4,4]. In the pixel region ARA[1,1], the wiring GL[1,1]_1 to the wiring GL[1, 1]_4 are electrically connected to the pixel circuits PX provided in the respective rows. For example, the wiring GL[1,1]_1 is electrically connected to the pixel circuit PX[1,1] to the pixel circuit PX[1,4], and the wiring GL[1, 1]_4 is electrically connected to the pixel circuit PX[4, 1] to the pixel circuit PX[4,4].

In the pixel region ARA[1,2], the wiring SL[1,2]_1 to the wiring SL[1,2]_4 are electrically connected to the pixel circuits PX provided in the respective columns. For example, the wiring SL[1,2]_1 is electrically connected to the pixel circuit PX[1,5] to the pixel circuit PX[4,5], and the wiring SL[1,2]_4 is electrically connected to the pixel circuit PX[1,8] to the pixel circuit PX[4,8]. In the pixel region ARA[1,2], the wiring GL[1,2]_1 to the wiring GL[1, 2]_4 are electrically connected to the pixel circuits PX provided in the respective rows. For example, the wiring GL[1,2]_1 is electrically connected to the pixel circuit PX[1,5] to the pixel circuit PX[1,8], and the wiring GL[1, 2]_4 is electrically connected to the pixel circuit PX[4,5] to the pixel circuit PX[4,8].

The driver circuit SD included in the local driver circuit LD[1,1] is electrically connected to the wiring SL[1,1]_1 to the wiring SL[1,1]_4. The driver circuit GD included in the local driver circuit LD[1,1] is electrically connected to the wiring GL[1,1]_1 to the wiring GL[1,1]_4. The driver circuit SD included in the local driver circuit LD[1,2] is electrically connected to the wiring SL[1,2]_1 to the wiring SL[1,2]_4. The driver circuit GD included in the local driver circuit LD[1,2] is electrically connected to the wiring GL[1, 2]_1 to the wiring GL[1,2]_4.

The display apparatus 10B includes a switch GSW(1,2)_1 to a switch GSW(1,2)_4. First terminals of the switch GSW(1,2)_1 to the switch GSW(1,2)_4 are electrically connected to the wiring GL[1,1]_1 to the wiring GL[1,1]_4 in the pixel region ARA[1,1], respectively, and second terminals of the switch GSW(1,2)_1 to the switch GSW(1, 2)_4 are electrically connected to the wiring GL[1,2]_1 to the wiring GL[1,2]_4 in the pixel region ARA[1,2], respectively. Specifically, the first terminal of the switch GSW(1, 2)_1 is electrically connected to the wiring GL[1,1]_1, and the second terminal of the switch GSW(1,2)_1 is electrically connected to the wiring GL[1,2]_1. The first terminal of the switch GSW(1,2)_4 is electrically connected to the wiring GL[1,1]_4, and the second terminal of the switch SSW(1, 2)_4 is electrically connected to the wiring GL[1,2]_4.

Figure 10:
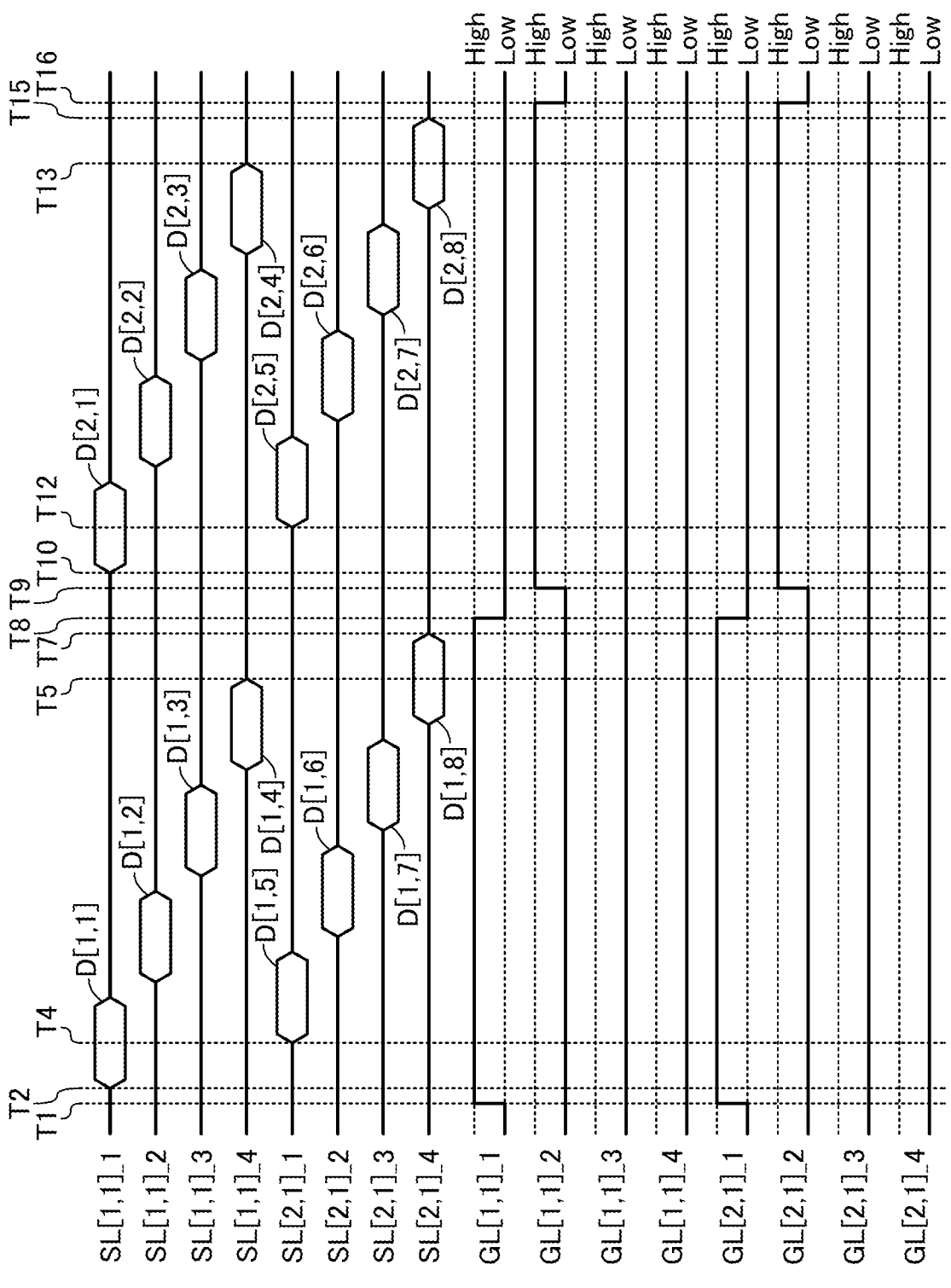
FIG. 10 is a timing chart showing an operation example of a display apparatus.

Next, the case where one of the driver circuits GD included in the local driver circuit LD[1,1] and the local driver circuit LD[1,2] in the display apparatus 10B in FIG. 9 does not operate as appropriate is described. FIG. 10 is a timing chart showing an operation example of the display apparatus 10B in the case where one of the driver circuits SD included in the local driver circuit LD[1,1] and the local driver circuit LD[1,2] does not operate as appropriate. Note that for wirings, potentials, and data shown in the timing chart of FIG. 10, the timing chart of FIG. 7 is referred to.

Note that in the operation example in the timing chart of FIG. 10, the switch GSW(1,2)_1 to the switch GSW(1,2)_4 are turned on. Thus, in the operation example in the timing chart of FIG. 10, the same potential (signal) is input to the wiring GL[1,1]_1 and the wiring GL[1,2]_1. Similarly, the same potential (signal) is input to the wiring GL[1,1]_2 and a wiring GL[1,2]_2, the same potential (signal) is input to the wiring GL[1,1]_3 and a wiring GL[1,2]_3, and the same potential (signal) is input to the wiring GL[1,1]_4 and the wiring GL[1,2]_4.

Before Time T1, the low-level potential is input to the wiring GL[1,1]_1 to the wiring GL[1,1]_4 (the wiring GL[1,2]_1 to the wiring GL[1,2]_4) from the driver circuits GD in the local driver circuit LD[1,1] or the local driver circuit LD[1,2]. Note that in FIG. 10, the low-level potential is denoted as Low. Therefore, the writing transistors in the pixel circuits PX electrically connected to the wiring GL[1, 1]_1 to the wiring GL[1, 1]_4 and the wiring GL[1,2]_1 to the wiring GL[1,2]_4 are turned off. That is, image data is not written to the pixel circuits PX included in the pixel region ARA[1,1] and the pixel region ARA[1,2].

In a period from Time T1 to Time T8, the high-level potential is input from the driver circuit GD in the local driver circuit LD[1,1] or the local driver circuit LD[1,2] to the wiring GL[1,1]_1 (the wiring GL[1,2]_1). Note that in FIG. 10, the high-level potential is denoted as High. Therefore, in the period from Time T1 to Time T8, image data can be written to the pixel circuit PX[1, 1] to the pixel circuit PX[1,4] and the pixel circuit PX[1,5] to the pixel circuit PX[1,8] electrically connected to the wiring GL[1,1]_1 and the wiring GL[1,2]_1.

In the period from Time T2 to Time T5, data D[1,1], data D[1,2], data D[1,3], and data D[1,4] are sequentially input as image data to the wiring SL[1,1]_1 to the wiring SL[1,1]_4 from the driver circuit SD in the local driver circuit LD[1,1]. Thus, the data D[1,1] is written to the pixel circuit PX[1,1], the data D[1,2] is written to the pixel circuit PX[1,2], the data D[1,3] is written to the pixel circuit PX[1,3], and the data D[1,4] is written to the pixel circuit PX[1,4].

In a period from Time T4 to Time T7, data D[1,5], data D[1,6], data D[1,7], and data D[1,8] are sequentially input as image data to the wiring SL[1,2]_1 to the wiring SL[1,2]_4 from the driver circuit SD in the local driver circuit LD[1,1]. Thus, the data D[1,5] is written to the pixel circuit PX[1,5], the data D[1,6] is written to the pixel circuit PX[1,6], the data D[1,7] is written to the pixel circuit PX[1,7], and the data D[1,8] is written to the pixel circuit PX[1,8].

After Time T8, the low-level potential is input from the driver circuit GD in the local driver circuit LD[1,1] or the local driver circuit LD[1,2] to the wiring GL[1,1]_1 (the wiring GL[1,2]_1). Thus, after Time T8, writing transistors in the pixel circuit PX[1,1] to the pixel circuit PX[1,4] and the pixel circuit PX[1,5] to the pixel circuit PX[1,8] which are electrically connected to the wiring GL[1,1]_1 and the wiring GL[1,2]_1 are turned off, whereby the data D[1,1] to the data D[1,4] and the data D[1,5] to the data D[1,8] which have been written before Time T8 are retained in the pixel circuit PX[1,1] to the pixel circuit PX[1,4] and the pixel circuit PX[1,5] to the pixel circuit PX[1,8], respectively.

In a period from Time T9 to Time T16, the high-level potential is input from the driver circuit GD in the local driver circuit LD[1,1] or the local driver circuit LD[1,2] to the wiring GL[1,1]_2 (the wiring GL[1,2]_2). Therefore, in the period from Time T9 to Time T16, image data can be written to the pixel circuit PX[2,1] to the pixel circuit PX[2,4] and the pixel circuit PX[2,5] to the pixel circuit PX[2,8] electrically connected to the wiring GL[1,1]_2 and the wiring GL[1,2]_2.

In the period from Time T10 to Time T13, data D[2,1], data D[2,2], data D[2,3], and data D[2,4] are sequentially input as image data to the wiring SL[1,1]_1 to the wiring SL[1,1]_4 from the driver circuit SD in the local driver circuit LD[1,1]. Thus, the data D[2,1] is written to the pixel circuit PX[2,1], the data D[2,2] is written to the pixel circuit PX[2,2], the data D[2,3] is written to the pixel circuit PX[2,3], and the data D[2,4] is written to the pixel circuit PX[2,4].

In the period from Time T12 to Time T15, data D[2,5], data D[2,6], data D[2,7], and data D[2,8] are sequentially input as image data to the wiring SL[1,2]_1 to the wiring SL[1,2]_4 from the driver circuit SD in the local driver circuit LD[1,1]. Thus, the data D[2,5] is written to the pixel circuit PX[2,5], the data D[2,6] is written to the pixel circuit PX[2,6], the data D[2,7] is written to the pixel circuit PX[2,7], and the data D[2,8] is written to the pixel circuit PX[2,8].

After Time T16, the low-level potential is input from the driver circuit GD in the local driver circuit LD[1,1] or the local driver circuit LD[1,2] to the wiring GL[1,1]_2 (the wiring GL[1,2]_2). Thus, after Time T16, writing transistors in the pixel circuit PX[2,1] to the pixel circuit PX[2,4] and the pixel circuit PX[2,5] to the pixel circuit PX[2,8] which are electrically connected to the wiring GL[1,1]_2 and the wiring GL[1,2]_2 are turned off, whereby the data D[2,1] to the data D[2,4] and the data D[2,5] to the data D[2,8] which have been written before Time T16 are retained in the pixel circuit PX[2,1] to the pixel circuit PX[2,4] and the pixel circuit PX[2,5] to the pixel circuit PX[2,8], respectively.

After Time T16, the selection signal is transmitted (the high-level potential is input) to any of the wiring GL[1,1]_3 (wiring GL[1,2]_3) and the wiring GL[1,1]_4 (the wiring GL[1,2]_4), in a manner similar to operation in a period from Time T1 to Time T8 and operation in a period from Time T9 to Time T16, whereby image data can be written also to the pixel circuit PX[3,1] to the pixel circuit PX[4,4] included in the pixel region ARA[1,1] and a pixel circuit PX[3,5] to the pixel circuit PX[4,8] included in the pixel region ARA[1,2].

Even in the case where one of the driver circuits GD included in the local driver circuit LD[1,1] and the local driver circuit LD[1,2] does not operate as appropriate in the display apparatus 10B, by performing the operation example in the timing chart of FIG. 10, image data can be written to the plurality of pixel circuits PX included in the display apparatus 10B.

As described above, by applying the circuit configuration illustrated in FIG. 1A to a display apparatus, a driver circuit included in the display apparatus can have redundancy. With the above configuration, even in the case where one of two driver circuits does not operate due to, for example, a malfunction, the display apparatus can operate as appropriate by using the other of the two driver circuits; therefore, the yield of the display apparatus can be increased.

Note that this embodiment can be combined with any of the other embodiments described in this specification as appropriate.

Embodiment 2

In this embodiment, a structure example of the display apparatus of one embodiment of the present invention and an example of a method of manufacturing the display apparatus will be described.

Embodiment 1 describes the display apparatus in which the driver circuit SD (the driver circuit GD) included in the local driver circuit LD has redundancy, and this embodiment describes a method of manufacturing the display apparatus in which when it is determined that some of driver circuits SD (driver circuits GD) included in all local driver circuits LD do not operate as appropriate in the process of manufacturing the display apparatus, image data or a selection signal can be transmitted to the pixel circuits PX included in the pixel region ARA overlapping with the local driver circuit LD including the driver circuit SD (the driver circuit GD) that does not operate as appropriate by another local driver circuit LD.

Note that a method of manufacturing the pixel layer PXAL illustrated in FIG. 2A is described as an example of the method of manufacturing a display apparatus described in this embodiment. Since the substrate BS1 and the substrate BS2 are attached to each other in FIG. 2A, the method of manufacturing a display apparatus can be referred to as a method of forming a circuit and a wiring over the substrate BS2. Accordingly, in this specification and the like, the method of manufacturing a display apparatus described in this embodiment can be referred to as a method of manufacturing a semiconductor device.

Figures 11A, 11B:
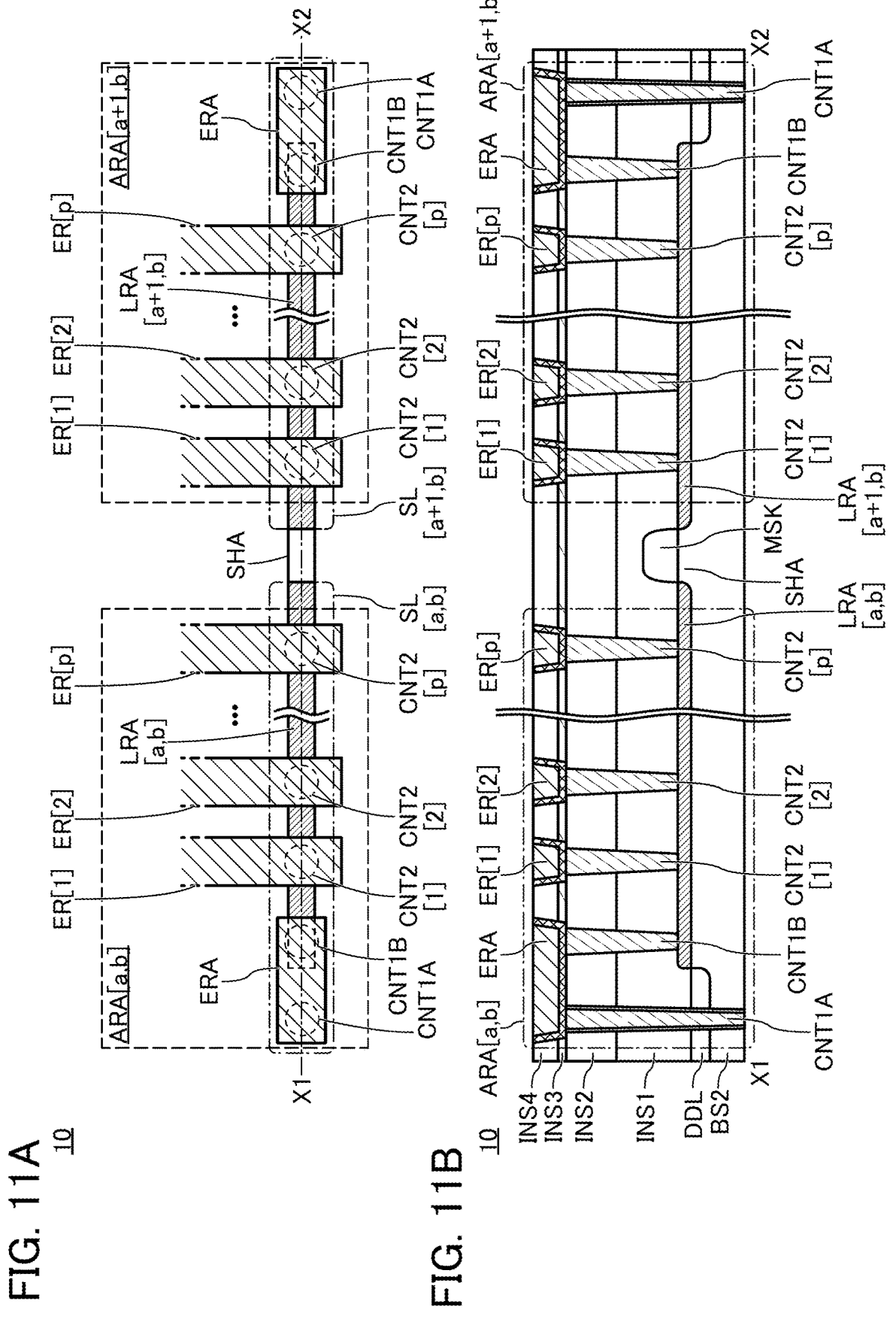
FIG. 11A is a schematic plan view illustrating a structure example of a display apparatus.
FIG. 11B is a schematic cross-sectional view illustrating the structure example of the display apparatus.

FIG. 11A is a plan view illustrating, as an example, the wirings SL and conductors formed around the wirings SL in the display apparatus 10 in FIG. 2. FIG. 11B is a cross-sectional view of the display apparatus 10 taken along the dashed-dotted line X1-X2 in FIG. 11A as an example. Note that FIG. 11A and FIG. 11B selectively illustrate the pixel region ARA[a,b] and the pixel region ARA[a+1,b].

In FIG. 11A, each of the wiring SL[a,b] and the wiring SL[a+1,b] includes a conductor ERA, a conductor CNT1A, and a conductor CNT1B, as an example. The wiring SL[a,b] includes a low-resistance region LRA[a,b] and the wiring SL[a+1,b] includes a low-resistance region LRA[a+1,b]. In FIG. 11A and FIG. 11B, each of the pixel region ARA[a,b] and the pixel region ARA[a+1,b] includes a conductor CNT2[1] to a conductor CNT2[$p$] and a conductor ER[1] to a conductor ER[p].

In each of the pixel region ARA[a,b] and the pixel region ARA[a+1,b], the low-resistance region LRA[a,b] and the low-resistance region LRA[a+1,b] are formed over part of the substrate BS2, as an example. For this reason, the substrate BS2 is preferably a semiconductor substrate including silicon or germanium as a material.

A semiconductor region SHA is formed over part of the substrate BS2, for example. Specifically, the semiconductor region SHA is formed over the substrate BS2 between the low-resistance region LRA[a,b] included in the pixel region ARA[a,b] and the low-resistance region LRA[a+1,b] included in the pixel region ARA[a+1,b].

A separation layer DDL is formed over part of the substrate BS2, as an example. The separation layer DDL is formed in order to separate a plurality of wirings formed over the substrate BS2, for example.

An insulator MSK is formed over the semiconductor region SHA. The insulator MSK functions as a mask for forming the low-resistance region LRA[a,b], the low-resistance region LRA[a+1,b], and the semiconductor region SHA over the substrate BS2, as an example.

For example, an insulator INS1, an insulator INS2, an insulator INS3, and an insulator INS4 are formed in this order above the separation layer DDL, the low-resistance region LRA[a,b], the low-resistance region LRA[a+1,b], and the insulator MSK.

A plurality of openings whose bottom portions are regarded as the low-resistance region LRA[a,b] and the low-resistance region LRA[a+1,b] are formed in the insulator INS1 and the insulator INS2 in some regions overlapping with the low-resistance region LRA[a,b] and the low-resistance region LRA[a+1,b]. A plurality of openings are formed in the insulator INS1 and the insulator INS2 in some regions overlapping with the separation layer DDL.

In the pixel region ARA[a,b] and the pixel region ARA[a+1,b], the conductor CNT1B and the conductor CNT2[1] to the conductor CNT2[p] are formed to fill the plurality of openings whose bottom portions are regarded as the low-resistance region LRA[a,b] and the low-resistance region LRA[a+1,b]. The conductors CNT1A are formed to fill the plurality of openings in some regions overlapping with the separation layer DDL.

Note that the conductor CNT1B, the conductor CNT2[1] to the conductor CNT2[p], the conductor CNT1A, and the like each have a function of a plug or a wiring. A plurality of conductors functioning as a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases. The conductor CNT1A is sometimes referred to as a TSV (Through Silicon Via).

A plurality of openings are provided in the insulator INS3 and the insulator INS4. The conductor ERA and the conductor ER[1] to the conductor ER[p] are formed to fill the plurality of openings. In particular, a bottom surface of each of the openings filled with the conductor ERA includes a region overlapping with the conductor CNT1A and a region overlapping with the conductor CNT1B. The bottom surfaces of the openings filled with the conductor ER[1] to the conductor ER[p] include regions overlapping with the conductor CNT2[1] to the conductor CNT2[p], respectively.

In the pixel region ARA[a,b], each of the conductor CNT1B and the conductor CNT2[1] to the conductor CNT2[p] is electrically connected to the low-resistance region LRA[a,b]. In the pixel region ARA[a+1,b], each of the conductor CNT1B and the conductor CNT2[1] to the conductor CNT2[p] is electrically connected to the low-resistance region LRA[a+1,b]. The conductor CNT1B is electrically connected to the conductor ERA, and the conductor ERA is electrically connected to the conductor CNT1A. The conductor CNT2[1] to the conductor CNT2[p] are electrically connected to the conductor ER[1] to the conductor ER[p], respectively.

Note that the conductor CNT1A is electrically connected to, for example, a circuit (the local driver circuit LD[a,b] or the local driver circuit LD[a,b]) (not illustrated) included in the driver circuit region DRV formed over the substrate BS1.

In particular, the conductor CNT1A included in the pixel region ARA[a,b] is electrically connected to the driver circuit SD included in the local driver circuit LD[a,b], and the conductor CNT1A included in the pixel region ARA[a+1,b] is electrically connected to the driver circuit SD included in the local driver circuit LD[a+1,b].

The conductor ER[1] to the conductor ER[p] each function as, for example, a wiring electrically connected to a pixel circuit included in the pixel region ARA[a,b] or the pixel region ARA[a+1,b]. Note that FIG. 11A illustrates only parts of the conductor ER[1] to the conductor ER[p], and does not illustrate structures electrically connected to the pixel circuit.

As illustrated in FIG. 11A and FIG. 11B, the wiring SL[a,b] provided in the pixel region ARA[a,b] and the wiring SL[a+1,b] provided in the pixel region ARA[a+1,b] are separated not by the separation layer DDL but by the semiconductor region SHA. In the structure illustrated in FIG. 11A and FIG. 11B, a conductor functioning as a gate electrode is not provided around the semiconductor region SHA, and thus an electric field is not applied to the semiconductor region SHA. Accordingly, in the display apparatus 10 illustrated in FIG. 11A and FIG. 11B, a channel is not formed in the semiconductor region SHA, whereby the wiring SL[a,b] and the wiring SL[a+1,6] are brought out of conduction.

Figures 12A, 12B:
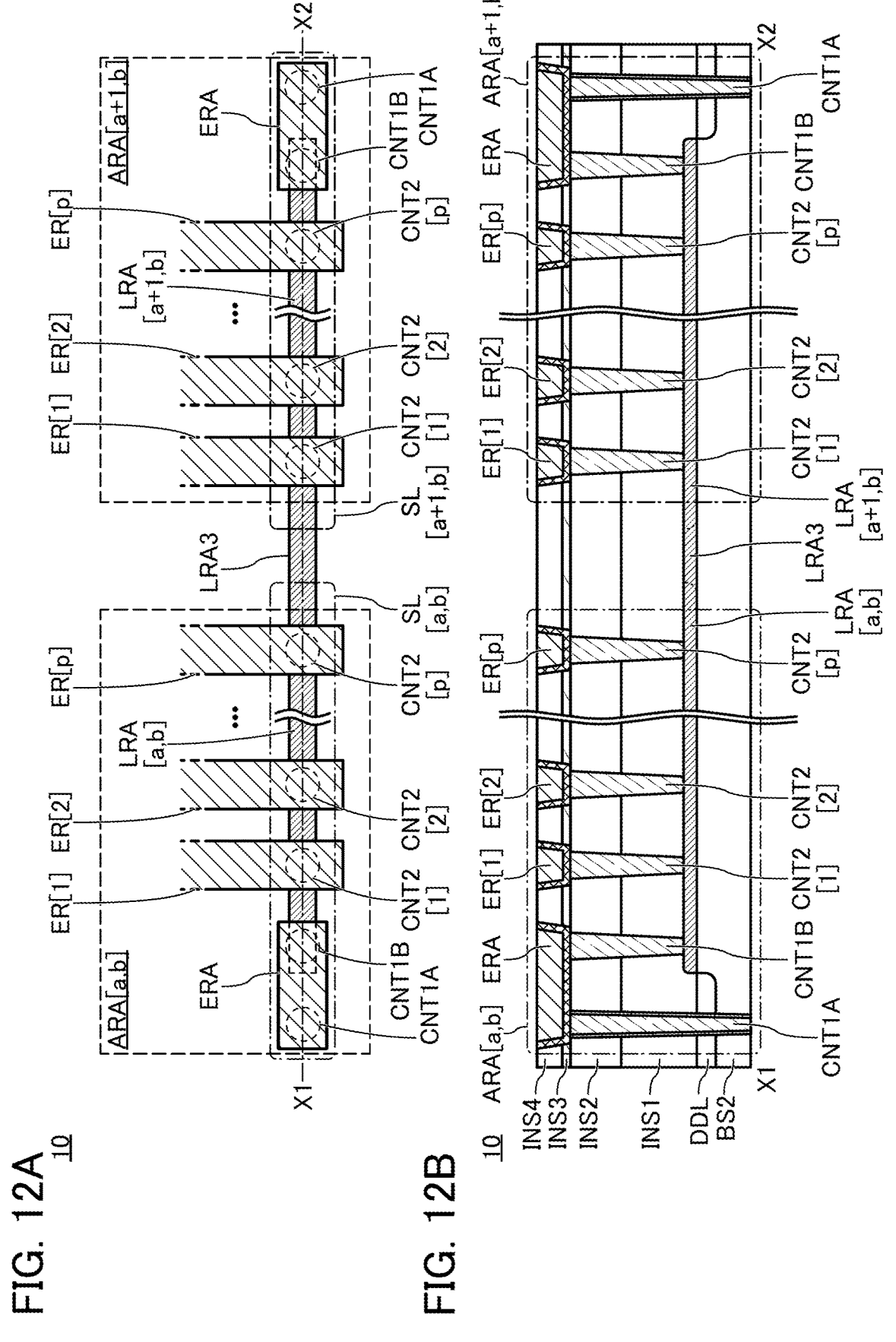
FIG. 12A is a schematic plan view illustrating a structure example of a display apparatus.
FIG. 12B is a schematic cross-sectional view illustrating the structure example of the display apparatus.

In the case where it can be determined that a malfunction occurs in one of the driver circuit SD included in the local driver circuit LD[a,b] and the driver circuit SD included in the local driver circuit LD[a+1,b], which are formed over the substrate BS1, before a circuit over the substrate BS2 is formed or during the circuit is forming, the structure of the circuit over the substrate BS2 is not necessarily the structure illustrated in FIG. 11A and FIG. 11B and can be changed to the structure illustrated in the plan view in FIG. 12A and the cross-sectional view in FIG. 12B, for example.

In the structure in FIG. 12A and FIG. 12B, the insulator MSK in FIG. 11A and FIG. 11B is not provided. In FIG. 12A and FIG. 12B, the insulator MSK is not provided and thus the low-resistance region LRA[a,b], the low-resistance region LRA[a+1,b], and a low-resistance region LRA3 are formed over the substrate BS2 except for over the separation layer DDL. That is, the structure in FIG. 12A and FIG. 12B are different from that in FIG. 11A and FIG. 11B in that the semiconductor region SHA is not provided. For this reason, unlike the structure in FIG. 11A and FIG. 11B, the wiring SL[a,b] and the wiring SL[a+1,b] are brought into conduction in the display apparatus 10 illustrated in FIG. 12A and FIG. 12B. Thus, in the case where a malfunction occurs in one of the driver circuit SD included in the local driver circuit LD[a,b] and the driver circuit SD included in the local driver circuit LD[a+1,b] which are formed over the substrate BS1, the other of the driver circuit SD included in the local driver circuit LD[a,b] and the driver circuit SD included in the local driver circuit LD[a+1,b] can transmit image data to the pixel circuit included in each of the pixel region ARA[a, b] and the pixel region ARA[a+1,b].

Next, a method of manufacturing the display apparatus 10 illustrated in FIG. 11A and FIG. 11B or the display apparatus 10 illustrated in FIG. 12A and FIG. 12B is described.

Figure 13:
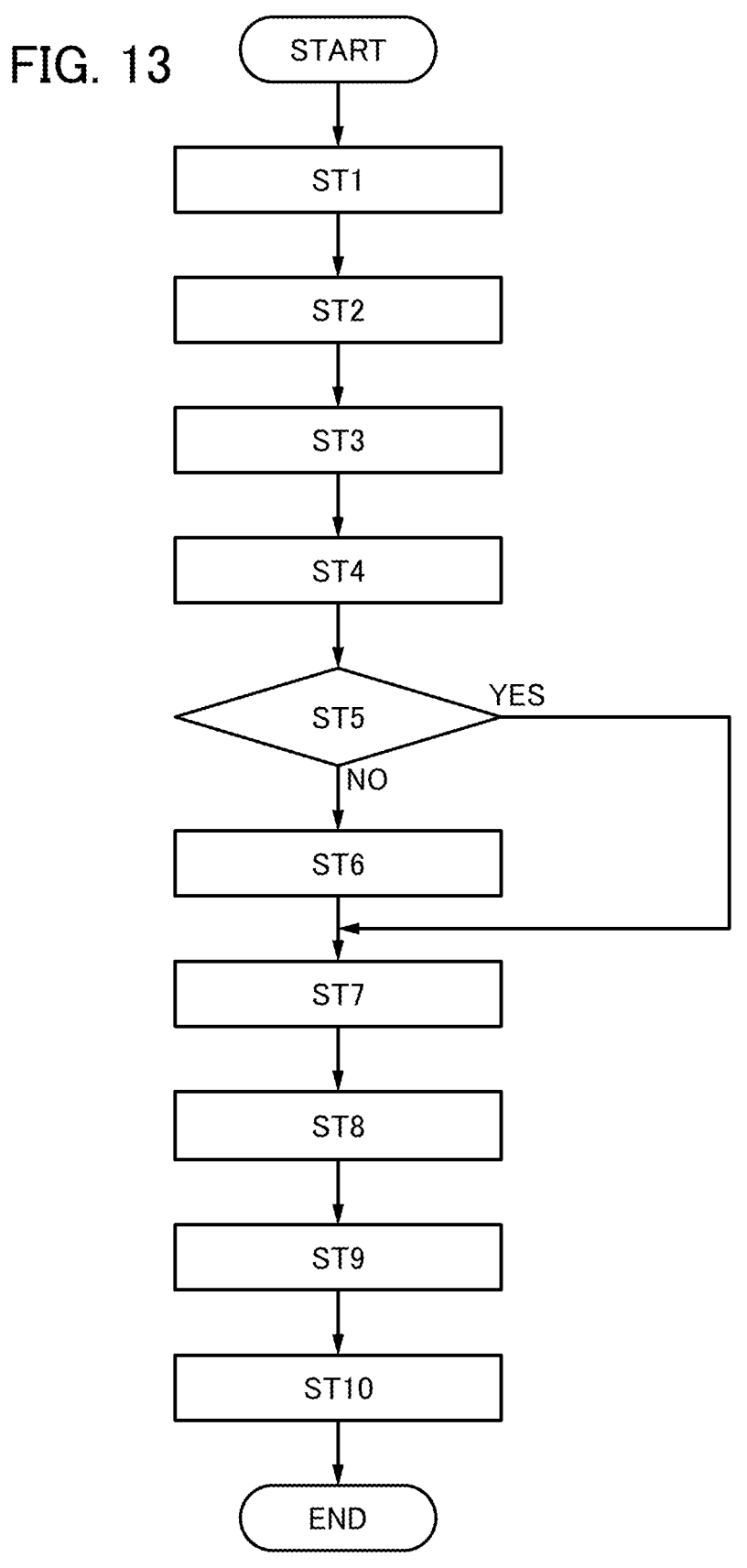

FIG. 13 shows an example of a flow chart of the method of manufacturing the display apparatus 10 illustrated in FIG. 11A and FIG. 11B or the display apparatus 10 illustrated in FIG. 12A and FIG. 12B. The method of manufacturing the display apparatus 10 has a step ST1 to a step ST10.

The step ST1 includes a step of preparing the substrate BS2 and a step of forming the separation layer DDL over the substrate BS2, for example.

As the method of forming the separation layer DDL over the substrate BS2, for example, a LOCOS (Local Oxidation of Silicon) method, an STI (Shallow Trench Isolation) method, or a mesa isolation method can be used.

The step ST2 includes a step of forming a well in a region of the substrate BS2 other than the separation layer DDL, for example.

Specifically, for example, a p-type impurity (e.g., boron or aluminum) or an n-type impurity (e.g., phosphorus or arsenic) is injected from a top surface of the substrate BS2.

Note that depending on circumstances, a well is not necessarily formed in the region of the substrate BS2.

The step ST3 includes a step of forming the insulator MSK in the region of the substrate BS2 other than separation layer DDL.

The insulator MSK can be formed by a photolithography method, for example. Thus, a photosensitive material such as resist can be used as the insulator MSK. Alternatively, a hard mask material may be used as the insulator MSK. For the insulator MSK, silicon oxide, silicon oxynitride, silicon nitride oxide, or silicon nitride may be used, for example.

Note that in this specification and the like, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The step ST4 includes a step of forming the low-resistance region LRA[a,b] and the low-resistance region LRA[a+1,b] in regions of the substrate BS2 other than the region of the separation layer DDL and the region where the insulator MSK is formed, for example.

Specifically, for example, in the case where a p-type well is formed in the substrate BS2, an n-type impurity (e.g., phosphorus or arsenic) is injected from the top surface of the substrate BS2. For another example, in the case where an n-type well is formed in the substrate BS2, a p-type impurity (e.g., boron or aluminum) is injected from the top surface of the substrate BS2.

In that case, since the insulator MSK is formed over the top surface of the substrate BS2, the low-resistance region LRA[a,b] and the low-resistance region LRA[a+1,6] are formed over the top surface of the substrate BS2 other than the regions where the insulator MSK is formed. Meanwhile, in the region of the substrate BS2 where the insulator MSK is formed, the semiconductor region SHA is formed. In this manner, the low-resistance region LRA[a,b] and the low-resistance region LRA[a+1,b] formed over the substrate BS2 have the structure illustrated in FIG. 11A and FIG. 11B.

In the step ST4, a material that can form silicide in a region of the substrate BS2 other than the region of the separation layer DDL and the region where the insulator MSK is formed can be deposited in the region. As the material that can form silicide, for example, nickel, cobalt, molybdenum, tungsten, or titanium can be used.

In the step ST5, whether the driver circuit SD included in each of the local driver circuit LD[a,b] and the local driver circuit LD[a+1,b] included in the substrate BS1 operates as appropriate is determined. Specifically, in the step ST5, in the case where the driver circuit SD included in each of the local driver circuit LD[a,b] and the local driver circuit LD[a+1,b] operates as appropriate, for example, the process may proceed to the step ST7; in the case where the driver circuit SD in one of the local driver circuit LD[a,b] and the local driver circuit LD[a+1,b] does not operate as appropriate, the process may proceed to the step ST6.

The step ST6 includes, for example, a step of removing the insulator MSK followed by a step of forming the low-resistance region LRA3 in the semiconductor region SHA.

Specifically, the insulator MSK is removed and then an impurity is injected from the above of the substrate BS2. For example, in the case where a p-type well is formed in the substrate BS2, an n-type impurity (e.g., phosphorus or arsenic) is injected from the top surface of the substrate BS2. For another example, in the case where an n-type well is formed in the substrate BS2, a p-type impurity (e.g., boron or aluminum) is injected from the top surface of the substrate BS2. In this manner, the low-resistance region LRA[a,b], the low-resistance region LRA[a+1,b], and the low-resistance region LRA3 which are formed in the substrate BS2 have the structure illustrated in FIG. 12A and FIG. 12B.

In the step ST6, a material that can form silicide in the region over the substrate BS2 where the insulator MSK is formed may be deposited in the region. For the material that can form silicide, the description of the step ST4 can be referred to.

The step ST7 include a step of forming an insulator above the substrate BS2, for example.

The insulator can be the insulator INS1 and the insulator INS2 in FIG. 11B and FIG. 12B, for example.

Note that FIG. 11B and FIG. 12B each illustrate a two-layer structure of the insulator INS1 and the insulator INS2, but the insulator formed in the step ST7 may have a single-layer structure or a structure of three or more layers.

For each of the insulator INS1 and the insulator INS2, for example, silicon oxide, silicon oxynitride, silicon nitride oxide, silicon nitride, aluminum oxide, aluminum oxynitride, aluminum nitride oxide, or aluminum nitride can be used.

Note that in this specification, aluminum oxynitride refers to a material that contains more oxygen than nitrogen in its composition, and aluminum nitride oxide refers to a material that contains more nitrogen than oxygen in its composition.

A step ST8 includes a step of providing an opening in the insulator formed in the step ST7 and a step of forming a conductor in the opening, for example.

The conductor corresponds to the conductor CNT1A, the conductor CNT1B, and the conductor CNT2[1] to the conductor CNT2[p] in FIG. 11A, FIG. 11B, FIG. 12A, and FIG. 12B, for example.

As the conductor CNT1B, the conductor CNT2[1] to the conductor CNT2[p], and the conductor CNT1A, for example, a single layer or a stacked layer of a conductive material, such as a metal material, an alloy material, a metal nitride material, or a metal oxide material, can be used. Specifically, for the conductor CNT1B, the conductor CNT2[1] to the conductor CNT2[p], and the conductor CNT1A, it is preferable to use a high-melting-point material that has both heat resistance and conductivity, such as tungsten or molybdenum, and it is particularly preferable to use tungsten. Alternatively, specifically, the conductor CNT1B, the conductor CNT2[1] to the conductor CNT2[p], and the conductor CNT1A are preferably formed with a low-resistance conductive material, such as aluminum or copper. The use of a low-resistance conductive material can reduce wiring resistance.

Note that an insulator for insulating the substrate BS2 and the conductor CNT1A is preferably provided on a side surface of the opening in which the conductor CNT1A is formed. Accordingly, the step ST8 may include a step of forming an insulator on the side surface of the opening. For the insulator, for example, silicon oxide, silicon oxynitride, silicon nitride oxide, silicon nitride, aluminum oxide, aluminum oxynitride, aluminum nitride oxide, or aluminum nitride can be used.

A step ST9 includes a step of forming a new insulator above the insulator formed in the step ST7 and the conductor formed in the step ST8.

The insulator formed in the step ST9 can be, for example, the insulator INS3 and the insulator INS4 in FIG. 11B and FIG. 12B.

Note that FIG. 11B and FIG. 12B each illustrate a two-layer structure of the insulator INS1 and the insulator INS2, but the insulator formed in the step ST9 may have a single-layer structure or a structure of three or more layers.

As the insulator INS3, it is preferable to use a barrier insulating film that prevents impurities such as water and hydrogen from diffusing into a region above the insulator INS3 (e.g., a transistor included in a pixel circuit or the like or a region provided with a light-emitting device) from a substrate 310 or a transistor 300, for example. Accordingly, for the insulator INS3, it is preferable to use an insulating material that has a function of inhibiting diffusion of impurities such as a hydrogen atom, a hydrogen molecule, and a water molecule (through which the above-described impurities are less likely to pass). Furthermore, depending on the situation, for the insulator INS3, it is preferable to use an insulating material having a function of inhibiting diffusion of impurities such as a nitrogen atom, a nitrogen molecule, a nitrogen oxide molecule (e.g., $N_2O$, NO, and $NO_2$), and a copper atom (through which the above-described oxygen is less likely to pass). Alternatively, it is preferable that the INS3 have a function of inhibiting diffusion of oxygen (e.g., one or both of an oxygen atom and an oxygen molecule). Specifically, silicon nitride can be used for the insulator INS3, for example.

For the insulator INS4, a material applicable to the insulator INS1 or the insulator INS2 can be used, for example.

A step ST10 includes a step of providing an opening in the insulator formed in the step ST9 and a step of forming a conductor in the opening, for example.

The conductor corresponds to the conductor ERA and the conductor ER[1] to the conductor ER[p] in FIG. 11A, FIG. 11B, FIG. 12A, and FIG. 12B, for example.

For the conductor ERA and the conductor ER[1] to the conductor ER[p], a material applicable to the conductor CNT1B, the conductor CNT2[1] to the conductor CNT2[p], and the conductor CNT1A can be used, for example. The conductor ERA and the conductor ER[1] to the conductor ER[p] can have a single layer structure or a stacked-layer structure including one or more selected from conductive materials such as a metal material, an alloy material, a metal nitride material, and a metal oxide material.

By the manufacturing method in accordance with the above flow chart, the display apparatus 10 illustrated in FIG. 11A and FIG. 11B or the display apparatus 10 illustrated in FIG. 12A and FIG. 12B can be manufactured.

Note that the method of operating the display apparatus of one embodiment of the present invention is not limited to the operation method example shown in the flow chart of FIG. 13. The method of operating the display apparatus of one embodiment of the present invention may be changed as appropriate as long as an object of one embodiment of the present invention is achieved.

Figure 14:
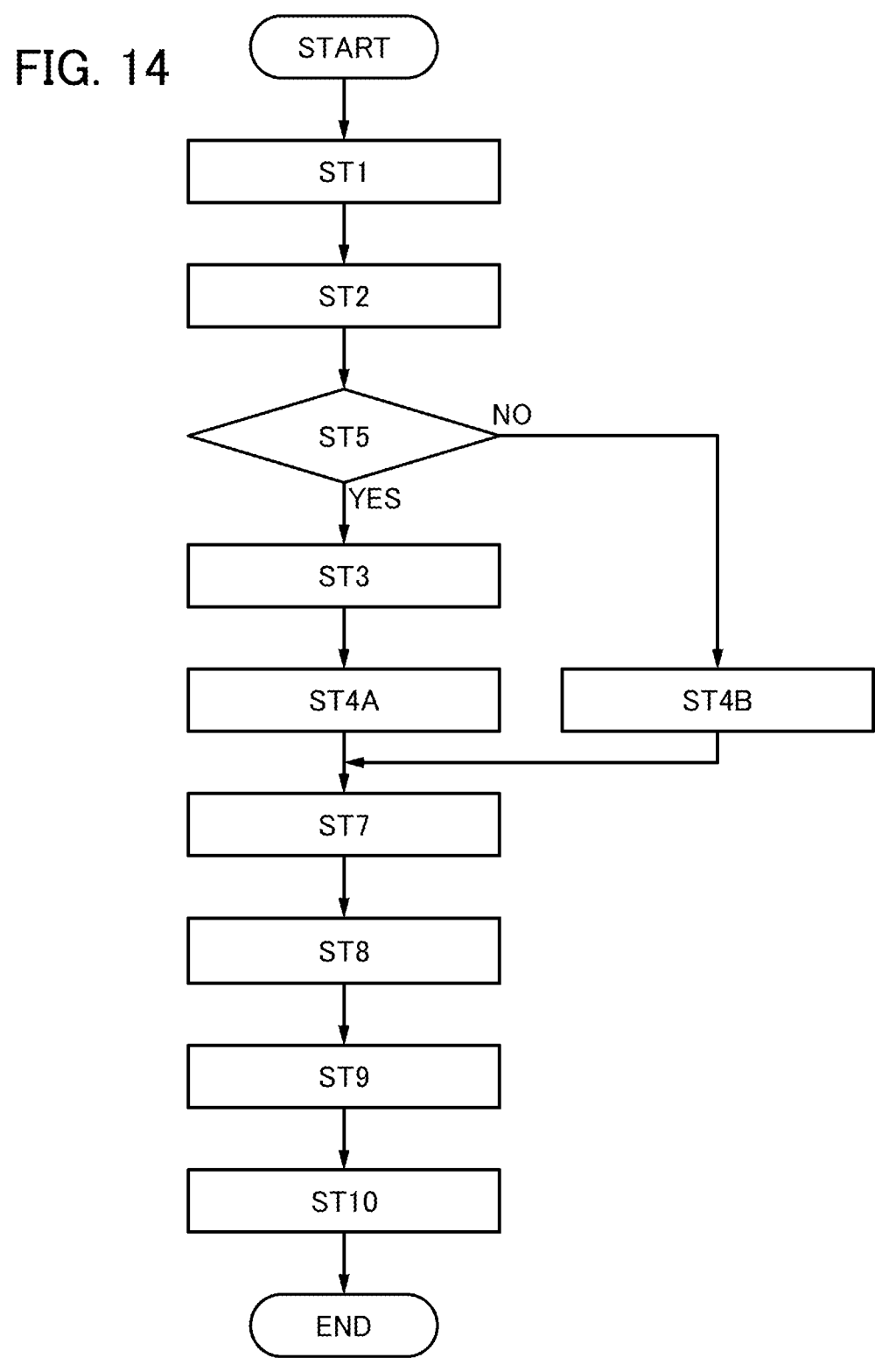

For example, the flow chart of FIG. 13 may be changed to a flow chart shown in FIG. 14. An operation example in the flow chart of FIG. 14 is different from the flow chart of FIG. 13 in that the operation in the step ST5 is performed after the step ST2 and the step ST6 is not included.

In the operation example in the flow chart of FIG. 14, the step ST5 is performed after the step ST2. In other words, after a well is formed in a region over the substrate BS2, whether the driver circuit SD included in each of the local driver circuit LD[a,b] and the local driver circuit LD[a+1,b] formed over the substrate BS1 operates as appropriate is determined. In the operation in the flow chart of FIG. 14, in the step ST5, in the case where the driver circuit SD included in each of the local driver circuit LD[a,b] and the local driver circuit LD[a+1,b] operates as appropriate, for example, the process may proceed to the step ST3; in the case where the driver circuit SD in one of the local driver circuit LD[a,b] and the local driver circuit LD[a+1,b] does not operate as appropriate, the process may proceed to a step ST4B.

In the operation method in the flow chart of FIG. 14, in the case where the driver circuits SD included in the local driver circuit LD[a,b] and the local driver circuit LD[a+1,b] operate as appropriate, the step ST4A is performed after the step ST3 is performed, and the step ST7 is performed after the step ST4A is performed. Specifically, a well is formed in the region over the substrate BS2, and then the insulator MSK is formed in a region of the substrate BS2 other than the separation layer DDL, and after that, the step ST4A is performed. In the step ST4A, as in the step 4 in the flow chart of FIG. 13, the step ST4A includes a step of forming the low-resistance region LRA[a,b] and the low-resistance region LRA[a+1,b] in regions of the substrate BS2 other than the region of the separation layer DDL and the region where the insulator MSK is formed, for example. In the step ST4A, silicide may be formed in the region over the substrate BS2. After the step ST4A, an insulator (the insulator INS1 and the insulator INS2 in FIG. 11B and FIG. 12B) are formed above the substrate BS2 in the step ST7.

In the operation method in the flow chart of FIG. 14, in the case where the driver circuits SD included in the local driver circuit LD[a,b] and the local driver circuit LD[a+1,b] do not operate as appropriate, the step ST4B is performed and the step ST7 is performed after the step ST4B is performed. The step ST4B includes a step of forming the low-resistance region LRA[a,b], the low-resistance region LRA[a+1,b], and the low-resistance region LRA3 in regions of the substrate BS2 other than the region of the separation layer DDL. Note that in that case, the step ST3 in FIG. 14 is not performed, and thus the semiconductor region SHA is not formed between the low-resistance region LRA[a,b] and the low-resistance region LRA[a+1,b]. In the step ST4B, silicide may be formed in the region over the substrate BS2. After the step ST4B, an insulator (the insulator INS1 and the insulator INS2 in FIG. 11B and FIG. 12B) are formed above the substrate BS2 in the step ST7.

For the step ST8 to the step ST10 in the flow chart of FIG. 14, the description of the step ST8 to the step ST10 in the flow chart of FIG. 13 is referred to.

By the manufacturing method in accordance with the flow chart of FIG. 14, the display apparatus 10 illustrated in FIG. 11A and FIG. 11B or the display apparatus 10 illustrated in FIG. 12A and FIG. 12B can be manufactured.

The display apparatus manufactured in accordance with the flow chart is not limited to the display apparatus 10 illustrated in FIG. 11A and the FIG. 11B and the display apparatus 10 illustrated in FIG. 12A and FIG. 12B.

Figures 15A, 15B:
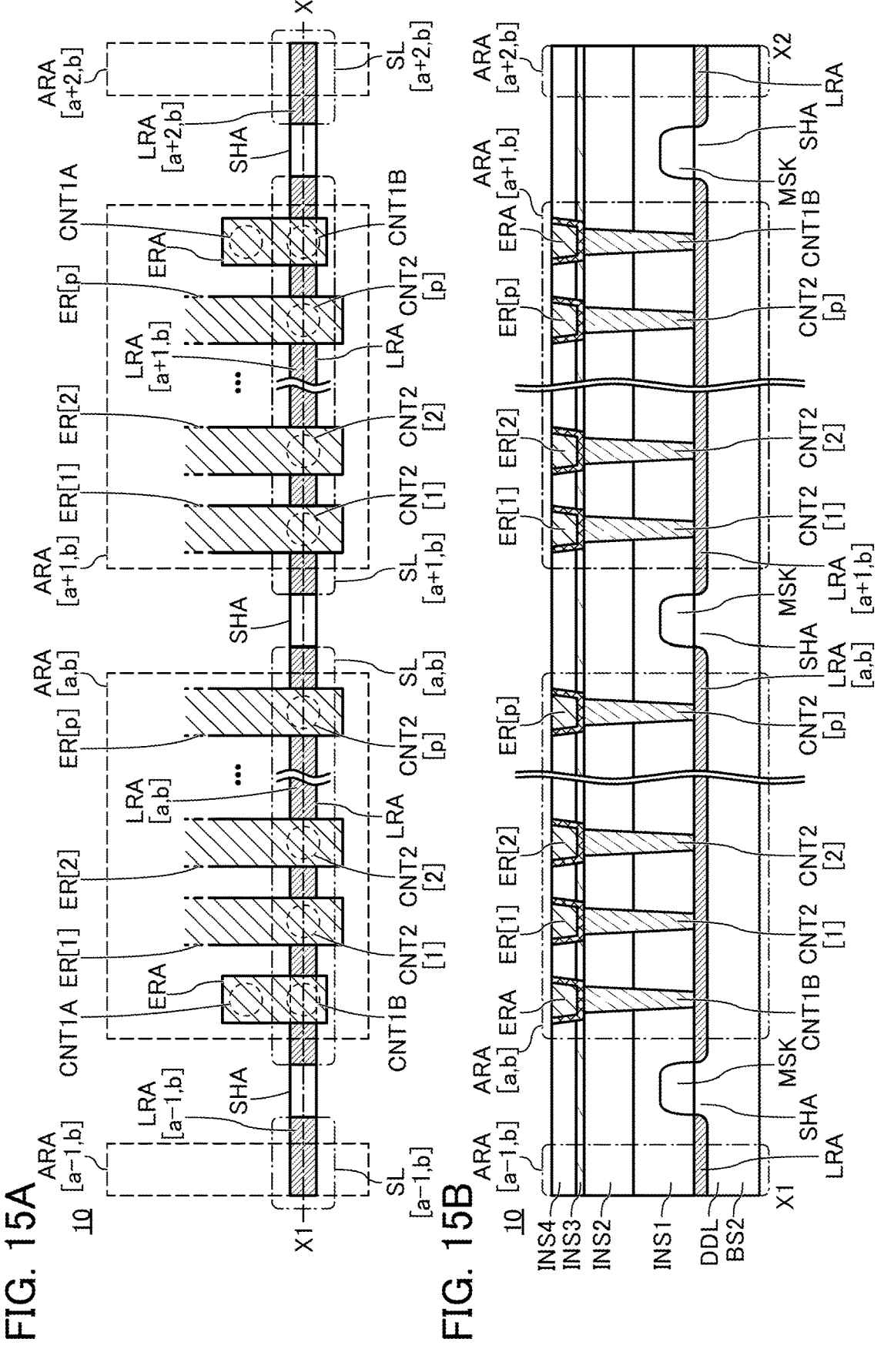
FIG. 15A is a schematic plan view illustrating a structure example of a display apparatus.
FIG. 15B is a schematic cross-sectional view illustrating the structure example of the display apparatus.

For example, the display apparatus manufactured in accordance with the above flow chart can have a structure of the display apparatus 10 illustrated in FIG. 15A and FIG. 15B. The display apparatus 10 in FIG. 15A and FIG. 15B corresponds to the structure formed in the case where the process proceeds from the step ST5 to the step ST7 in FIG. 13; the pixel region ARA[a−1,b] (here, a is an integer greater than or equal to 2 and less than or equal to m−2), the pixel region ARA[a,b], the pixel region ARA[a+1,b], and the pixel region ARA[a+2,b] are illustrated in the display apparatus 10 in FIG. 15A and FIG. 15B as an example. Each pixel region ARA includes the wiring SL[a−1,6], the wiring SL[a,b], the wiring SL[a+1,b], and the wiring SL[a+2,6]. Since the process proceeds from the step ST5 to the step ST7, the semiconductor region SHA is provided between the wiring SL[a−1,b] and the wiring SL[a,b], between the wiring SL[a,b] and the wiring SL[a+1,b], and between the wiring SL[a+1,b] and a wiring SL[a+2,b].

Note that in the display apparatus 10 in FIG. 15A and FIG. 15B, the conductor CNT1A is provided in a position not over the dashed-dotted line X1-X2 as an example. In FIG. 15A, the conductor CNT1A is electrically connected to the conductor CNT1B through the conductor ERA.

In the case where the driver circuit SD included in the local driver circuit LD that overlaps with any one of the pixel region ARA[a−1,b] (here, a is an integer greater than or equal to 2 and less than or equal to m−2), the pixel region ARA[a,b], the pixel region ARA[a+1,b], and the pixel region ARA[a+2,b] does not operate as appropriate in the display apparatus 10 in FIG. 15A and FIG. 15B, at least one of the plurality of semiconductor regions SHA illustrated in FIG. 15A and FIG. 15B is selected and the selected semiconductor region SHA is changed to the low-resistance region LRA3 in the step ST5 in the flow chart of FIG. 13, whereby image data can be transmitted to a pixel circuit included in the pixel region ARA overlapping with the local driver circuit LD including the driver circuit SD that does not operate as appropriate by the driver circuit SD in another local driver circuit LD.

Note that although FIG. 15A and FIG. 15B illustrate a structure example of the display apparatus 10 in which four pixel regions ARA are consecutively aligned and the semiconductor regions SHA are provided between the adjacent pixel regions ARA, the number of pixel regions ARA consecutively aligned may be three or greater than or equal to five.

Figures 16A, 16B:
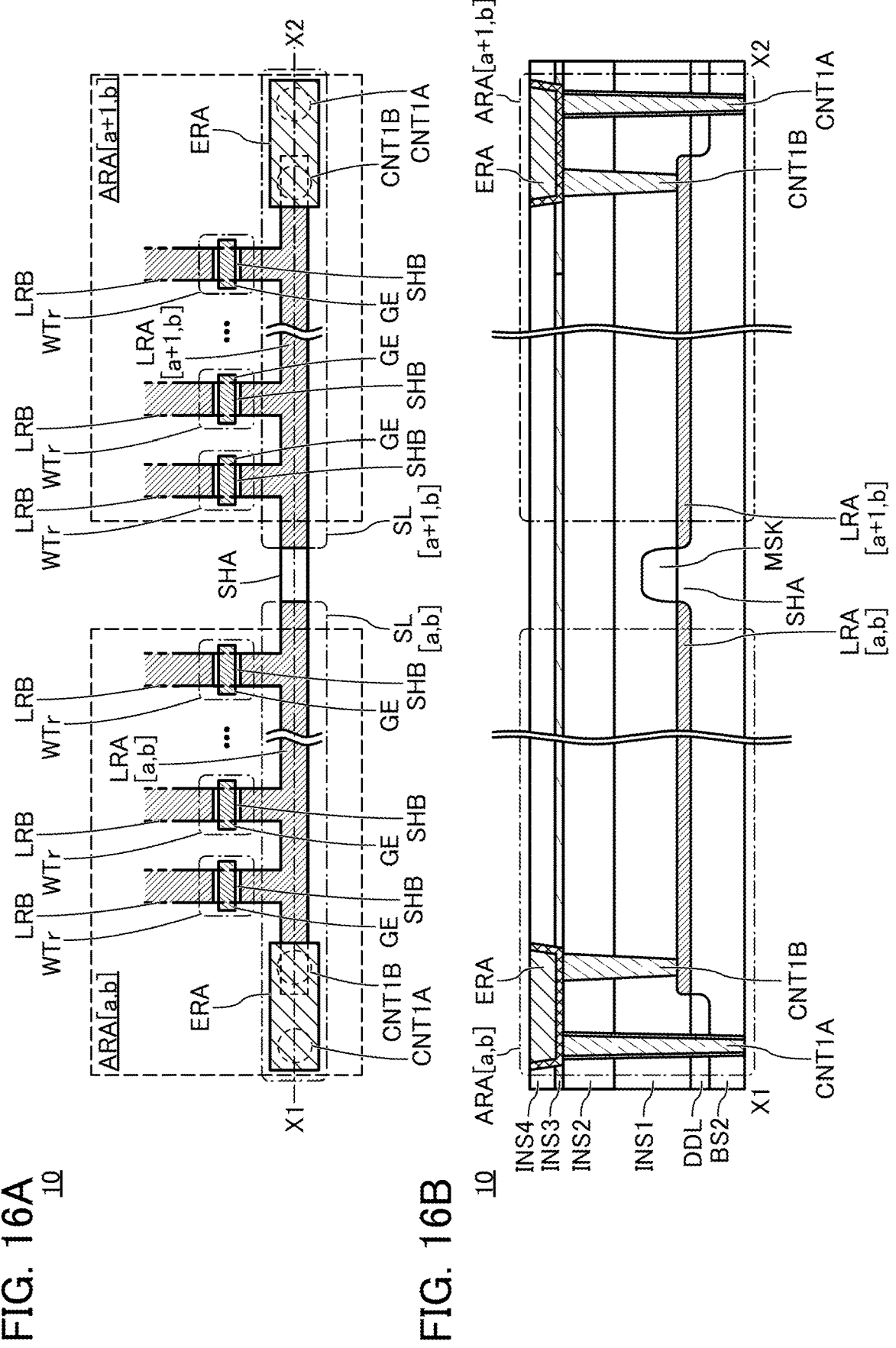
FIG. 16A is a schematic plan view illustrating a structure example of a display apparatus.
FIG. 16B is a schematic cross-sectional view illustrating the structure example of the display apparatus.

For another example, the display apparatus manufactured in accordance with the above flow chart can have a structure of the display apparatus 10 illustrated in FIG. 16A and FIG. 16B. The display apparatus 10 in FIG. 16A and FIG. 16B corresponds to the structure formed in the case where the process proceeds from the step ST5 to the step ST7 in FIG. 13, as an example; part of the wiring SL[a,b] functions as one of a source and a drain of a writing transistor WTr in each of a plurality of pixel circuits included in the pixel region ARA[a,b], and part of the wiring SL[a+1,b] functions as the one of the source and the drain of the writing transistor WTr in each of a plurality of pixel circuits included in the pixel region ARA[a+1,b]. In that case, a low-resistance region LRB, a semiconductor region SHB, and a conductor GE are formed above the substrate BS2, as an example.

In FIG. 16A, the low-resistance region LRB formed over the substrate BS2 functions as the other of the source and the drain of the writing transistor WTr included in each of the pixel region ARA[a,b] and the pixel region ARA[a+1,b].

The semiconductor region SHB formed over the substrate BS2 functions as a channel formation region of the writing transistor WTr included in each of the pixel region ARA[a,b] and the pixel region ARA[a+1,b]. The conductor GE overlapping with the semiconductor region SHB functions as a gate of the writing transistor WTr.

In the display apparatus 10 illustrated in FIG. 16A and FIG. 16B, since part of the low-resistance region LRA[a,b] (the low-resistance region LRA[a+1,b]) included in the wiring SL[a,b] (the wiring SL[a+1,b]) functions as the one of the source and the drain of the writing transistor WTr in the pixel circuit, the area of the pixel circuit can be smaller than that of the pixel circuit in each of the display apparatuses 10 in FIG. 11A, FIG. 11B, FIG. 12A, and FIG. 12B in some cases. Thus, the resolution of the display apparatus 10 in FIG. 16A and FIG. 16B can be higher than that of each of the display apparatuses 10 in FIG. 11A, FIG. 11B, FIG. 12A, and FIG. 12B in some cases.

Note that in this specification and the like, the manufacturing methods shown in the flow charts are classified according to processes and shown as independent steps. However, in actual processing or the like, it is difficult to separate the manufacturing methods shown in the flow charts on the process basis, and there are a case where a plurality of steps are associated with one step and a case where one step is associated with a plurality of steps. Thus, the manufacturing methods shown in the flow charts are not limited to the steps described in the specification, and the order of steps can be changed, another step can be added, or the step can be deleted depending on the circumstances.

Note that one embodiment of the present invention may have a structure formed by combining the structure examples of the plurality of display apparatuses described in this embodiment as appropriate.

Note that the method of manufacturing a display apparatus in which when it is determined that some of the driver circuits SD included in all of the local driver circuits LD do not operate as appropriate in the process of manufacturing the display apparatus, image data can be transmitted to the pixel circuit PX included in the pixel region ARA overlapping with the local driver circuit LD including the driver circuit SD that does not operate as appropriate by another local driver circuit LD is described in this embodiment; this applies not only to the case of the driver circuit SD but also the case of the driver circuit GD, i.e., by referring to the above method of manufacturing a display apparatus, when it is determined that some of the driver circuits GD included in all of the local driver circuits LD do not operate as appropriate, a selection signal can be transmitted to the pixel circuit PX included in the pixel region ARA overlapping with the local driver circuit LD including the driver circuit GD that does not operate as appropriate by another local driver circuit LD. In such a case, for example, the driver circuit SD is replaced with the driver circuit GD, the wiring SL is replaced with the wiring GL, and the image data is replaced with the selection signal in the above manufacturing method.

Note that although the substrate BS2 is described as a semiconductor substrate in this embodiment, the method of manufacturing a display apparatus of one embodiment of the present invention is not limited to the above description. By the method of manufacturing a display apparatus of one embodiment of the present invention, for example, the display apparatus with a structure without including the substrate BS2, i.e., the structure of the display apparatus illustrated in FIG. 2B, can be manufactured in a manner similar to the above description. In that case, for example, the low-resistance region LRA[a,b] in part of the wiring SL[a,b], the low-resistance region LRA[a+1,b] in part of the wiring SL[a+1], and the semiconductor region SHA, which are illustrated in FIG. 11A and FIG. 11B, contain metal oxide. As the metal oxide, for example, a metal oxide such as In-M-Zn oxide containing indium, the element M, and zinc (the element Mis one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) can be used. Other than the above, In—Ga oxide, In—Zn oxide, or indium oxide may be used as the metal oxide. In particular, like a region 530*ba* and a region 530*bb* which are described in Embodiment 3, the metal oxide provided in each of the low-resistance region LRA[a,b] and the low-resistance region LRA[a+1,b] preferably has a high carrier concentration (is preferably n-type), and metal oxide provided in the semiconductor region SHA preferably has a low carrier concentration (is preferably i-type or substantially i-type).

Since the metal oxide can be formed by, for example, a sputtering method, the structure similar to that of the display apparatus 10 can be formed without using the substrate BS2 that is a semiconductor substrate. Accordingly, when metal oxide with a high carrier concentration is used for each of part of the wiring SL[a,b] and part of the wiring SL[a+1,b] and metal oxide with a low carrier concentration is used between the wiring SL[a,b] and the wiring SL[a+1,b], a display apparatus with a driver circuit having redundancy like the above display apparatus 10 can be manufactured with the structure of FIG. 2B.

Although this embodiment describes the structure in which the wiring SL[a,b] includes the low-resistance region LRA[a,b] and the wiring SL[a+1,b] includes the low-resistance region LRA[a+1,b], the method of manufacturing a display apparatus of one embodiment of the present invention is not limited to the above description. In the method of manufacturing a display apparatus of one embodiment of the present invention, for example, the semiconductors included in the low-resistance region LRA[a,b] and the low-resistance region LRA[a+1,b] can be changed to conductors. In that case, for example, not over the substrate BS2 but over the insulator, a conductor is formed as one wiring to be the wiring SL[a, b] and the wiring SL[a+1,b]. In the case where two driver circuits both operate as appropriate, for example, the wiring is divided into the wiring SL[a,b] and the wiring SL[a+1,b] with use of a laser processing machine. Not a laser processing machine but a photolithography method may be used for dividing the wiring into the wiring SL[a,b] and the wiring SL[a+1,b]. A display apparatus with a driver circuit having redundancy can be manufactured also by the above manufacturing method.

When a display apparatus is manufactured by the above-described method of manufacturing a display apparatus, a driver circuit included in the display apparatus can have redundancy. Even in the case where one of the two driver circuits does not operate due to a malfunction or the like, the display apparatus can operate as appropriate by using the other of the two driver circuits; therefore, the yield of the display apparatus can be increased.

Note that this embodiment can be combined with any of the other embodiments described in this specification as appropriate.

Embodiment 3

In this embodiment, a structure example of a display apparatus of one embodiment of the present invention will be described.

<Structure Example of Display Apparatus>

Figure 17:
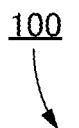
FIG. 17 is a schematic cross-sectional view illustrating a structure example of a display apparatus.

FIG. 17 is a cross-sectional view illustrating an example of a display apparatus of one embodiment of the present invention. A display apparatus 100 illustrated in FIG. 17 includes a pixel circuit and a driver circuit over the substrate 310, for example.

Specifically, the display apparatus 100 includes, for example, the circuit layer SICL, the wiring layer LINL, and the pixel layer PXAL. For example, the circuit layer SICL includes the substrate 310, and the transistor 300 is formed over the substrate 310. The wiring layer LINL is provided above the transistor 300, and the wiring layer LINL includes a wiring that electrically connects the transistor 300, a transistor 200 to be described later, a light-emitting device 150*a* and a light-emitting device 150*b* to be described later. The pixel layer PXAL is provided above the wiring layer LINL, and the pixel layer PXAL includes, for example, the transistor 200, a light-emitting device 150 (the light-emitting device 150*a* and the light-emitting device 150*b* in FIG. 17), and the like.

As the substrate 310, a single crystal substrate (e.g., a semiconductor substrate containing silicon or germanium as a material) can be used, for example. Besides the single crystal substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper containing a fibrous material, or a base material film can be used as the substrate 310. Note that examples of the glass substrate include barium borosilicate glass, aluminoborosilicate glass, and soda lime glass. As examples of the flexible substrate, the attachment film, and the base material film, the following is given. Examples include plastics typified by polyethylene terephthalate (PET), polyethylene naphthalate (PEN), polyether sulfone (PES), and polytetrafluoroethylene (PTFE). Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the manufacturing process of the display apparatus 100 includes heat treatment, a highly heat-resistant material is preferably selected for the substrate 310.

Note that in the description of this embodiment, the substrate 310 is a semiconductor substrate containing silicon as a material.

The transistor 300 is provided on the substrate 310 and includes an element isolation layer 312, a conductor 316, an insulator 315, an insulator 317, the semiconductor region 313 that is part of the substrate 310, and the low-resistance region 314*a* and a low-resistance regions 314*b* that function as source and drain regions. Accordingly, the transistor 300 is a transistor (Si transistor) whose channel formation region contains silicon. Although FIG. 17 illustrates a structure in which one of the source and the drain of the transistor 300 is electrically connected to a conductor 330, a conductor 356, and a conductor 366, which are described later, through a conductor 328 described later, the electrical connection in the semiconductor device of one embodiment of the present invention is not limited thereto. In the semiconductor device of one embodiment of the present invention, for example, a gate of the transistor 300 may be electrically connected to the conductor 330, the conductor 356, and the conductor 366 through the conductor 328.

The transistor 300 can be a fin type when, for example, the top surface of the semiconductor region 313 and the side surface thereof in the channel width direction are covered with the conductor 316 with the insulator 315 as a gate insulating film therebetween. The effective channel width is increased in the fin-type transistor 300, whereby the on-state characteristics of the transistor 300 can be improved. In addition, contribution of the electric field of the gate electrode can be increased, so that the off-state characteristics of the transistor 300 can be improved.

Note that the transistor 300 may be either a p-channel transistor or an n-channel transistor. Alternatively, a plurality of transistors 300 may be provided and both the p-channel transistor and the n-channel transistor may be used.

A region of the semiconductor region 313 where a channel is formed, a region in the vicinity thereof, and the low-resistance region 314a and the low-resistance region 314b functioning as a source region and a drain region preferably contain a silicon-based semiconductor, specifically, preferably contain single crystal silicon. Alternatively, each of the regions may be formed with a material including germanium (Ge), silicon germanium (SiGe), gallium arsenide (GaAs), aluminum gallium arsenide (GaAlAs), or gallium nitride (GaN). A structure using silicon whose effective mass is controlled by applying stress to the crystal lattice and changing the lattice spacing may be employed. Alternatively, the transistor 300 may be an HEMT (High Electron Mobility Transistor) including gallium arsenide and aluminum gallium arsenide.

For the conductor 316 functioning as a gate electrode, a semiconductor material such as silicon containing an element that imparts n-type conductivity, such as arsenic or phosphorus, or an element that imparts p-type conductivity, such as boron can be used. Alternatively, for the conductor 316, a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use one or both materials of titanium nitride and tantalum nitride for the conductor. Moreover, in order to ensure both conductivity and embeddability, it is preferable to use stacked layers of one or both metal materials of tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, or a mesa isolation method.

Note that the transistor 300 illustrated in FIG. 17 is an example and the structure is not limited thereto; an appropriate transistor is used in accordance with a circuit configuration, and a driving method. For example, the transistor 300 may have a planar structure instead of a fin-type structure.

Over the transistor 300 illustrated in FIG. 17, an insulator 320, an insulator 322, an insulator 324, and an insulator 326 are sequentially stacked from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

The insulator 322 may have a function of a planarization film for eliminating a level difference caused by the transistor 300 or the like covered with the insulator 320 and the insulator 322. For example, the top surface of the insulator 322 may be planarized by planarization treatment using a chemical mechanical polishing (CMP) method to improve planarity.

For the insulator 324, it is preferable to use a barrier insulating film preventing diffusion of impurities such as water and hydrogen from the substrate 310, the transistor 300, or the like to a region above the insulator 324 (e.g., the region where the transistor 200, the light-emitting device 150a, the light-emitting device 150b, and the like are provided). Accordingly, for the insulator 324, it is preferable to use an insulating material that has a function of inhibiting diffusion of impurities such as a hydrogen atom, a hydrogen molecule, and a water molecule (through which the above-described impurities are less likely to pass). Furthermore, depending on the situation, for the insulator 324, it is preferable to use an insulating material having a function of inhibiting diffusion of impurities such as a nitrogen atom, a nitrogen molecule, a nitrogen oxide molecule (e.g., $N_2O$, NO, and $NO_2$), and a copper atom (through which the above-described oxygen is less likely to pass). Alternatively, it is preferable that the insulator 324 have a function of inhibiting diffusion of oxygen (e.g., one of an oxygen atom and an oxygen molecule).

For the film having a barrier property against hydrogen, silicon nitride formed by a CVD (Chemical Vapor Deposition) method can be used, for example.

The amount of released hydrogen can be analyzed by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^5$ atoms/cm$^2$ in TDS in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the relative permittivity of the insulator 324. When a material with a low permittivity is used for the interlayer film, the parasitic capacitance generated between wirings can be reduced.

In addition, the conductor 328, and the conductor 330 that are connected to the light-emitting devices and the like provided above the insulator 326 are embedded in the insulator 320, the insulator 322, the insulator 324, and the insulator 326. Note that the conductor 328 and the conductor 330 function as plugs or wirings. A plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 17, an insulator 350, an insulator 352, and an insulator 354 are provided to be stacked in this order above the insulator 326 and the conductor 330. Furthermore, the conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen, oxygen, and water. The insulator 352 and the insulator 354 are preferably formed using an insulator having a comparatively low relative permittivity to reduce parasitic capacitance generated between wirings, like the insulator 326. The insulator 362 and the insulator 364 have functions of an interlayer insulating film and a planarization film. The conductor 356 preferably contains a conductor having a barrier property against impurities such as hydrogen, oxygen, and water.

For the conductor having a barrier property against hydrogen, or tantalum nitride is preferably used, for example. The use of a stack including tantalum nitride and tungsten that has high conductivity can inhibit diffusion of hydrogen from the transistor 300 while the conductivity of a wiring is kept. In that case, a tantalum nitride layer having a barrier property against hydrogen is preferably in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and a conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 370 and an insulator 372 are stacked in this order over the insulator 364 and the conductor 366.

Like the insulator 324 or the like, the insulator 370 is preferably formed using an insulator having a barrier property against impurities such as water and hydrogen. Thus, the insulator 370 can be formed using any of the materials usable for the insulator 324, for example.

The insulator 372 has functions of an interlayer insulating film and a planarization film. Like the insulator 324, the insulator 372 is preferably formed using an insulator having a barrier property against impurities such as water and hydrogen. Thus, the insulator 372 can be formed using any of the materials usable for the insulator 324.

A conductor 376 is provided to fill an opening formed in regions of the insulator 370 and the insulator 372 that overlap with part of the conductor 366. The conductor 376 is also formed over the insulator 372. After that, the conductor 376 is patterned into a form of a wiring, a terminal, or a pad by etching treatment or the like.

For example, copper, aluminum, tin, zinc, tungsten, silver, platinum, or gold can be used for the conductor 376. Note that the conductor 376 preferably contains the same component as the material used for a later-described conductor 216 included in the pixel layer PXAL.

Then, an insulator 380 is formed to cover the insulator 372 and the conductor 376 and is subsequently subjected to planarization treatment by, for example, a chemical mechanical polishing (CMP) method until the conductor 376 is exposed. In this manner, the conductor 376 serving as a wiring, a terminal, or a pad can be formed over the substrate 310.

Like the insulator 324, the insulator 380 is preferably formed using a film with a barrier property inhibiting diffusion of impurities such as water and hydrogen, for example. In other words, the insulator 380 is preferably formed using any of the materials usable for the insulator 324. Like the insulator 326, the insulator 380 may be formed using an insulator having a relatively low dielectric constant to reduce the parasitic capacitance generated between wirings, for example. In other words, the insulator 380 may be formed using any of the materials usable for the insulator 326.

The pixel layer PXAL is provided with a substrate 210, the transistor 200, the light-emitting device 150 (the light-emitting device 150a and the light-emitting device 150b in FIG. 17), and a substrate 102. Moreover, the pixel layer PXAL is provided with an insulator 220, an insulator 222, an insulator 226, an insulator 250, an insulator 252, an insulator 111, an insulator 112, an insulator 113, and a resin layer 161, for example. Furthermore, the pixel layer PXAL is provided with a conductor 216, a conductor 228, a conductor 230, a conductor 256, a conductor 121 (a conductor 121a and a conductor 121b in FIG. 17), and a conductor 122, for example.

An insulator 202 in FIG. 17 functions as a bonding layer together with the insulator 380, for example. The insulator 202 preferably contains, for example, the same component as the material used for the insulator 380.

The substrate 210 is provided above the insulator 202. In other words, the insulator 202 is provided on a bottom surface of the substrate 210. The substrate 210 is preferably a substrate usable for the substrate 310, for example. Note that in the description of the display apparatus 100 shown in FIG. 17, the substrate 310 is a semiconductor substrate containing silicon as a material.

Over the substrate 210, the transistor 200 is formed, for example. Being formed on the substrate 210 that is a semiconductor substrate containing silicon, the transistor 200 functions as a Si transistor. For the structure of the transistor 200, refer to the description of the transistor 300.

Above the transistor 200, the insulator 220 and the insulator 222 are provided. The insulator 220 has functions of an interlayer insulating film and a planarization film, for example, like the insulator 320. The insulator 222 has functions of an interlayer insulating film and a planarization film, for example, like the insulator 322.

A plurality of opening portions are provided in the insulator 220 and the insulator 222. The plurality of opening portions are formed in regions overlapping with a source and a drain of the transistor 200, a region overlapping with the conductor 376, and the like. Of the plurality of opening portions, the opening portions formed in the regions overlapping with the source and the drain of the transistor 200 are each filled with the conductor 228. Of the other opening portions, the opening portion formed in the region overlapping with the conductor 376 has a side surface provided with an insulator 214, and the conductor 216 fills the space inside the insulator 214. The conductor 216 is sometimes particularly referred to as a through silicon via (TSV).

The conductor 216 can be, for example, the conductor CNT1A illustrated in FIG. 11A, FIG. 11B, FIG. 12A, FIG. 12B, FIG. 15A, FIG. 16A, or FIG. 16B. The insulator 214 can be, for example, an insulator formed on a side surface of an opening filled with the conductor CNT1A illustrated in FIG. 11A, FIG. 11B, FIG. 12A, FIG. 12B, FIG. 15A, FIG. 16A, or FIG. 16B.

For one or both of the conductor 216 and the conductor 228, any of the materials usable for the conductor 328 can be used, for example. In particular, the conductor 216 is preferably formed using the same material as the conductor 376.

The insulator 214 has a function of insulating the conductor 216 from the substrate 210, for example. Note that the insulator 214 is preferably formed using, for example, any of the materials usable for the insulator 320, or the insulator 324.

The insulator 380 and the conductor 376 that are formed over the substrate 310 are bonded to the insulator 202 and the conductor 216 that are formed on the substrate 210 by a bonding step, for example.

Before the bonding step, for example, planarization treatment is performed to make surfaces of the insulator 380 and the conductor 376 level with each other on the substrate 310 side. In a similar manner, planarization treatment is performed to make the insulator 202 and the conductor 216 level with each other on the substrate 210 side.

In the bonding step, hydrophilic bonding or the like can be employed for bonding of the insulator 380 and the insulator 202, i.e., bonding of insulating layers; in the hydrophilic bonding, after high planarity is obtained by, for example, polishing, the surfaces of the insulators are subjected to hydrophilicity treatment with oxygen plasma or the like, arranged in contact with and bonded to each other temporarily, and then dehydrated by heat treatment to perform final bonding. The hydrophilic bonding can also cause bonding at an atomic level; thus, bonding with excellent mechanical strength can be obtained.

Surface activated bonding, diffusion bonding, or the like can be employed for bonding of the conductor 376 and the conductor 216, i.e., bonding of conductors. Surface activated bonding is a method in which an oxide film and a layer adsorbing impurities over the surface of each conductor are removed by sputtering treatment or the like and the cleaned and activated surfaces of the conductors are made to be in contact with and bonded to each other. Diffusion bonding is a method in which the surfaces of the conductors are bonded to each other by adjusting temperature and pressure together. Both methods can cause bonding at an atomic level and therefore the bonding with excellent electric and mechanical strength can be achieved.

Through the above-described bonding step, the conductor 376 on the substrate 310 side can be electrically connected to the conductor 216 on the substrate 210 side. In addition, mechanically strong connection can be established between the insulator 380 on the substrate 310 side and the insulator 202 on the substrate 210 side.

The insulating layers and the metal layers are mixed on the bonding surfaces of the substrates 310 and 210; therefore, for example, surface activated bonding and hydrophilic bonding are preferably performed in combination when the substrates 310 and 210 are bonded to each other. For example, the following method can be used: the surfaces of the metal layers are made clean after polishing, the surfaces of the metal layers are subjected to antioxidant treatment and hydrophilicity treatment, and then bonding is performed. Alternatively, hydrophilicity treatment may be performed with the metal layers having surfaces of a hardly oxidizable metal such as gold.

Note that the substrate 310 and the substrate 210 may be bonded by a bonding method different from the above-described methods. For example, the substrate 310 and the substrate 210 may be bonded by flip-chip bonding. In the case of employing flip-chip bonding, a connection terminal such as a bump may be provided above the conductor 376 on the substrate 310 side or provided below the conductor 216 on the substrate 210 side. Flip-chip bonding can be performed by, for example, injecting a resin containing anisotropic conductive particles between the insulator 380 and the insulator 202 and between the conductor 376 and the conductor 216, or by using a Sn—Ag solder. Alternatively, ultrasonic wave bonding can be used in the case where the bump and a conductor connected to the bump are gold. To reduce thermal stress, physical stress such as an impact, or the like, the above-described flip-chip bonding may be combined with injection of an underfill agent between the insulator 380 and the insulator 202 and between the conductor 376 and the conductor 216. Furthermore, a die bonding film may be used in bonding of the substrate 310 and the substrate 210, for example.

An insulator 224 and the insulator 226 are sequentially stacked over the insulator 222, the insulator 214, the conductor 216, and the conductor 228.

Like the insulator 324, the insulator 224 is preferably a barrier insulating film inhibiting diffusion of impurities such as water and hydrogen to the region above the insulator 224. Thus, the insulator 224 is preferably formed using, for example, any of the materials usable for the insulator 324.

Like the insulator 326, the insulator 226 is preferably an interlayer film with a low dielectric constant. Thus, the insulator 226 is preferably formed using, for example, any of the materials usable for the insulator 326.

In the insulator 224 and the insulator 226, the conductor 230 that is electrically connected to the transistor 200, the light-emitting device 150, and the like is embedded. Note that the conductor 230 functions as a plug or a wiring. For the conductor 230, any of the materials usable for the conductor 328 or the conductor 330 can be used, for example.

Over the insulator 224 and the insulator 226, the insulator 250, the insulator 252, and the insulator 111 are sequentially stacked.

Like the insulator 324, the insulator 250 is preferably formed using an insulator having a barrier property against impurities such as water and hydrogen. Thus, the insulator 250 can be formed using any of the materials usable for the insulator 324, for example.

The insulator 352 has functions of an interlayer insulating film and a planarization film. Like the insulator 324, the insulator 352 is preferably formed using an insulator having a barrier property against impurities such as water and hydrogen. Thus, the insulator 352 can be formed using any of the materials usable for the insulator 324.

An insulator having a function of inhibiting diffusion of water, oxygen, and oxygen is preferably used as the insulator 111; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 111. For example, aluminum oxide or magnesium oxide, which has a function of capturing or fixing hydrogen well, is preferably used for the insulator 111.

The insulator 111 is preferably a film with high planarity. In this case, an organic material such as an acrylic resin or a polyimide can be used for the insulator 111, for example.

An opening portion is provided in regions of the insulator 250, the insulator 252, and the insulator 111 that overlap with part of the conductor 230, and a conductor 256 is provided to fill the opening portion. The conductor 256 is also formed over the insulator 352. The conductor 256 has a function of a plug or a wiring connected to the light-emitting device 150, for example. Note that the conductor 256 can be provided using a material similar to those for the conductor 328 and the conductor 330.

The light-emitting device 150a and the light-emitting device 150b are provided above the insulator 111.

Here, the light-emitting device 150a and the light-emitting device 150b are described. A light-emitting device described in one embodiment refers to a self-luminous light-emitting device such as an organic EL element (also referred to as an OLED (Organic Light Emitting Diode)). The light-emitting device electrically connected to the pixel circuit can be a self-luminous light-emitting device such as an LED (Light Emitting Diode), a micro LED, a QLED (Quantum-dot Light Emitting Diode), or a semiconductor laser.

Over the insulator 111 are provided the conductor 121a and the conductor 121b functioning as respective pixel electrodes of the light-emitting device 150a and the light-emitting device 150b. In FIG. 17, a region where none of the conductor 121a and the conductor 121b is provided exists over part of the insulator 111. Note that in this specification and the like, the conductor 121a and the conductor 121b are collectively referred to as the conductor 121 in some cases.

The conductor 121a and the conductor 121b can be formed in such a manner that, for example, a conductive film is formed over the insulator 111 and the conductive film is subjected to a patterning step and an etching step.

The conductor 121a and the conductor 121b, respectively, function as anodes of the light-emitting device 150a and the light-emitting device 150b provided in the display apparatus 100, for example.

Indium tin oxide (sometimes referred to as ITO) or the like can be used for the conductor 121a and the conductor 121b, for example.

Each of the conductor 121a and the conductor 121b may have a stacked-layer structure of two or more layers instead of a single layer. For example, a conductor having high visible-light reflectance can be used for the first-layer conductor and a conductor having a high light-transmitting property can be used for the uppermost-layer conductor. Examples of a conductor having high visible-light reflectance include silver, aluminum, and an alloy film of silver (Ag), palladium (Pd), and copper (Cu) (Ag—Pd—Cu (APC) film). Examples of a conductor having a high light-transmitting property include indium tin oxide described above. The conductor 121a and the conductor 121b can be, for example, a stacked-layer film in which a pair of titanium films sandwich aluminum (a film in which Ti, Al, and Ti are stacked in this order), a stacked-layer film in which a pair of indium tin oxide films sandwich silver (a film in which ITO, Ag, and ITO are stacked in this order), or the like.

The EL layer 141a is provided over part of the insulator 111 and the conductor 121a. The EL layer 141b is provided over part of the insulator 111 and the conductor 121b. In FIG. 17, a region where the EL layer 141a and the EL layer 141b are not provided exists over part of the insulator 111.

The EL layer 141a and the EL layer 141b preferably include light-emitting layers emitting light of different colors. For example, the EL layer 141a includes a light-emitting layer emitting light of any one of red (R), green (G), and blue (B), and the EL layer 141b includes a light-emitting layer emitting light of one of the other two colors. Although not illustrated in FIG. 17, in the case where an EL layer different from the EL layers 141a and 141b is provided, the EL layer can include a light-emitting layer emitting light of the remaining one color. Thus, the display apparatus 100 may have such an SBS structure in which light-emitting layers for respective colors are provided over a plurality of pixel electrodes (e.g., the conductor 121a and the conductor 121b).

Note that the combination of colors of light emitted by the light-emitting layers included in the EL layer 141a and the EL layer 141b is not limited to the above, and a color such as cyan, magenta, or yellow may also be used, for example. The number of colors of light emitted by the light-emitting devices 150 included in the display apparatus 100, which is three in the above example, may be two, three, four or more.

The EL layer 141a and the EL layer 141b may each include one or more of an electron-injection layer, an electron-transport layer, a hole-injection layer, and a hole-transport layer in addition to a layer containing a light-emitting organic compound (light-emitting layer).

Specifically, the EL layer 141a and the EL layer 141b can be formed, for example, by an evaporation method (a vacuum evaporation method or the like), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method).

In the case where a deposition method such as the coating method or the printing method is employed, for example, a high-molecular compound (e.g., an oligomer, a dendrimer, or a polymer), a middle-molecular compound (a compound between a low-molecular compound and a high-molecular compound with a molecular weight of 400 to 4000), or an inorganic compound (e.g., a quantum dot material) can be used. Note that as the quantum dot material, a colloidal quantum dot material, an alloyed quantum dot material, a core-shell quantum dot material, or a core quantum dot material can be used.

Figure 18A:
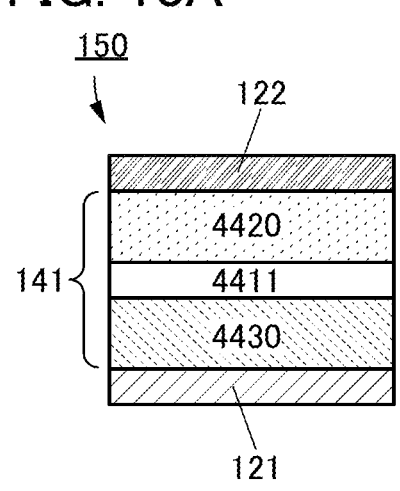
FIG. 18A to FIG. 18D are schematic diagrams illustrating structure examples of a light-emitting device.

Like the light-emitting device 150 illustrated in FIG. 18A, the light-emitting device 150a and the light-emitting device 150b in FIG. 17 can include a plurality of layers such as a layer 4420, a light-emitting layer 4411, and a layer 4430, for example.

The layer 4420 can include, for example, a layer containing a substance with a high electron-injection property (electron-injection layer) and a layer containing a substance with a high electron-transport property (electron-transport layer). The light-emitting layer 4411 contains a light-emitting compound, for example. The layer 4430 can include, for example, a layer containing a substance with a high hole-injection property (hole-injection layer) and a layer containing a substance with a high hole-transport property (hole-transport layer).

The structure including the layer 4420, the light-emitting layer 4411, and the layer 4430, which is provided between a pair of electrodes (the conductor 121 and a later-described conductor 122), can function as a single light-emitting unit, and the structure in FIG. 18A is referred to as a single structure in this specification and the like.

Figure 18B:
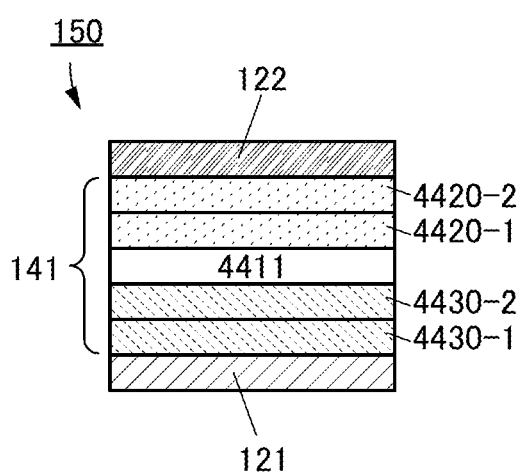

FIG. 18B is a modification example of the EL layer 141 included in the light-emitting device 150 illustrated in FIG. 18A. Specifically, the light-emitting device 150 illustrated in FIG. 18B includes a layer 4430-1 over the conductor 121, a layer 4430-2 over the layer 4430-1, the light-emitting layer 4411 over the layer 4430-2, a layer 4420-1 over the light-emitting layer 4411, a layer 4420-2 over the layer 4420-1, and the conductor 122 over the layer 4420-2. For example, when the conductor 121 functions as an anode and the conductor 122 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the conductor 121 functions as a cathode and the conductor 122 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layered structure, carriers can be efficiently injected to the light-emitting layer 4411, and the efficiency of the recombination of carriers in the light-emitting layer 4411 can be enhanced.

Figure 18C:
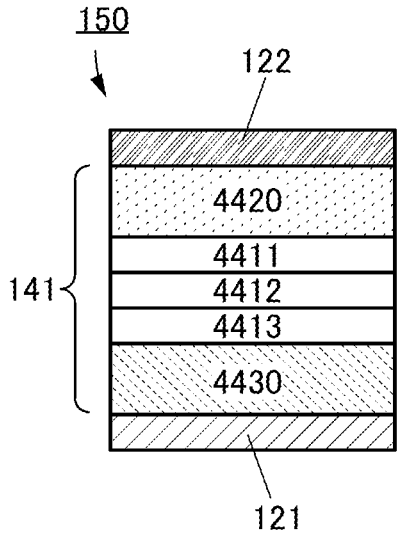

Note that the structure in which a plurality of light-emitting layers (e.g., the light-emitting layer 4411, a light-emitting layer 4412, and a light-emitting layer 4413) are provided between the layer 4420 and the layer 4430 as illustrated in FIG. 18C is also a variation of the single structure.

Figure 18D:
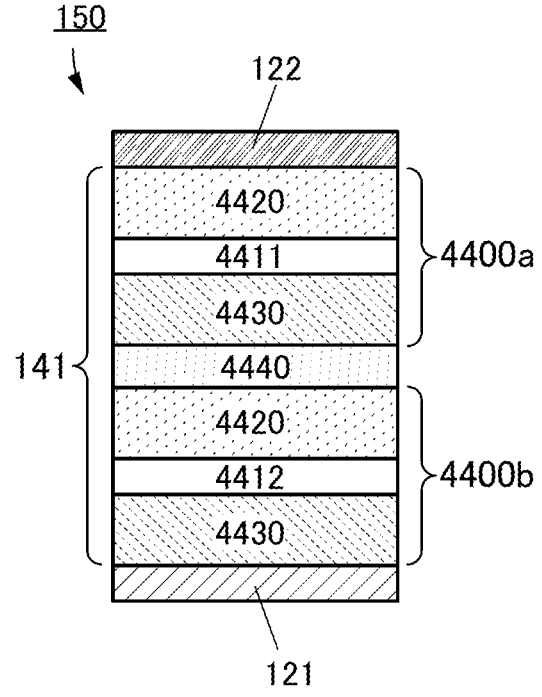

A stack including a plurality of layers such as the layer 4420, the light-emitting layer 4411, and the layer 4430 is sometimes referred to as a light-emitting unit. A plurality of light-emitting units can be connected in series with an intermediate layer (a charge-generation layer) therebetween. Specifically, a light-emitting unit 4400a and a light-emitting unit 4400b, which are the plurality of light-emitting units, can be connected in series with an intermediate layer (charge-generation layer) 4440 therebetween as illustrated in FIG. 18D. Such a structure is referred to as a tandem structure in this specification. A tandem structure may be rephrased as, for example, a stack structure in this specification and the like. The tandem structure enables a light-emitting device capable of high luminance light emission. By having a tandem structure, a light-emitting device presumably has increased emission efficiency and an extended lifetime. In the case where the light-emitting device 150 of the display apparatus 100 in FIG. 17 has a tandem structure, the EL layer 141 can include, for example, the layer 4420, the light-emitting layer 4411, and the layer 4430 that are included in the light-emitting unit 4400a, an intermediate layer 4440, and the layer 4420, the light-emitting layer 4412, and the layer 4430 that are included in the light-emitting unit 4400b.

In displaying white, the aforementioned SBS structure consumes lower power than the aforementioned single structure and tandem structure. To reduce power consumption, the SBS structure is thus preferably used. Meanwhile, the single structure and the tandem structure are preferable in that the manufacturing cost is low or the manufacturing yield is high because the manufacturing processes of the single structure and the tandem structure are simpler than that of the SBS structure.

The emission color of the light-emitting device 150 can be red, green, blue, cyan, magenta, yellow, or white depending on the material that constitutes the EL layer 141. Furthermore, the color purity can be further increased when the light-emitting device 150 has a microcavity structure.

The light-emitting device that emits white light preferably contains two or more kinds of light-emitting substances in the light-emitting layer. To obtain white light emission, two or more kinds of light-emitting substances are selected such that their emission colors are complementary.

The light-emitting layer preferably contains two or more selected from light-emitting substances that emit light of red (R), green (G), blue (B), yellow (Y), and orange (O). Alternatively, the light-emitting layer preferably contains two or more light-emitting substances that emit light containing two or more selected from spectral components of R, G, and B.

As illustrated in FIG. 17, there is a gap between the EL layers of two light-emitting devices of different colors. In this manner, the EL layer 141a and the EL layer 141b are preferably provided so as not to be in contact with one another. This suitably prevents unintentional light emission (also referred to as crosstalk) from being caused by a current flowing through two adjacent EL layers. As a result, the contrast can be increased to achieve a display apparatus with high display quality.

As an example of the formation method of the EL layer 141a and the EL layer 141b, a method with photolithography can be given. For example, the EL layer 141a and the EL layer 141b can be formed in such a manner that an EL film to be the EL layer 141a and the EL layer 141b is formed over the insulator 111 and the conductor 121 and then subjected to patterning by a photolithography method. Alternatively, the EL layer 141a and the EL layer 141b may be formed in such a manner that the conductor 122 is formed over the EL film and both the conductor 122 and the EL film are subjected to patterning by a photolithography method. In this case, the EL layer 141a and the EL layer 141b have the same structure. Accordingly, in order that the display apparatus 100 employing the above formation method can carry out color display, the light-emitting device 150a and the light-emitting device 150b respectively including the EL layer 141a and the EL layer 141b emit white light and the white light is extracted to the outside through coloring layers (color filters).

Alternatively, the EL layer 141a and the EL layer 141b are formed in the following manner: an EL film to be the EL layer 141a is formed over the insulator 111 and the conductor 121 and processed by a photolithography method to form the EL layer 141a. Then, the EL layer 141b is formed in the predetermined region by the same step. The EL layer 141a and the EL layer 141b formed by this method can have different structures, enabling the display apparatus 100 to have the SBS structure.

When the above method is employed, the gap between adjacent pixels can be short. As a result, the number of pixels included in the display portion can be large, increasing the resolution of the display apparatus. The gap between the adjacent pixels is preferably less than or equal to 5 μm, further preferably less than or equal to 1 μm.

The display apparatus 100 in FIG. 17 formed by the above-described method can have a resolution preferably higher than or equal to 1000 ppi, further preferably higher than or equal to 3000 ppi, still further preferably higher than or equal to 5000 ppi.

Other than a photolithography method, a nanoimprint method, or a lift-off method may be employed in the formation of the EL layer 141*a* and the EL layer 141*b*. Alternatively, island-shaped thin films may be directly formed by a deposition method using a shielding mask as a metal mask.

The conductor 122 is provided over the insulator 111, the EL layer 141*a*, and the EL layer 141*b*. An insulator 113 is provided over the conductor 122.

The conductor 122 functions as, for example, a common electrode for each of the light-emitting device 150*a* and the light-emitting device 150*b*. The conductor 122 preferably contains a conductive material having a light-transmitting property so that light emitted by the light-emitting device 150 can be extracted to above the display apparatus 100.

The conductor 122 is preferably a light-transmitting and light-reflective material having high conductivity (sometimes referred to as a transflective electrode). For example, an alloy of silver and magnesium, or indium tin oxide can be used as the conductor 122.

The insulator 113 functions as, for example, a passivation film that protects the light-emitting device 150*a* and the light-emitting device 150*b*. Thus, the insulator 113 is preferably formed using a material that prevents entry of water, for example. Any of the materials that can be used as the insulator 111 can be used as the insulator 113, for example. Specifically, aluminum oxide, silicon nitride, or silicon nitride oxide can be used.

The resin layer 161 is provided over the insulator 113. A substrate 102 is provided over the resin layer 161.

As the substrate 102, a substrate having a light-transmitting property is preferably used, for example. Using a light-transmitting substrate as the substrate 102 enables extraction of light emitted from the light-emitting device 150*a* and the light-emitting device 150*b* to above the substrate 102.

Note that the structure of the display apparatus of one embodiment of the present invention is not limited to the structure of the display apparatus 100 illustrated in FIG. 17. The structure of the display apparatus of one embodiment of the present invention may be changed as appropriate as long as an object of one embodiment of the present invention is achieved.

For example, the transistor 200 included in the pixel layer PXAL in the display apparatus 100 in FIG. 17 may be a transistor including a metal oxide in a channel formation region (hereinafter referred to as an OS transistor). The display apparatus 100 in FIG. 19 is provided with the light-emitting device 150 and a transistor 500 (an OS transistor), instead of the transistor 200 in the display apparatus 100 in FIG. 17, above the circuit layer SICL and the wiring layer LINL.

Figure 19:
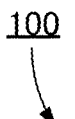
FIG. 19 is a schematic cross-sectional view illustrating a structure example of a display apparatus.

In FIG. 19, the transistor 500 is provided above an insulator 512. The insulator 512 is provided above the insulator 364 and the conductor 366. The insulator 512 is preferably formed with a substance having a barrier property against oxygen and hydrogen. Specifically, the insulator 512 is formed using, for example, silicon oxide, silicon oxynitride, silicon nitride oxide, silicon nitride, aluminum oxide, aluminum oxynitride, aluminum nitride oxide, or aluminum nitride.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

A material similar to that for the insulator 320 can be used for the insulator 512, for example. When a material with a comparatively low permittivity is used for these insulators, parasitic capacitance generated between wirings can be reduced. A silicon oxide film or a silicon oxynitride film can be used as the insulator 512, for example.

Figures 20A, 20B:
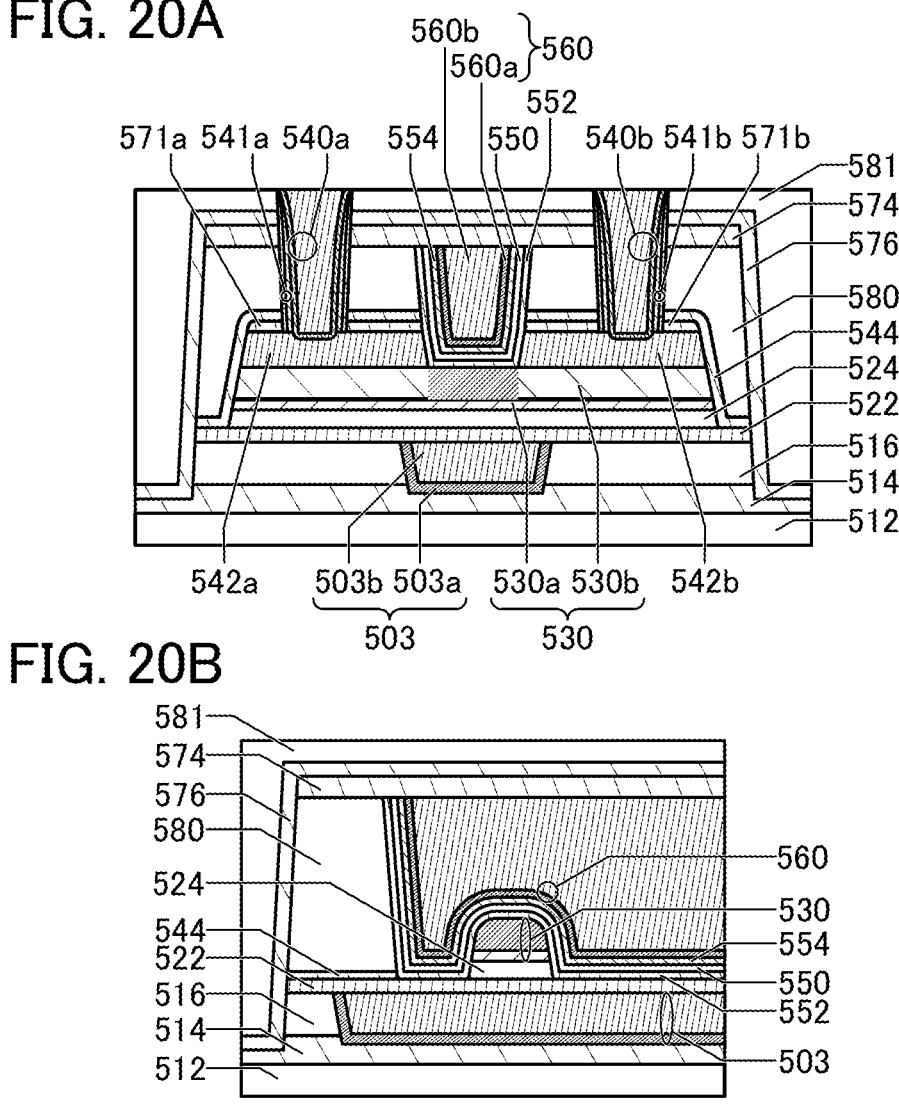
FIG. 20A and FIG. 20B are schematic cross-sectional views illustrating a structure example of a transistor.

Details of the transistor 500 are described here. FIG. 20A and FIG. 20B illustrate a structure example of the transistor 500 that is an OS transistor. FIG. 20A is a cross-sectional view of the OS transistor in the channel length direction, and FIG. 20B is a cross-sectional view of the OS transistor in the channel width direction.

As illustrated in FIG. 20A and FIG. 20B, an insulator 514 and an insulator 516 are formed over the insulator 512.

As the insulator 514, it is preferable to use a film having a barrier property that prevents diffusion of hydrogen or impurities from the substrate 310, a region where the circuit element or the like below the insulator 512 is provided, or the like into a region where the transistor 500 is provided. Thus, silicon nitride deposited by a CVD method can be used for the insulator 514, for example.

For the insulator 516, a material similar to that for the insulator 512 can be used, for example.

As illustrated in FIG. 20A and FIG. 20B, the transistor 500 includes the insulator 516 over the insulator 514, a conductor 503 (a conductor 503*a* and a conductor 503*b*) provided to be embedded in the insulator 514 or the insulator 516, an insulator 522 over the insulator 516 and the conductor 503, an insulator 524 over the insulator 522, an oxide 530*a* over the insulator 524, an oxide 530*b* over the oxide 530*a*, a conductor 542*a* over the oxide 530*b*, an insulator 571*a* over the conductor 542*a*, a conductor 542*b* over the oxide 530*b*, an insulator 571*b* over the conductor 542*b*, an insulator 552 over the oxide 530*b*, an insulator 550 over the insulator 552, an insulator 554 over the insulator 550, a conductor 560 (a conductor 560*a* and a conductor 560*b*) that is over the insulator 554 and overlaps with part of the oxide 530*b*, and an insulator 544 provided over the insulator 522, the insulator 524, the oxide 530*a*, the oxide 530*b*, the conductor 542*a*, the conductor 542*b*, the insulator 571*a*, and the insulator 571*b*. Here, as illustrated in FIG. 20A and FIG. 20B, the insulator 552 is in contact with the top surface of the insulator 522, the side surface of the insulator 524, the side surface of the oxide 530*a*, the side surface and the top surface of the oxide 530*b*, the side surface of the conductor 542, the side surface of the insulator 571, the side surface of the insulator 544, the side surface of an insulator 580, and the bottom surface of the insulator 550. The top surface of the conductor 560 is placed to be substantially level with the upper portion of the insulator 554, the upper portion of the insulator 550, the upper portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530*b* is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a provided over the insulator 524 and the oxide 530b provided over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 21A:
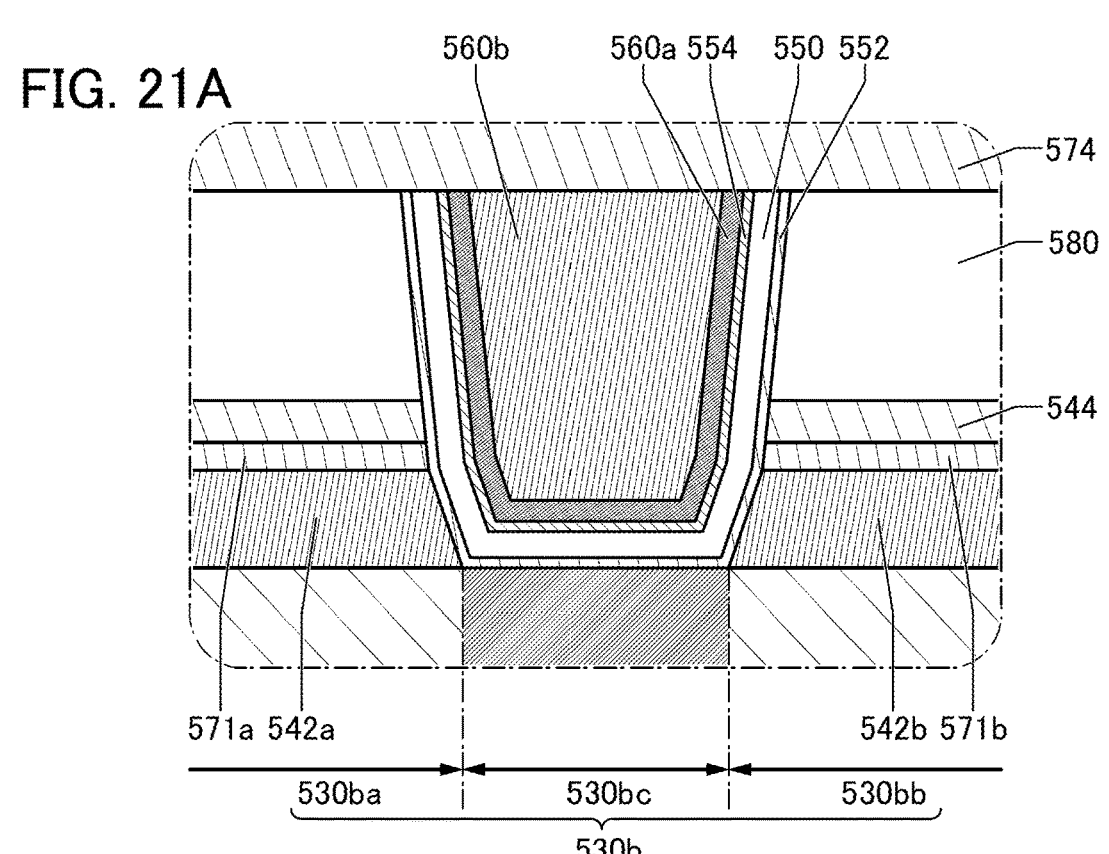
FIG. 21A and FIG. 21B are schematic cross-sectional views illustrating a structure example of a transistor.

FIG. 21A is an enlarged view of the vicinity of the channel formation region in FIG. 20A. Supply of oxygen to the oxide 530b forms the channel formation region in a region between the conductor 542a and the conductor 542b. As illustrated in FIG. 21A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as $V_O$ in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter, sometimes referred to as $V_O$H), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_O$H are preferably reduced as much as possible in the region of the oxide semiconductor where a channel is formed.

The region 530ba and the region 530bb functioning as the source region and the drain region include a large amount of oxygen vacancies ($V_O$) and have a high concentration of an impurity such as hydrogen, nitrogen, or a metal element. Therefore, the region 530ba and the region 530bb are regarded as low-resistance regions with an increased carrier concentration. In other words, the region 530ba and the region 530bb are each an n-type region having a higher carrier concentration and a lower resistance than the region 530bc.

The carrier concentration in the region 530bc functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration in the region 530bc functioning as the channel formation region is not particularly limited and can be, for example, $1\times10^{-9}$ cm$^{-3}$ Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530bc in some cases. The amount of oxygen vacancies in the junction region is smaller than or substantially equal to the amounts of oxygen vacancies in the region 530ba and the region 530bb and larger than or substantially equal to the amount of oxygen vacancies in the region 530bc in some cases.

Although FIG. 21A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium). Alternatively, an In—Ga oxide, an In—Zn oxide, or an indium oxide may be used as the oxide 530.

Here, the atomic ratio of In to the element M in the metal oxide used as the oxide 530*b* is preferably greater than the atomic ratio of In to the element M in the metal oxide used as the oxide 530*a*.

The oxide 530*a* is provided under the oxide 530*b* in the above manner, whereby impurities and oxygen can be inhibited from diffusing into the oxide 530*b* from components formed below the oxide 530*a*.

When the oxide 530*a* and the oxide 530*b* contain a common element (as the main component) besides oxygen, the density of defect states at an interface between the oxide 530*a* and the oxide 530*b* can be made low. Since the density of defect states at the interface between the oxide 530*a* and the oxide 530*b* can be made low, the influence of interface scattering on carrier conduction is small, and a high on-state current can be obtained.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 500. Furthermore, a variation of the amount of oxygen supplied to the source region or the drain region in the substrate plane leads to a variation in characteristics of the semiconductor device including the transistor.

Therefore, the region 530*bc* functioning as the channel formation region in the oxide semiconductor is preferably an i-type or substantially i-type region with a reduced carrier concentration, whereas the region 530*ba* and the region 530*bb* functioning as the source region and the drain region are preferably n-type regions with high carrier concentrations. That is, it is preferable that oxygen vacancies and $V_OH$ in the region 530*bc* of the oxide semiconductor be reduced and the region 530*ba* and the region 530*bb* not be supplied with an excess amount of oxygen.

Thus, in this embodiment, microwave treatment is performed in an oxygen-containing atmosphere in a state where the conductor 542*a* and the conductor 542*b* are provided over the oxide 530*b* so that oxygen vacancies and $V_OH$ in the region 530*bc* can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530*bc* can be irradiated with the high-frequency wave such as a microwave or RF. By the effect of the plasma or a microwave, $V_OH$ in the region 530*bc* can be cut; thus, hydrogen H can be removed from the region 530*bc* and an oxygen vacancy $V_O$ can be filled with oxygen. That is, the reaction "$V_OH \rightarrow H+V_O$" occurs in the region 530*bc*, so that the hydrogen concentration in the region 530*bc* can be reduced. As a result, oxygen vacancies and $V_OH$ in the region 530*bc* can be reduced to lower the carrier concentration.

In the microwave treatment in an oxygen-containing atmosphere, the high-frequency wave such as the microwave or RF, the oxygen plasma, or the like is blocked by the conductor 542*a* and the conductor 542*b* and does not affect the region 530*ba* nor the region 530*bb*. In addition, the effect of the oxygen plasma can be reduced by the insulator 571 and the insulator 580 that are provided to cover the oxide 530*b* and the conductor 542. Hence, a reduction in $V_OH$ and supply of an excess amount of oxygen do not occur in the region 530*ba* and the region 530*bb* in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530*bc*. In addition, the insulator 552 is provided to be in contact with the side surface of the conductor 542 and the surface of the region 530*bc*, thereby preventing oxygen more than necessary from being supplied to the region 530*bc* and preventing the side surface of the conductor 542 from being oxidized. Furthermore, the side surface of the conductor 542 can be inhibited from being oxidized when an insulating film to be the insulator 550 is formed.

The oxygen supplied into the region 530*bc* has any of a variety of forms such as an oxygen atom, an oxygen molecule, and an oxygen radical (also referred to as an O radical, an atom or a molecule having an unpaired electron, or an ion). Note that the oxygen supplied into the region 530*bc* preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and $V_OH$ can be selectively removed from the region 530*bc* in the oxide semiconductor, whereby the region 530*bc* can be an i-type or substantially i-type region. Furthermore, supply of an excess amount of oxygen to the region 530*ba* and the region 530*bb* functioning as the source region and the drain region can be inhibited and the state of the n-type region before the microwave treatment is performed can be maintained. As a result, a change in the electrical characteristics of the transistor 500 can be inhibited, and thus a variation in the electrical characteristics of the transistors 500 in the substrate plane can be reduced.

With the above structure, a semiconductor device (or a display apparatus) with a small variation in transistor characteristics can be provided. A semiconductor device (or a display apparatus) with favorable reliability can also be provided. A semiconductor device (or a display apparatus) having favorable electrical characteristics can be provided.

As illustrated in FIG. 20B, a curved surface may be provided between the side surface of the oxide 530b and the top surface of the oxide 530b in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, or an indium oxide may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 20A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

One or more selected from the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for one or more selected from the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., one or both of oxygen atoms and oxygen molecules) (an insulating material through which the oxygen is less likely to pass).

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium-gallium-zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$. (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be fabricated.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1\times10^{13}$ $\Omega$cm, the insulator 512, the insulator 544, and the insulator 576 can sometimes reduce charge up of the conductor 503, the conductor 542, and the conductor 560 in treatment using plasma or the like in the fabrication process of a semiconductor device. The resistivities of the insulator 512, the insulator 544, and the insulator 576 are preferably higher than or equal to $1\times10^{10}$ $\Omega$cm and lower than or equal to $1\times10^{15}$ $\Omega$cm.

The insulator 516, the insulator 574, the insulator 580, and the insulator 581 each preferably have a lower permittivity than the insulator 514. When a material with a low permittivity is used for the interlayer film, the parasitic capacitance generated between wirings can be reduced. Silicon oxide or silicon oxynitride can be used for the insulator 516, the insulator 580, and the insulator 581, for example. For example, silicon oxide to which fluorine is added, silicon oxide to which carbon is added, silicon oxide to which carbon and nitrogen are added, or silicon oxide having pores can be used for the insulator 516, the insulator 580, and insulator 581.

The insulator 581 is preferably an insulator functioning as an interlayer film or a planarization film, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., one or more selected from an oxygen atom and an oxygen molecule).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a. Moreover, the conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage (Vth) of the transistor 500 can be controlled. In particular, Vth of the transistor 500 can be higher in the case where a negative potential is applied to the conductor 503, and the off-state current can be reduced. Thus, drain current at the time when a potential applied to the conductor 560 is 0 V can be lower in the case where a negative potential is applied to the conductor 503 than in the case where the negative potential is not applied to the conductor 503.

In the case where the oxide 530 is a highly purified intrinsic oxide and as many impurities as possible are eliminated from the oxide 530, the transistor 500 can be expected to become normally-off (the threshold voltage of the transistor 500 can be expected to higher than 0 V) in some cases with no potential application to one or both of the conductor 503 and the conductor 560. In that case, it is suitable to connect the conductor 560 and the conductor 503 to each other such that the same potential is supplied.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 20B, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a fin-type structure and a planar structure. With the S-channel structure, resistance to a short-channel effect can be enhanced, that is, a transistor in which a short-channel effect is less likely to occur can be provided.

When the transistor 500 becomes normally-off and has the above-described S-channel structure, the channel formation region can be electrically surrounded. Accordingly, the transistor 500 can be regarded as having a GAA (Gate All Around) structure or an LGAA (Lateral Gate All Around) structure. When the transistor 500 has the S-channel structure, the GAA structure, or the LGAA structure, the channel formation region that is formed at the interface between the oxide 530 and the gate insulating film or in the vicinity of the interface can be formed in the entire bulk of the oxide 530. In other words, the transistor 500 having the S-channel structure, the GAA structure, or the LGAA structure can be what is called a Bulk-Flow type, in which a carrier path is used as the entire bulk. A transistor structure with a Bulk-Flow type can improve the density of current flowing in the transistor and thus can be expected to improve the on-state current of the transistor or increase the field-effect mobility of the transistor.

Furthermore, as illustrated in FIG. 20B, the conductor 503 is extended to function as a wiring as well. However, without limitation to this structure, a structure in which a conductor functioning as a wiring is provided below the conductor 503 may be employed. In addition, the conductor

503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., one or both of a hydrogen atom and a hydrogen molecule). In addition, it is preferable that the insulator 522 have a function of inhibiting diffusion of oxygen (e.g., one or both of an oxygen atom and an oxygen molecule). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As scaling down and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a fabrication process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "$V_O$+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_O$H.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and the top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be fabricated.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), or an oxide containing hafnium and silicon (hafnium silicate) can be used. In this embodiment, aluminum oxide is used for the insulator 552. In this case, the insulator 552 is an insulator containing at least oxygen and aluminum.

As illustrated in FIG. 20B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_O$H formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530*bb* are prevented from being excessively oxidized by oxygen through the region 530*bc*; a reduction in on-state current or field-effect mobility of the transistor 500 can be inhibited.

As illustrated in FIG. 20A, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for scaling down the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. An ALD method is a method in which deposition is performed by introducing a first source gas (for example, referred to as a precursor or a metal precursor in some cases) and a second source gas (for example, referred to as a reactant, an oxidizer, or a nonmetallic precursor in some cases) for reaction alternately into a chamber, and repeating the introduction of these source gases. As an ALD method, a thermal ALD method, in which a precursor and a reactant react with each other only by a thermal energy, a PEALD (Plasma Enhanced ALD) method, in which a reactant excited by plasma is used, and the like can be used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 to have a small thickness as described above and to have favorable coverage.

Note that some of precursors usable in an ALD method contain carbon. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide, for example. In particular, silicon oxide and silicon oxynitride, which have thermal stability, are preferable. The insulator 550 in this case is an insulator containing at least oxygen and silicon.

As in the insulator 524, the concentration of impurities such as water and hydrogen in the insulator 550 is preferably reduced. The lower limit of the thickness of the insulator 550 is preferably 1 nm or 0.5 nm, and the upper limit is preferably 15 nm or 20 nm. Note that the above-described lower limits and upper limits can be combined with each other. For example, the thickness of the insulator 550 is preferably greater than or equal to 0.5 nm and less than or equal to 20 nm, preferably greater than or equal to 1 nm and less than or equal to 15 nm. In that case, at least part of the insulator 550 includes a region having the above-described thickness.

Although FIG. 20A, FIG. 20B, and the like illustrate a single-layer structure of the insulator 550, the present invention is not limited to this structure, and a stacked-layer structure of two or more layers may be employed. For example, as illustrated in FIG. 21B, the insulator 550 may have a stacked-layer structure including two layers of an insulator 550*a* and an insulator 550*b* over the insulator 550*a*.

Figure 21B:
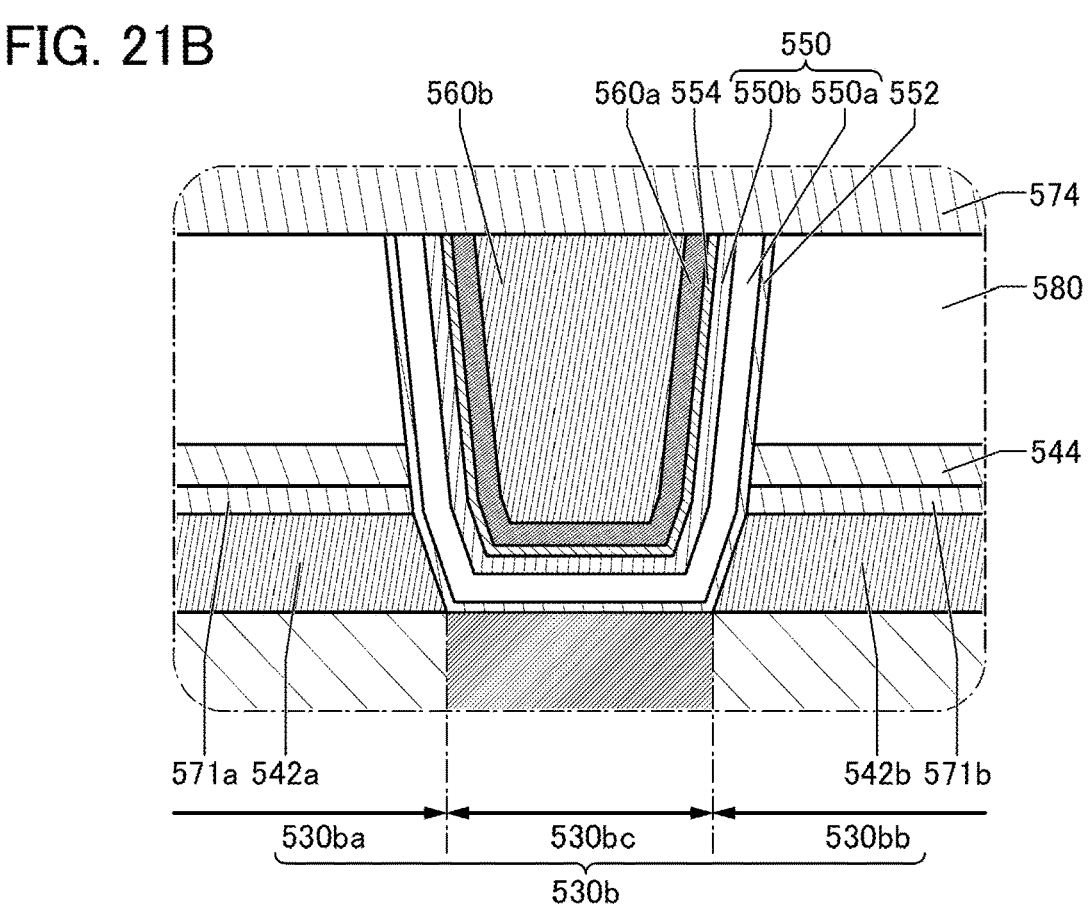

In the case where the insulator 550 has a stacked-layer structure of two layers as illustrated in FIG. 21B, it is preferable that the insulator 550*a* in a lower layer be formed using an insulator that is likely to transmit oxygen and the insulator 550*b* in an upper layer be formed using an insulator having a function of inhibiting oxygen diffusion. With such a structure, oxygen contained in the insulator 550*a* can be inhibited from diffusing into the conductor 560. That is, a reduction in the amount of oxygen supplied to the oxide 530 can be inhibited. In addition, oxidation of the conductor 560 due to oxygen contained in the insulator 550*a* can be inhibited. For example, it is preferable that the insulator 550*a* be provided using any of the above-described materials that can be used for the insulator 550 and the insulator 550*b* be provided using an insulator containing an oxide of one or both of aluminum and hafnium. As Examples of the insulator, aluminum oxide, hafnium oxide, an oxide containing aluminum and hafnium (hafnium aluminate), and an oxide containing hafnium and silicon (hafnium silicate) are given. In this embodiment, hafnium oxide is used as the insulator 550*b*. In this case, the insulator 550*b* is an insulator containing at least oxygen and hafnium. The thickness of the insulator 550*b* is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, at least part of the insulator 550*b* includes a region having the above-described thickness.

In the case where silicon oxide and silicon oxynitride are used for the insulator 550*a*, the insulator 550*b* may be formed using an insulating material that is a high-k material having a high dielectric constant. The gate insulator having a stacked-layer structure of the insulator 550*a* and the insulator 550*b* can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530*b*. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for scaling down the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560*a* and the conductor 560*b* provided over the conductor 560*a*. For example, the conductor 560*a* is preferably provided to cover the bottom surface and the side surface of the conductor 560*b*. As illustrated in FIG. 20A and FIG. 20B, the top surface of the conductor 560 is substantially level with the upper portion of the insulator 550. Note that although the conductor 560 has a two-layer structure of the conductor 560*a* and the conductor 560*b* in FIG. 20A and FIG. 20B, the conductor 560 can have, besides the two-layer structure, a single-layer structure or a stacked-layer structure of three or more layers.

For the conductor 560*a*, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., one or both of an oxygen atom and an oxygen molecule).

In addition, when the conductor 560*a* has a function of inhibiting diffusion of oxygen, the conductivity of the conductor 560*b* can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560*b*. The conductor 560*b* can have a stacked-layer structure. Specifically, for example, the conductor 560*b* can have a stacked-layer structure of titanium or titanium nitride and the above conductive material.

In the transistor 500, the conductor 560 is formed in a self-aligned manner to fill the opening formed in the insulator 580. The formation of the conductor 560 in this manner allows the conductor 560 to be placed properly in a region between the conductor 542*a* and the conductor 542*b* without alignment.

As illustrated in FIG. 20B, in the channel width direction of the transistor 500, with reference to the bottom surface of the insulator 522, the level of the bottom surface of the conductor 560 in a region where the conductor 560 and the oxide 530*b* do not overlap with each other is preferably lower than the level of the bottom surface of the oxide 530*b*. When the conductor 560 functioning as the gate electrode covers the side surface and the top surface of the channel formation region of the oxide 530*b* with the insulator 550 and the like therebetween, the electric field of the conductor 560 can easily act on the entire channel formation region of the oxide 530*b*. Thus, the on-state current of the transistor 500 can be increased and the frequency characteristics of the transistor 500 can be improved. The difference between the level of the bottom surface of the conductor 560 in a region where the oxide 530*a* and the oxide 530*b* do not overlap with the conductor 560 and the level of the bottom surface of the oxide 530*b*, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be fabricated.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540*a* functioning as a plug, and the other of the first terminal and the second terminal of the transistor 500 is electrically connected to a conductor 540*b*. Note that the conductor 540*a* and the conductor 540*b* may function as wirings for electrical connection to the light-emitting device 150 or the like provided thereabove. In the display apparatus 100 of FIG. 19, the conductor 540*a* and the conductor 540*b* may function as wirings for electrical connection to the transistor 300. Note that in this specification and the like, the conductor 540*a* and the conductor 540*b* are collectively referred to as the conductor 540.

The conductor 540*a* is provided in a region overlapping with the conductor 542*a*, for example. Specifically, an opening portion is formed in the insulator 571, the insulator 544, the insulator 580, the insulator 574, the insulator 576, and the insulator 581 illustrated in FIG. 20A in the region overlapping with the conductor 542*a*, and the conductor 540*a* is provided inside the opening portion. The conductor 540*b* is provided in a region overlapping with the conductor 542*b*, for example. Specifically, an opening portion is formed in the insulator 571, the insulator 544, the insulator 580, the insulator 574, the insulator 576, and the insulator 581 illustrated in FIG. 20A in the region overlapping with the conductor 542*b*, and the conductor 540*b* is provided inside the opening portion.

As illustrated in FIG. 20A, an insulator 541*a* as an insulator having an impurity barrier property may be provided between the conductor 540*a* and the side surface of the opening portion in the region overlapping with the conductor 542*a*. Similarly, an insulator 541*b* as an insulator having an impurity barrier property may be provided between the conductor 540*b* and the side surface of the opening portion in the region overlapping with the conductor 542*b*. Note that in this specification and the like, the insulator 541*a* and the insulator 541*b* are collectively referred to as an insulator 541.

For the conductor 540*a* and the conductor 540*b*, a conductive material containing tungsten, copper, or aluminum as its main component is preferably used. The conductor 540*a* and the conductor 540*b* may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. As examples of the conductive materials, tantalum, tantalum nitride, titanium, titanium nitride, ruthenium, and ruthenium oxide are given. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540*a* and the conductor 540*b*.

For the insulator 541*a* and the insulator 541*b*, a barrier insulating film that can be used for the insulator 544 may be used, for example. For the insulator 541*a* and the insulator 541*b*, for example, an insulator such as silicon nitride, aluminum oxide, or silicon nitride oxide may be used. Since the insulator 541*a* and the insulator 541*b* are provided in contact with the insulator 574, the insulator 576, and the insulator 571, impurities such as water and hydrogen contained in the insulator 580 or the like can be inhibited from entering the oxide 530 through the conductor 540*a* and the conductor 540*b*. In particular, silicon nitride is suitable because of its high blocking property against hydrogen. Furthermore, oxygen contained in the insulator 580 can be prevented from being absorbed by the conductor 540*a* and the conductor 540*b*.

When the insulator 541*a* and the insulator 541*b* each have a stacked-layer structure as illustrated in FIG. 20A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

The structure of the transistor included in the semiconductor device of one embodiment of the present invention is not limited to that of the transistor 500 illustrated in FIG. 20A and FIG. 20B. The structure of the transistor included in the semiconductor device of one embodiment of the present invention may be changed in accordance with circumstances.

<Sealing Structure Example of Display Apparatus>

Next, a sealing structure for the light-emitting device 150 applicable to the display apparatus 100 in FIG. 17 is described.

Figure 22A:
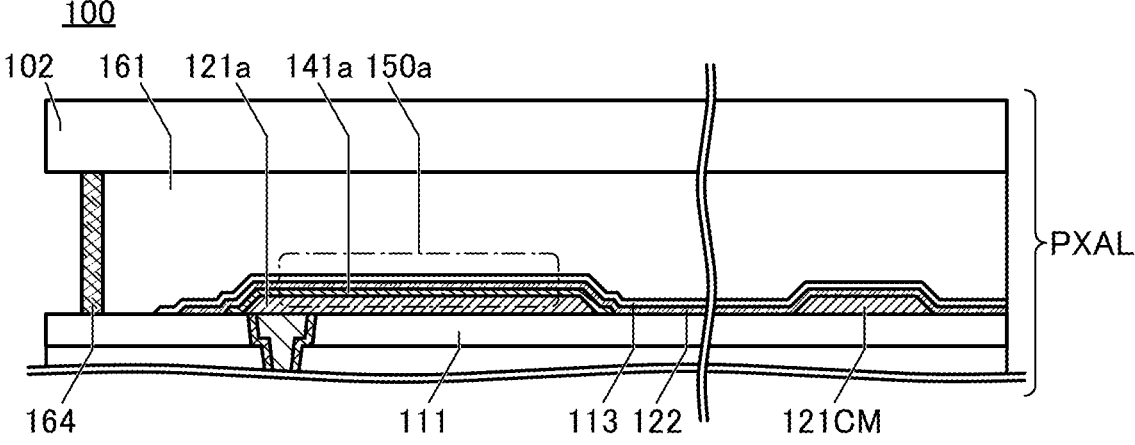
FIG. 22A and FIG. 22B are schematic cross-sectional views illustrating structure examples of a display apparatus.

FIG. 22A is a cross-sectional view of an example of a sealing structure applicable to the display apparatus 100 in FIG. 17. Specifically, FIG. 22A illustrates an end portion of the pixel array ALP of the display apparatus 100 in FIG. 17 and components provided around the end portion. FIG. 22A selectively illustrates only part of the pixel layer PXAL of the display apparatus 100. Specifically, FIG. 22A illustrates the insulator 111, a plug connected to the transistor 200, and insulators, conductors, and the light-emitting device 150*a* that are positioned above the insulator 111.

FIG. 22A also illustrates a conductor 121CM that functions as a connection electrode. The connection electrode has a function of, for example, supplying a potential (e.g., an anode potential or a cathode potential in the light-emitting device 150*a*) to the conductor 122 that functions as a common electrode. Note that the conductor 121CM can be formed using a material applicable to the conductor 121*a* or the conductor 121*b*. In the case where a material applicable to the conductor 121*a* or the conductor 121*b* is used for the conductor 121CM, the conductor 121CM can be formed at the same time with one or both of the conductor 121*a* and the conductor 121*b*.

In the display apparatus 100 in FIG. 22A, an adhesive layer 164 is provided at or around the end portion of the pixel array ALP. Specifically, the display apparatus 100 is fabricated such that the adhesive layer 164 is placed between the insulator 111 and the substrate 102.

The adhesive layer 164 is preferably formed using, for example, a material inhibiting transmission of an impurity such as moisture. Using the material for the adhesive layer 164 can increase the reliability of the display apparatus 100.

The structure in which the insulator 111 and the substrate 102 are bonded with the resin layer 161 therebetween using the adhesive layer 164 is sometimes referred to as a solid sealing structure. In the case where the resin layer 161 in the solid sealing structure has a function of bonding the insulator 111 and the substrate 102 like the adhesive layer 164, the adhesive layer 164 is not necessarily provided.

A structure in which the adhesive layer 164 is used to bond the insulator 112 and the substrate 102 with not the resin layer 161 but an inert gas filling the space between the insulator 112 and the substrate 102 is sometimes referred to as a hollow sealing structure (not shown). Examples of an inert gas include a nitrogen gas and an argon gas.

Figure 22B:
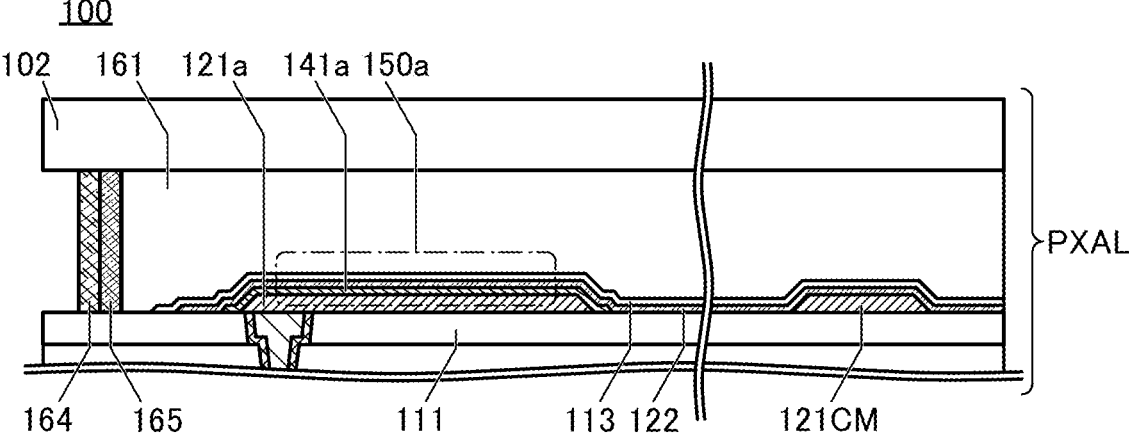

In the sealing structure of the display apparatus 100 illustrated in FIG. 22A, two or more overlapping adhesive layers may be used. For example, as illustrated in FIG. 22B, an adhesive layer 165 may be provided inward from the adhesive layer 164 (may be provided between the adhesive layer 164 and the resin layer 161). Two or more overlapping adhesive layers can inhibit transmission of an impurity such as moisture, further increasing the reliability of the display apparatus 100.

A desiccant may be mixed into the adhesive layer 165. In this case, the desiccant adsorbs moisture contained in the resin layer 161, insulators, conductors, EL layers, and the like that are provided inward from the adhesive layer 164 and the adhesive layer 165, increasing the reliability of the display apparatus 100.

Although the solid sealing structure of the display apparatus 100 is illustrated in FIG. 22B, a hollow sealing structure may be employed.

Furthermore, in each of the sealing structures of the display apparatus 100 in FIG. 22A and FIG. 22B, the resin layer 161 filling the space may be replaced with an inert liquid. Examples of the inert liquid include a fluorine-based inert liquid.

<Modification Example of Display Apparatus>

One embodiment of the present invention is not limited to the above-described structure, and the above-described structure can be changed as appropriate in accordance with the situation. A modification example of the display apparatus 100 in FIG. 17 is described with reference to FIG. 23A to FIG. 25B. Note that FIG. 23A to FIG. 25B selectively illustrate only part of the pixel layer PXAL of the display apparatus 100. Specifically, each of FIG. 23A to FIG. 25B illustrates the insulator 111, a plug connected to the transistor 500, and insulators, conductors, the light-emitting device 150*a*, and the light-emitting device 150*b* that are positioned above the insulator 111. In particular, each of FIG. 23A to FIG. 25B also illustrates a light-emitting device 150*c*, a conductor 121*c*, and an EL layer 141*c*.

Note that, for example, the color of light emitted from the EL layer 141*c* may be different from the colors of light emitted from the EL layer 141*a* and the EL layer 141*b*. The display apparatus 100 may have a structure in which the number of colors of light emitted by the light-emitting device 150*a* to the light-emitting device 150*c* is two, for example. Moreover, the display apparatus 100 may have a structure in which the number of the light-emitting devices 150 is increased and the number of colors of light emitted by the plurality of light-emitting devices is four or more, for example (not illustrated).

Figure 23A:
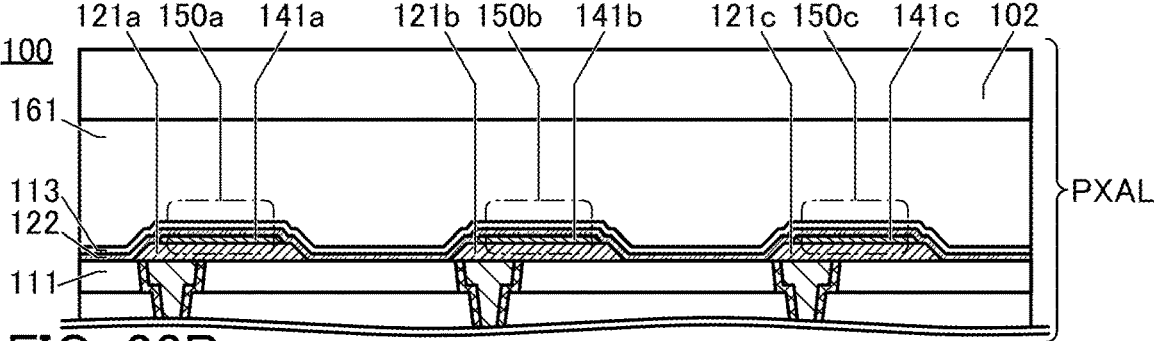
FIG. 23A to FIG. 23D are schematic cross-sectional views illustrating structure examples of a display apparatus.

The display apparatus 100 may have a structure in which, for example, the EL layer 141*a* to the EL layer 141*c* are not provided over the insulator 111 as illustrated in FIG. 23A. That is, the EL layer 141*a* to the EL layer 141*c* may be provided only in regions which overlap with the conductor 121*a* to the conductor 121*c*, respectively. In other words, the regions where the EL layer 141*a* to the EL layer 141*c* are formed may be smaller than the regions of the conductor 121*a* to the conductor 121*c*, respectively.

Figure 23B:
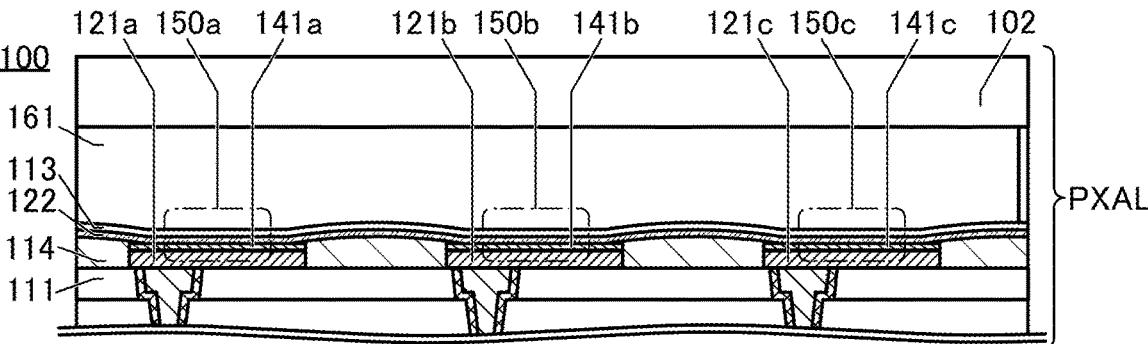

As another example of the structure of the display apparatus 100, as illustrated in FIG. 23B, an insulator 114 may be provided between the conductor 121*a*, the conductor 121*b*, and the conductor 121*c* each of which corresponds to one of a pair of electrodes of a light-emitting device. The insulator 114 is preferably a material that fills a depressed portion between ones of pairs of electrodes of adjacent light-emitting devices to form a flat surface.

As the insulator 114, an inorganic insulating film such as an oxide insulating film, a nitride insulating film, an oxynitride insulating film, or a nitride oxide insulating film can be used, for example. The insulator 114 can have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. As a method of forming the above-described materials, a sputtering method, a CVD method, a PLD method, or an ALD method can be used, for example.

For the insulator 114, an organic material may be used, for example. As the organic material, an acrylic resin, a polyimide resin, an epoxy resin, an imide resin, a polyamide resin, a polyimide-amide resin, a silicone resin, a siloxane resin, a benzocyclobutene-based resin, a phenol resin, or precursors of these resins can be used. For the insulator 114, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin can be used. Moreover, for the insulator 114, a photosensitive resin can be used. A photoresist may be used as the photosensitive resin. Examples of the photosensitive resin include positive-type materials and negative-type materials.

Note that end portions of the conductor 121*a*, the conductor 121*b*, and the conductor 121*c* illustrated in FIG. 23B are steep as compared with the conductor 121*a*, the conductor 121*b*, and the conductor 121*c* illustrated in FIG. 17, and may have an inclination the same as the conductor 121*a*, the conductor 121*b*, and the conductor 121*c* illustrated in FIG. 17.

Figure 23C:
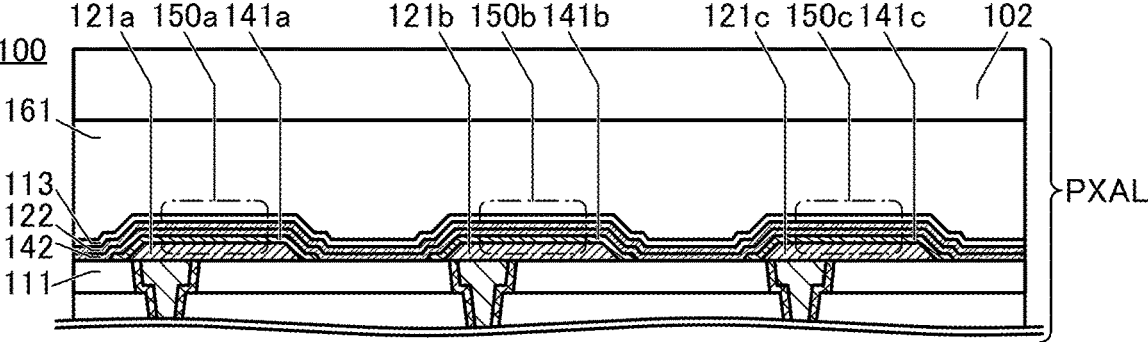

The display apparatus 100 may have a structure in which, for example, an EL layer 142 is provided over the EL layer 141*a* to the EL layer 141*c* as illustrated in FIG. 23C. Specifically, for example, in FIG. 18A, the EL layer 142 can include the layer 4420 when the EL layer 141*a* to the EL layer 141*c* each include the layer 4430 and the light-emitting layer 4411. In this case, the layer 4420 included in the EL layer 142 functions as a common layer shared by the light-emitting device 150*a* to the light-emitting device 150*c*. In a similar manner, for another example, in FIG. 18C, the EL layer 142 can include the layer 4420 when the EL layer 141*a* to the EL layer 141*c* each include the layer 4430, the light-emitting layer 4411, the light-emitting layer 4412, and the light-emitting layer 4413, in which case the layer 4420 included in the EL layer 142 functions as a common layer shared by the light-emitting device 150*a* to the light-emitting device 150*c*. For another example, in FIG. 18D, the EL layer 142 can include the layer 4420 of the light-emitting unit 4400*b* when the EL layer 141*a* to the EL layer 141*c* each include the layer 4430, the light-emitting layer 4412, and the layer 4420 that are included in the light-emitting unit 4400*b*, the intermediate layer 4440, and the layer 4430 and the light-emitting layer 4411 that are included in the light-emitting unit 4400*a*, in which case the layer 4420 of the light-emitting unit 4400*a* included in the EL layer 142 functions as a common layer shared by the light-emitting device 150*a* to the light-emitting device 150*c*.

Figure 23D:
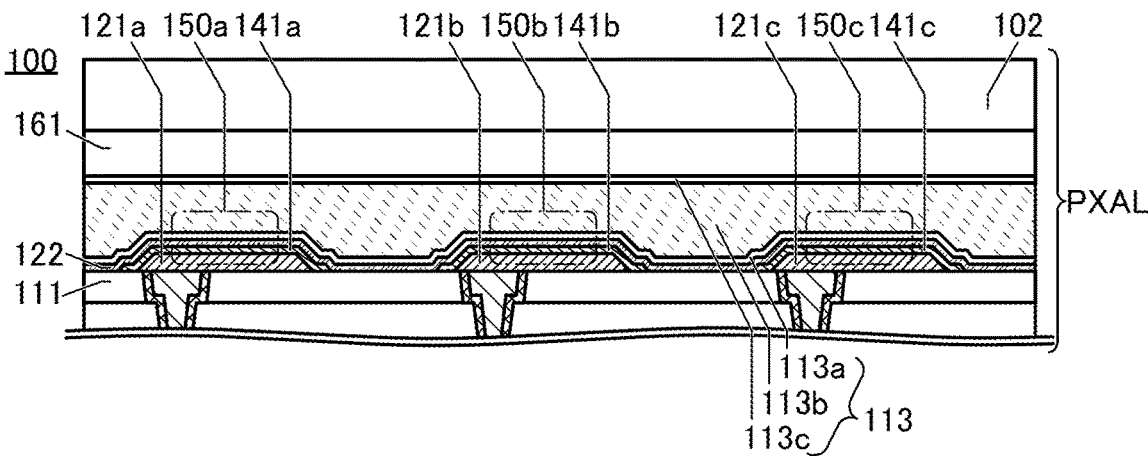

In the structure of the display apparatus 100, for example, the insulator 113 may have a stacked-layer structure including two or more layers, instead of a single layer. The insulator 113 may have a three-layer structure that includes an insulator made of an inorganic material as the first layer, an insulator made of an organic material as the second layer, and an insulator made of an inorganic material as the third layer. FIG. 23D illustrates a cross-sectional view of part of the display apparatus 100 in which the insulator 113 has a multilayer structure including an insulator 113*a* that is an insulator made of an inorganic material, an insulator 113*b* that is an insulator made of an organic material, and an insulator 113*c* that is an insulator made of an inorganic material.

In the structure of the display apparatus 100, for example, the EL layer 141*a* to the EL layer 141*c* may be each provided with a microcavity structure. In the microcavity structure, for example, the conductor 122 as an upper electrode (common electrode) is formed using a light-transmitting and light-reflective conductive material, the conductor 121 as a lower electrode (pixel electrode) is formed using a light-reflective conductive material, and the distance between a bottom surface of the light-emitting layer and a top surface of the lower electrode, i.e., the thickness of the layer 4430 in FIG. 18A, is set to the thickness corresponding to the wavelength of the color of light emitted by the light-emitting layer included in the EL layer 141.

For example, light that is reflected back by the lower electrode (reflected light) considerably interferes with light that directly enters the upper electrode from the light-emitting layer (incident light). For this reason, the optical length between the lower electrode and the light-emitting layer is preferably adjusted to $(2n-1)\lambda/4$ (n is a natural number of 1 or larger and A is a wavelength of light to be amplified). By adjusting the optical length, the phases of the reflected light and the incident light having the wavelength A can be aligned with each other and the light emitted from the light-emitting layer can be further amplified. In the case where the reflected light and the incident light have a wavelength other than the wavelength λ, their phases are not aligned with each other, resulting in attenuation without resonation.

In the above-described structure, the EL layer may include a plurality of light-emitting layers or a single light-emitting layer. Furthermore, for example, the combination with the aforementioned tandem light-emitting device structure is possible; specifically, the above-described structure can be applied to a structure in which one light-emitting device includes a plurality of EL layers sandwiching a charge-generation layer and each EL layer includes one or more light-emitting layers.

Figure 24A:
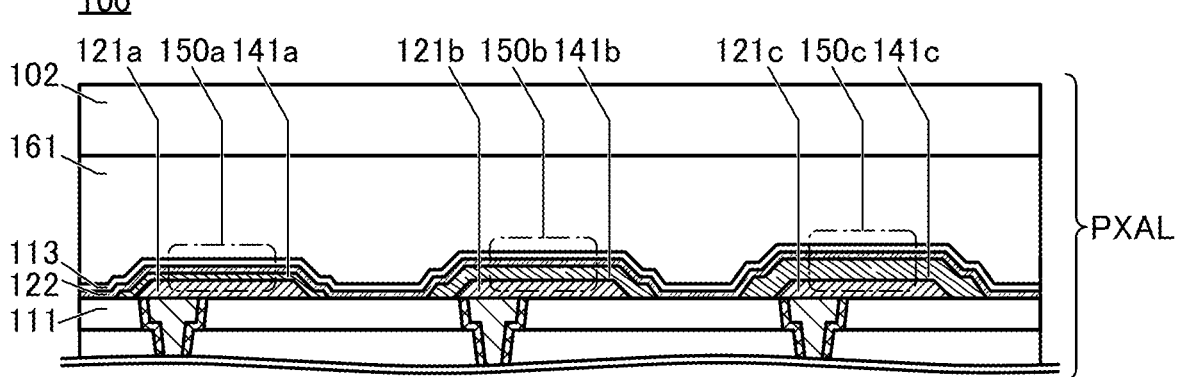
FIG. 24A and FIG. 24B are schematic cross-sectional views illustrating structure examples of a display apparatus.

With the microcavity structure, emission intensity with a specific wavelength in the front direction can be increased, whereby power consumption can be reduced. Particularly in the case of a device for XR such as VR and AR, light emitted from the light-emitting device in the front direction often enters the eyes of the user wearing the device; thus, a display apparatus of a device for XR preferably includes a microcavity structure. Note that in the case of a display apparatus which displays images with subpixels of four colors, red, yellow, green, and blue, the display apparatus can have favorable characteristics because a microcavity structure suitable for wavelengths of the corresponding colors can be employed in each subpixel, in addition to the effect of an improvement in luminance owing to yellow light emission As an example, FIG. 24A illustrates a cross-sectional view of part of the display apparatus 100 including a microcavity structure. In the case where the light-emitting device 150*a* includes a blue (B)-light-emitting layer, the light-emitting device 150*b* includes a green (G)-light-emitting layer, and the light-emitting device 150*c* includes a red (R)-light-emitting layer, it is preferable that the EL layer 141*a* have the smallest thickness, the EL layer 141*b* have the second largest thickness, and the EL layer 141*c* have the largest thickness as illustrated in FIG. 24A. Specifically, the thicknesses of the layers 4430 included in the EL layer 141*a*, the EL layer 141*b*, and the EL layer 141*c* are determined depending on the color of the light emitted by the corresponding light-emitting layer. In this case, the layer 4430 included in the EL layer 141*a* has the smallest thickness and the layer 4430 included in the EL layer 141*c* has the largest thickness.

Figure 24B:
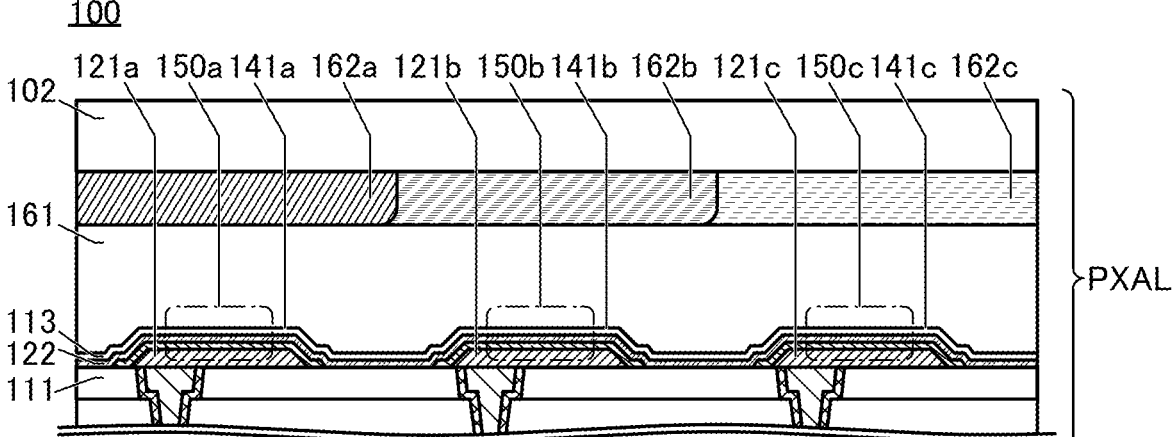

In the structure of the display apparatus 100, for example, a coloring layer (color filter) may be provided. As an example, FIG. 24B illustrates a structure in which a coloring layer 162*a*, a coloring layer 162*b*, and a coloring layer 162*c* are included between the resin layer 161 and the substrate 102. Note that the coloring layer 162*a* to the coloring layer 162*c* can be formed on the substrate 102, for example. In the case where the light-emitting device 150*a* includes a blue (B)-light-emitting layer, the light-emitting device 150*b* includes a green (G)-light-emitting layer, and the light-emitting device 150*c* includes a red (R)-light-emitting layer, the coloring layer 162*a* is a blue coloring layer, the coloring layer 162*b* is a green coloring layer, and the coloring layer 162*c* is a red coloring layer.

The display apparatus 100 illustrated in FIG. 24B can be fabricated in such a manner that the substrate 102 provided with the coloring layer 162*a* to the coloring layer 162*c* and the substrate 310 over which components up to the light-emitting device 150*a* to the light-emitting device 150*c* are formed are bonded to each other with the resin layer 161 therebetween. This bonding is preferably performed such that the light-emitting device 150*a* and the coloring layer 162*a* overlap with each other, the light-emitting device 150*b* and the coloring layer 162*b* overlap with each other, and the light-emitting device 150*c* and the coloring layer 162*c* overlap with each other. In the display apparatus 100 provided with the coloring layer 162*a* to the coloring layer 162*c*, for example, the light emitted by the light-emitting device 150*b* is extracted to above the substrate 102 not through the coloring layer 162*a* or the coloring layer 162*c* but through the coloring layer 162*b*. That is, light emitted from the light-emitting device 150 in an oblique direction (a direction at an elevation angle with a top surface of the substrate 102 used as a horizontal plane) can be blocked in the display apparatus 100; thus, the viewing angle dependence of the display apparatus 100 can be reduced, inhibiting the display quality of an image displayed by the display apparatus 100 from decreasing when the image is viewed from an oblique direction.

The coloring layer 162*a* to the coloring layer 162*c* formed on the substrate 102 may be covered with a resin which is also referred to as an overcoat layer. Specifically, the resin layer 161, the overcoat layer, the coloring layer 162*a* to the coloring layer 162*c*, and the substrate 102 may be stacked in this order in the display apparatus 100 (not illustrated). Note that examples of the resin usable for the overcoat layer include a thermosetting material that has a light-transmitting property and is based on an acrylic or epoxy resin.

In the structure of the display apparatus 100, for example, a black matrix may be included in addition to the coloring layers (not illustrated). The black matrix between the coloring layer 162*a* and the coloring layer 162*b*, between the coloring layer 162*b* and the coloring layer 162*c*, and between the coloring layer 162*c* and the coloring layer 162*a* can block more light emitted from the light-emitting device 150 in an oblique direction (a direction at an elevation angle with the top surface of the substrate 102 used as a horizontal plane) in the display apparatus 100; thus, the display quality of an image displayed by the display apparatus 100 can be more prevented from decreasing when the image is viewed from an oblique direction.

In the case where the display apparatus includes coloring layers as illustrated in FIG. 24B, the light-emitting device 150*a* to the light-emitting device 150*c* of the display apparatus may each be a white-light-emitting device (not shown). The structure of the light-emitting device can be a single structure or a tandem structure, for example.

Figure 25A:
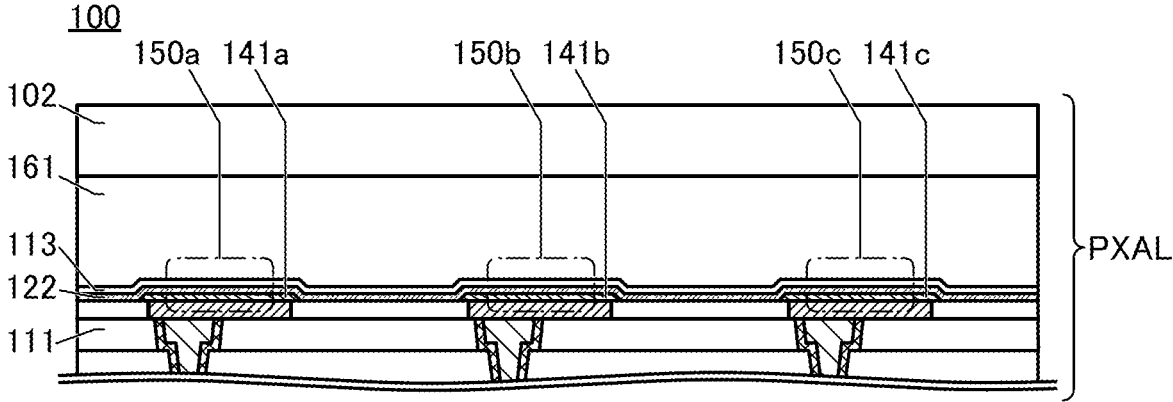
FIG. 25A and FIG. 25B are schematic cross-sectional views illustrating structure examples of a display apparatus.

Furthermore, the display apparatus 100 may have a structure in which the conductor 121*a* to the conductor 121*c* are embedded in the insulator 111 as illustrated in FIG. 25A, for example. This structure can be formed in such a manner that openings in which the conductor 121*a* to the conductor 121*c* are to be embedded are formed in the insulator 111, a conductive film to be the conductor 121*a* to the conductor 121*c* is formed, and then, a chemical mechanical polishing (CMP) method is performed until the insulator 111 is exposed.

Figure 25B:
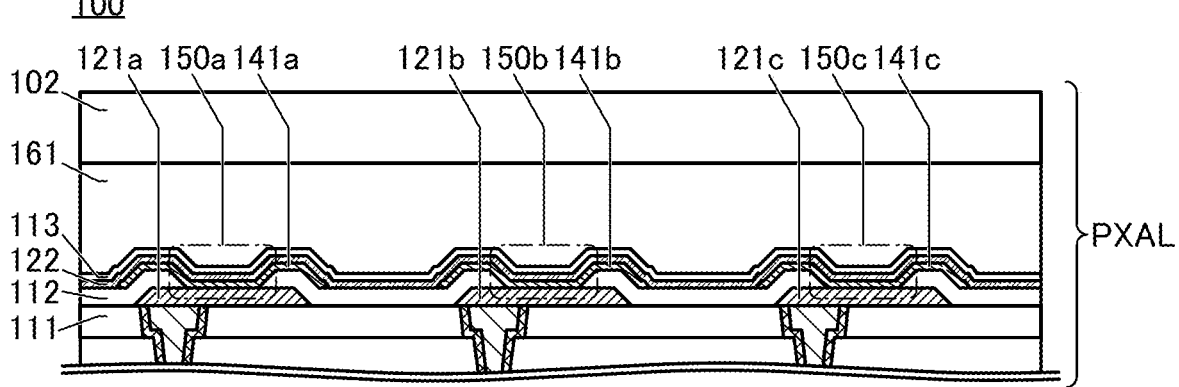

The display apparatus 100 may have a structure in which the insulator 112 is provided over the conductor 121*a* to the conductor 121*c* as illustrated in FIG. 25B, for example. Note that in FIG. 25B, a region where the insulator 112 is not provided exists over part of the conductor 121*a*, over part of the conductor 121*b*, and over part of the conductor 121*c*. For example, the insulator 112 can be provided in the following manner: an insulating film to be the insulator 112 is formed over the insulator 111, the conductor 121*a*, the conductor 121*b*, and the conductor 121*c*, and the insulating film is subjected to patterning by a photolithography method, openings reaching the conductor 121*a*, the conductor 121*b*, and the conductor 121*c* are formed in parts of a region overlapping with the conductor 121*a*, the conductor 121*b*, and the conductor 121*c*.

The insulator 112 can be an inorganic film with an insulating property, for example. As the inorganic film with an insulating property, silicon oxide, silicon oxynitride, silicon nitride oxide, silicon nitride, aluminum oxide, aluminum oxynitride, aluminum nitride oxide, or aluminum nitride can be used, for example.

The insulator 112 may be an organic film including an insulating layer. Examples of the organic film that can be used for the insulator 112 include polyimide.

The insulator 112 may have a multilayer structure; for example, a two-layer structure in which an insulator of an organic material is used for the first layer and an insulator of an inorganic material is used as the second layer may be employed (not illustrated).

In the above-described structure of the display apparatus 100, the conductor 121*a* to the conductor 121*c* serve as the anodes and the conductor 122 serves as the cathode; however, the display apparatus 100 may have a structure in which the conductor 121*a* to the conductor 121*c* serve as cathodes and the conductor 122 serves as an anode. In other words, in the above-described manufacturing process, the stacking order of the hole-injection layer, hole-transport layer, light-emitting layer, electron-transport layer, and electron-injection layer that are included in the EL layer 141*a* to the EL layer 141*c* and the EL layer 142 can be reversed.

Note that the insulators, the conductors, and the semiconductors disclosed in this specification and the like can be formed by a PVD (Physical Vapor Deposition) method or a CVD method. Examples of a PVD method include a sputtering method, a resistance heating evaporation method, an electron beam evaporation method, and a PLD (Pulsed Laser Deposition) method. The formation by a plasma CVD method or a thermal CVD method can be given as a CVD method. As examples of the thermal CVD method, a MOCVD (Metal Organic Chemical Vapor Deposition) method, and an ALD method can be particularly given.

A thermal CVD method, which is a deposition method not using plasma, has an advantage that no defect due to plasma damage is generated.

Deposition by a thermal CVD method may be performed in such a manner that a source gas and an oxidizer are supplied into a chamber at a time, the pressure in the chamber is set to an atmospheric pressure or a reduced pressure, and they are made to react with each other in the vicinity of the substrate or over the substrate to be deposited over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (e.g., argon or nitrogen) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to deposit a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust film thickness and is thus suitable for manufacturing a minute FET.

A variety of films such as the metal film, the semiconductor film, and the inorganic insulating film disclosed in the above-described embodiments can be formed by a thermal CVD method such as an MOCVD method or an ALD method; for example, in the case of forming an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium (Ga $(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus using an ALD method, two kinds of gases, ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH, $Hf[N(CH_3)_2]_4$)), are used. Examples of another material include tetrakis(ethylmethylamide)hafnium.

For example, in the case where an aluminum oxide film is formed by a deposition apparatus using an ALD method, two kinds of gases, $H_2O$ as an oxidizer and a source gas that is obtained by vaporizing liquid containing a solvent and an aluminum precursor compound (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface on which a film is to be formed, and radicals of an oxidizing gas ($O_2$ or dinitrogen monoxide) are supplied to react with the adsorbate.

For example, in the case where a tungsten film is deposited by a deposition apparatus using an ALD method, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that an $SiH_4$ gas may be used instead of a $B_2H_6$ gas.

In the case where an In—Ga—Zn—O film is formed as an oxide semiconductor film with a deposition apparatus using an ALD method, a precursor (generally called a metal precursor in some cases) and an oxidizer (generally called a reactant or a non-metal precursor in some cases) are sequentially and repetitively introduced. Specifically, for example, an $In(CH_3)_3$ gas as a precursor and as an $O_3$ gas as an oxidizer are introduced to form an In—O layer; a $Ga(CH_3)_3$ gas as a precursor and an $O_3$ gas as an oxidizer are introduced to form a GaO layer; and then, a $Zn(CH_3)_2$ gas as a precursor and an $O_3$ gas as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas which is obtained by bubbling water with an inert gas such as Ar may be used instead of an $O_3$ gas, it is preferable to use an $O_3$ gas which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

The aspect ratio of a display portion of the display apparatus of one embodiment of the present invention is not particularly limited. For example, the display apparatus is compatible with a variety of screen ratios such as 1:1 (a square), 4:3, 16:9, and 16:10.

The shape of the display apparatus of one embodiment of the present invention is not particularly limited. The display apparatus can have any of various shapes such as a rectangular shape, a polygonal shape (e.g., octagon), a circular shape, and an elliptical shape.

<Configuration Example of Pixel Circuit>

Here, configuration examples of a pixel circuit that can be included in the pixel layer PXAL are described.

Figure 26A:
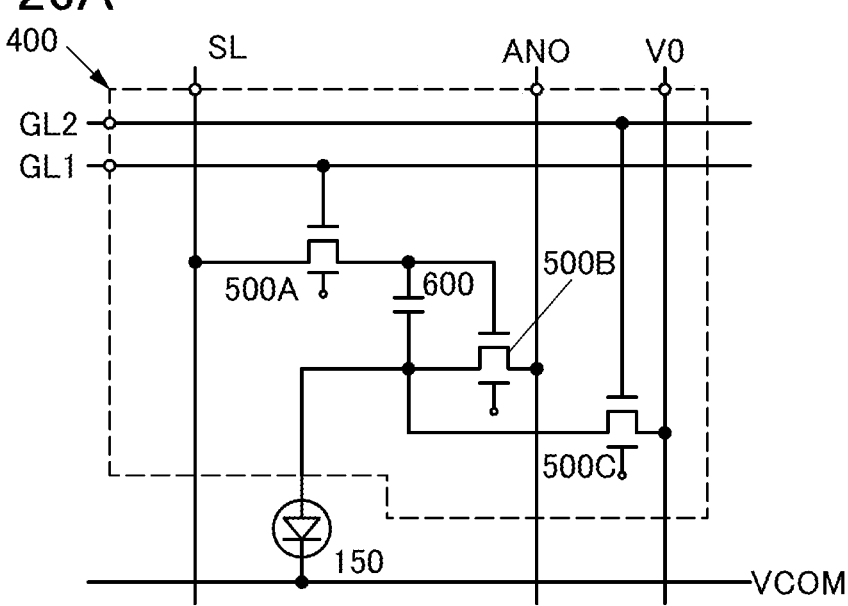
FIG. 26A is a circuit diagram illustrating a configuration example of a pixel circuit included in a display apparatus.
Figure 26B:
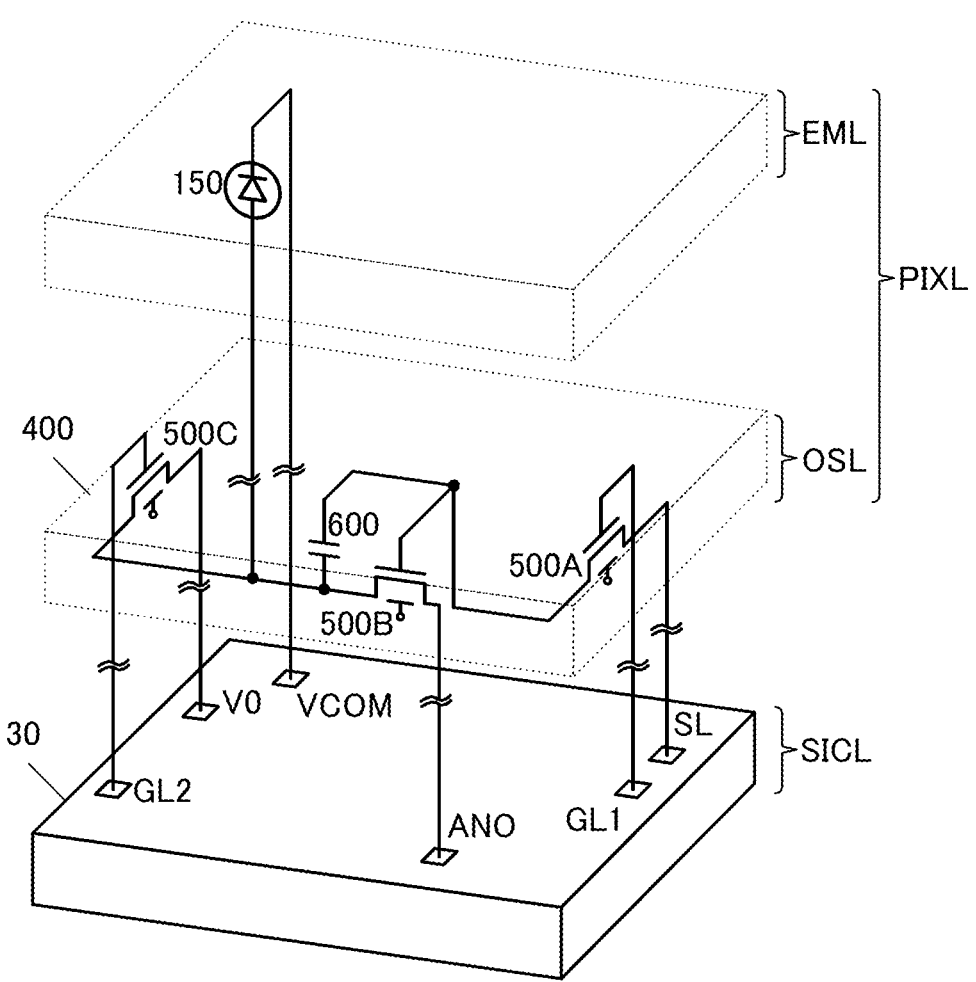
FIG. 26B is a schematic perspective view illustrating the configuration example of the pixel circuit included in the display apparatus.

FIG. 26A and FIG. 26B show a configuration example of a pixel circuit that can be included in the pixel layer PXAL and the light-emitting device 150 connected to the pixel circuit. FIG. 26A shows connection of circuit elements of a pixel circuit 400 included in the pixel layer PXAL, and FIG. 26B schematically shows the positional relation of the circuit layer SICL including a driver circuit 30, a layer OSL including a plurality of transistors of the pixel circuit, and a layer EML including the light-emitting device 150. Note that the pixel layer PXAL in the display apparatus 100 in FIG. 26B includes the layer OSL and the layer EML, for example. A transistor 500A, a transistor 500B, and a transistor 500C included in the layer OSL illustrated in FIG. 26B each correspond to the transistor 200 in FIG. 17. The light-emitting device 150 included in the layer EML illustrated in FIG. 26B corresponds to the light-emitting device 150a or the light-emitting device 150b in FIG. 17.

The pixel circuit 400 illustrated as an example in FIG. 26A and FIG. 26B includes the transistor 500A, the transistor 500B, the transistor 500C, and a capacitor 600. As the transistor 500A, the transistor 500B, and the transistor 500C, for example, transistors usable as the above-described transistor 200 can be used. That is, the transistors 500A, 500B, and 500C can be Si transistors. Alternatively, as the transistors 500A, 500B, and 500C, for example, transistors usable as the above-described transistor 500 can be used. That is, the transistors 500A, 500B, and 500C can be OS transistors. In particular, in the case where the transistors 500A, 500B, and 500C are OS transistors, each of the transistors 500A, 500B, and 500C preferably includes a back gate electrode, in which case the back gate electrode and a gate electrode can be supplied with the same signals or different signals. Although each of the transistors 500A, 500B, and 500C in FIG. 26A and FIG. 26B includes a back gate electrode, each of the transistors 500A, 500B, and 500C does not necessarily include a back gate electrode.

The transistor 500B includes the gate electrode electrically connected to the transistor 500A, a first electrode electrically connected to the light-emitting device 150, and a second electrode electrically connected to a wiring ANO. The wiring ANO supplies a potential for supplying a current to the light-emitting device 150.

The transistor 500A includes a first terminal electrically connected to the gate electrode of the transistor 500B, a second terminal electrically connected to the wiring SL functioning as a source line, and the gate electrode having a function of controlling the conduction state or the non-conduction state based on the potential of a wiring GL1 functioning as a gate line.

The transistor 500C includes a first terminal electrically connected to a wiring V0, a second terminal electrically connected to the light-emitting device 150, and the gate electrode having a function of controlling the conduction state or the non-conduction state based on the potential of a wiring GL2 functioning as a gate line. The wiring V0 supplies a reference potential and outputs a current flowing in the pixel circuit 400 to the driver circuit 30.

The capacitor 600 includes a conductive film electrically connected to the gate electrode of the transistor 500B and a conductive film electrically connected to the second electrode of the transistor 500C.

The light-emitting device 150 includes a first electrode electrically connected to the first electrode of the transistor 500B and a second electrode electrically connected to a wiring VCOM. The wiring VCOM supplies a potential for supplying a current to the light-emitting device 150.

Accordingly, the intensity of light emitted by the light-emitting device 150 can be controlled in accordance with an image signal supplied to the gate electrode of the transistor 500B. Furthermore, variations in the gate-source voltage of the transistor 500B can be reduced by the reference potential of the wiring V0 supplied through the transistor 500C.

A current value that can be used for setting of pixel parameters can be output from the wiring V0. Specifically, the wiring V0 can function as a monitor line for outputting a current flowing in the transistor 500B or a current flowing in the light-emitting device 150 to the outside. A current output to the wiring V0 is, for example, converted into a voltage by a source follower circuit and output to the outside. For another example, the current is converted into a digital signal by an A/D converter, and can be output to the outside.

In the configuration illustrated as an example in FIG. 26B, the wirings electrically connecting the pixel circuit 400 and the driver circuit 30 can be short, so that the wiring resistance of the wirings can be low. Thus, data writing can be performed at a high speed, leading to high-speed operation of the display apparatus 100. Therefore, even when the number of pixel circuits 400 included in the display apparatus 100 is large, a sufficiently long frame period can be ensured and thus the pixel density of the display apparatus 100 can be increased. In addition, the increased pixel density of the display apparatus 100 can increase the resolution of an image displayed by the display apparatus 100. For example, the pixel density of the display apparatus 100 can be higher than or equal to 1000 ppi, higher than or equal to 5000 ppi, or higher than or equal to 7000 ppi. Thus, the display apparatus 100 can be, for example, a display apparatus for VR or AR and can be suitably used in, for example, an electronic device with a short distance between the display portion and the user, such as a head-mounted display.

Although FIG. 26A and FIG. 26B illustrate, as an example, the pixel circuit 400 including three transistors in total, one embodiment of the present invention is not limited thereto. Configuration examples which can be used for the pixel circuit 400 will be described below.

Figures 27A, 27B, 27C, 27D:
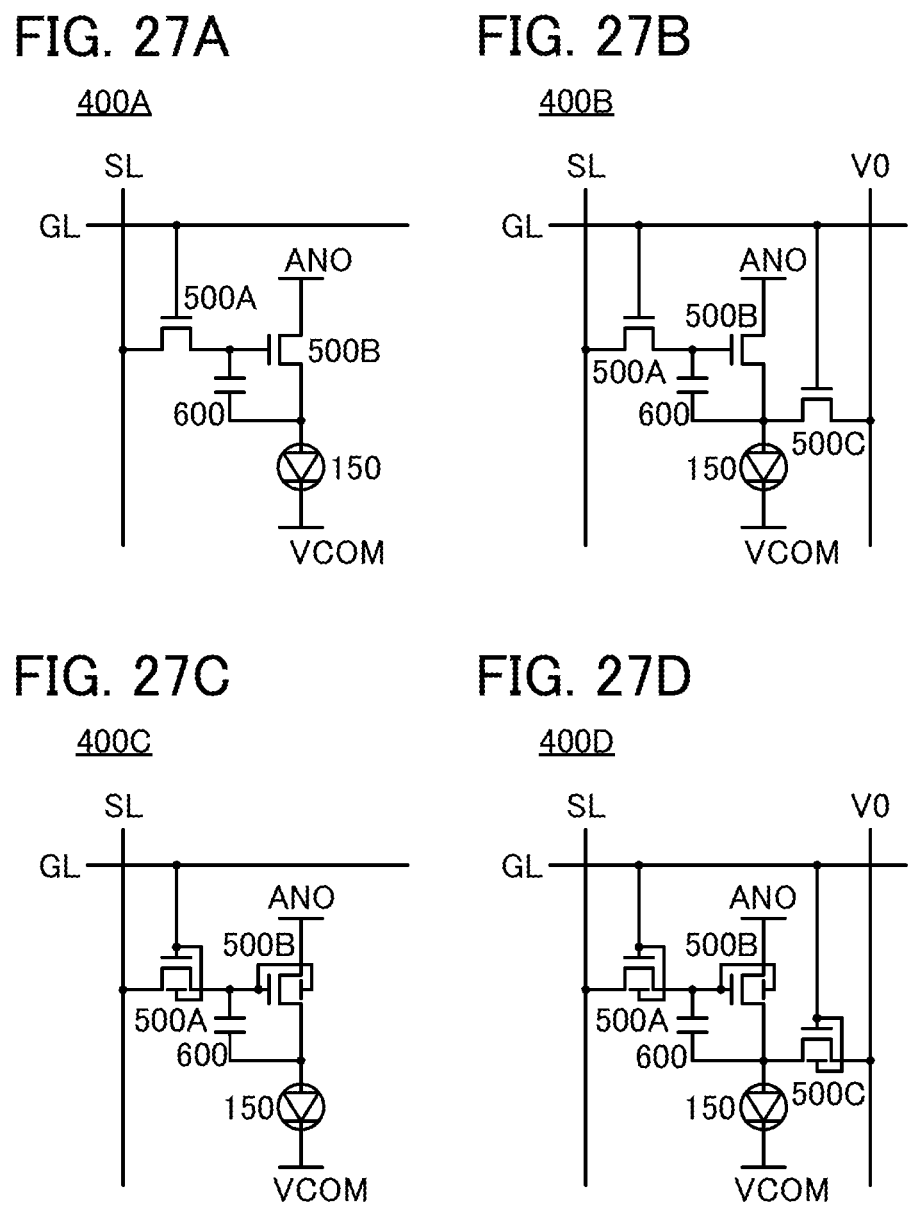

A pixel circuit 400A illustrated in FIG. 27A includes the transistor 500A, the transistor 500B, and the capacitor 600. FIG. 27A illustrates the light-emitting device 150 connected to the pixel circuit 400A. The wirings SL, GL, ANO, and VCOM are electrically connected to the pixel circuit 400A.

The gate of the transistor 500A is electrically connected to the wiring GL, one of the source and the drain of the transistor 500A is electrically connected to the wiring SL, and the other of the source and the drain of the transistor 500A is electrically connected to the gate of the transistor 500B and one electrode of the capacitor 600. One of the source and the drain of the transistor 500B is electrically connected to the wiring ANO and the other of the source and the drain of the transistor 500B is electrically connected to the anode of the light-emitting device 150. The other electrode of the capacitor 600 is electrically connected to the anode of the light-emitting device 150. The cathode of the light-emitting device 150 is electrically connected to the wiring VCOM.

A pixel circuit 400B illustrated in FIG. 27B has a configuration in which the transistor 500C is added to the pixel circuit 400A. In addition, the wiring V0 is electrically connected to the pixel circuit 400B.

A pixel circuit 400C illustrated in FIG. 27C is an example in which a transistor including a gate and a back gate that are electrically connected to each other is used as each of the transistor 500A and the transistor 500B of the pixel circuit 400A. A pixel circuit 400D illustrated in FIG. 27D is an example in the case where such transistors are used in the pixel circuit 400B. With these structures, a current that can flow in the transistors can be increased. Although a transistor in which a pair of gates are electrically connected to each other is used as every transistor here, one embodiment of the present invention is not limited thereto. A transistor that includes a pair of gates electrically connected to different wirings may be used. When, for example, a transistor in which one of the gates is electrically connected to the source is used, the reliability can be increased.

Figure 28A:
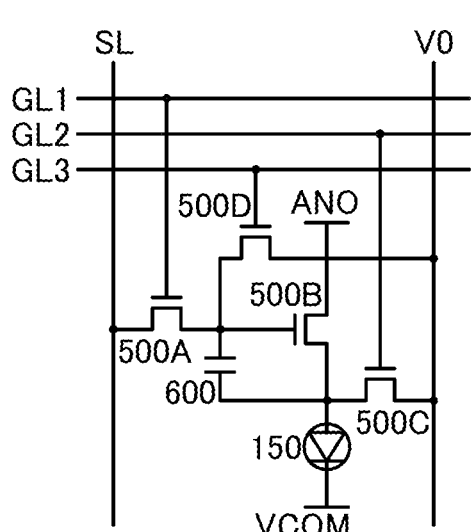
FIG. 28A to FIG. 28D are circuit diagrams each showing a configuration example of a pixel circuit included in a display apparatus.

A pixel circuit 400E illustrated in FIG. 28A has a configuration in which a transistor 500D is added to the pixel circuit 400B. Three wirings (wirings GL1, GL2, and GL3) functioning as gate lines are electrically connected to the pixel circuit 400E.

A gate of the transistor 500D is electrically connected to the wiring GL3, one of a source and a drain of the transistor 500D is electrically connected to the gate of the transistor 500B, and the other of the source and the drain of the transistor 500D is electrically connected to the wiring V0. The gate of the transistor 500A is electrically connected to the wiring GL1, and the gate of the transistor 500C is electrically connected to the wiring GL2.

When the transistor 500C and the transistor 500D are turned on at the same time, the source and the gate of the transistor 500B have the same potential, so that the transistor 500B can be turned off. Thus, a current flowing to the light-emitting device 150 can be blocked forcibly. Such a pixel circuit is suitable for the case of using a display method in which a display period and an off period are alternately provided.

Figure 28B:
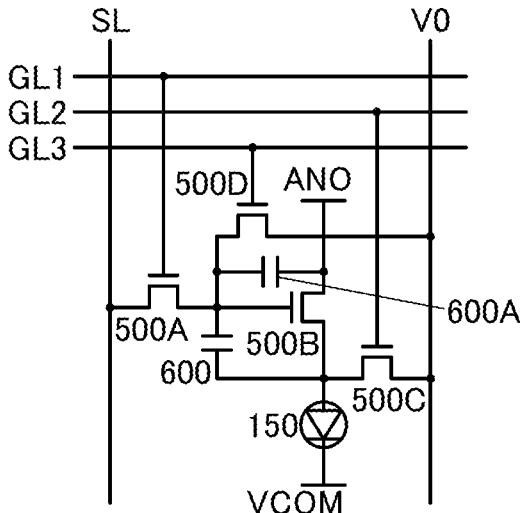

A pixel circuit 400F illustrated in FIG. 28B is an example in which a capacitor 600A is added to the pixel circuit 400E. The capacitor 600A functions as a storage capacitor.

Figure 28C:
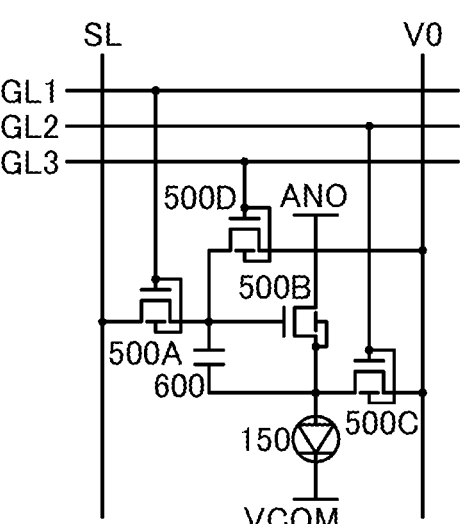
Figure 28D:
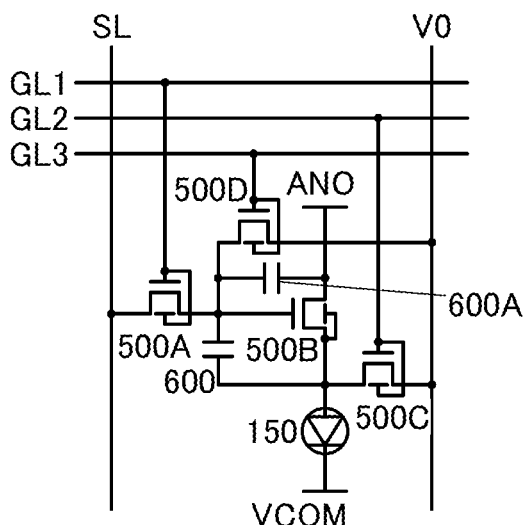

A pixel circuit 400G illustrated in FIG. 28C and a pixel circuit 400H illustrated in FIG. 28D are respectively examples of the cases where transistors each including a gate and a back gate that are electrically connected to each other are used in the pixel circuit 400E and the pixel circuit 400F. A transistor including a gate and a back gate that are electrically connected to each other is used as each of the transistors 500A, 500C, and 500D, and a transistor in which one of gates is electrically connected to a source is used as the transistor 500B.

<Schematic Plan View and Cross-Sectional View of Light-Emitting Device>

Figure 29A:
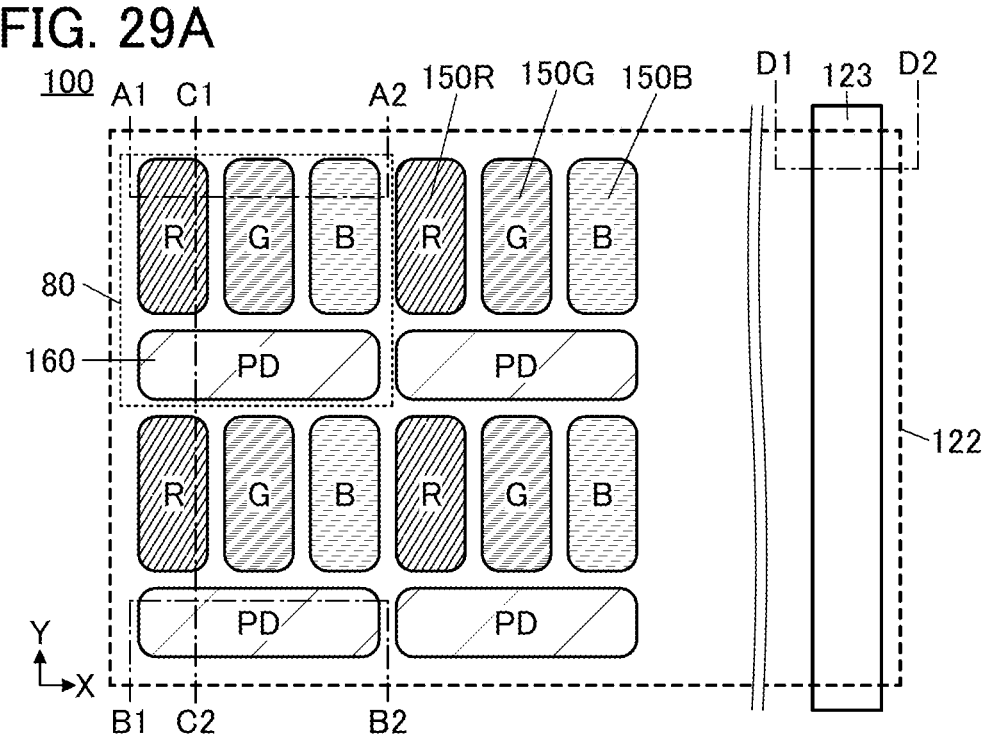
FIG. 29A and FIG. 29B are plan views illustrating structure examples of a light-emitting device and a light-receiving device included in a display apparatus.

FIG. 29A is a schematic plan view illustrating a structure example of the case where light-emitting devices and a light-receiving device are provided in one pixel in the display apparatus 100 of one embodiment of the present invention. The display apparatus 100 includes light-emitting devices 150R that emit red light, light-emitting devices 150G that emit green light, light-emitting devices 150B that emit blue light, and light-receiving devices 160. In FIG. 29A, light-emitting regions of the light-emitting devices 150 are denoted by R, G, and B to easily differentiate the light-emitting devices 150. In addition, light-receiving regions of the light-receiving devices 160 are denoted by PD.

The light-emitting devices 150R, the light-emitting devices 150G, the light-emitting devices 150B, and the light-receiving devices 160 are arranged in a matrix. FIG. 29A illustrates an example where the light-emitting devices 150R, the light-emitting devices 150G, and the light-emitting devices 150B are arranged in the X direction and the light-receiving devices 160 are arranged thereunder. FIG. 29A illustrates a structure example where the light-emitting devices 150 that emit light of the same color are arranged in the Y direction intersecting the X direction. In the display apparatus 100 in FIG. 29A, a pixel 80 can be composed of a sub-pixel including the light-emitting device 150R, a sub-pixel including the light-emitting device 150G, and a sub-pixel including the light-emitting device 150B, which are arranged in the X direction, and a sub-pixel including the light-receiving device 160 provided under the sub-pixels, for example.

As each of the light-emitting devices 150R, 150G, and 150B, an EL element such as an OLED (Organic Light Emitting Diode) or a QLED (Quantum-dot Light Emitting Diode) is preferably used. Examples of a light-emitting substance included in the EL elements include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). Note that as the TADF material, a TADF material whose singlet excited state and triplet excited state are in a thermal equilibrium state may be used. Because such a TADF material has a short emission lifetime (a short excitation lifetime), it inhibits a reduction in the efficiency of the light-emitting element in a high luminance region.

As the light-receiving devices 160, a PN photodiode or a PIN photodiode can be used, for example. The light-receiving devices 160 each function as a photoelectric conversion element that senses light incident on the corresponding light-receiving device 160 and generates electric charges. The amount of generated electric charges depends on the amount of incident light.

It is particularly preferable to use an organic photodiode including a layer containing an organic compound as the light-receiving devices 160. An organic photodiode, which is easily made thin, lightweight, and large in area and has a high degree of freedom for shape and design, can be used in a variety of display apparatuses.

In one embodiment of the present invention, organic EL elements are used as the light-emitting devices 150, and organic photodiodes are used as the light-receiving devices

160. The organic EL elements and the organic photodiodes can be formed over one substrate. Thus, the organic photodiodes can be incorporated in a display apparatus including the organic EL elements. A photolithography method is preferably employed to separate the organic EL elements from each other, separate the organic photodiodes from each other, and separate the organic EL element from the organic photodiode. This can reduce the distance between the light-emitting devices, that between the organic photodiodes, and that between the light-emitting device and the organic photodiode, enabling fabrication of a display apparatus having a higher aperture ratio than that formed using, for example, a shadow mask such as a metal mask.

FIG. 29A shows the conductor 122 functioning as a common electrode and a conductor 123 functioning as a connection electrode. The conductor 123 is electrically connected to the conductor 122. The conductor 123 is provided outside a display portion where the light-emitting devices 150 and the light-receiving devices 160 are arranged. In FIG. 29A, the conductor 122 having a region overlapping with the light-emitting devices 150, the light-receiving devices 160, and the conductor 123 is shown by dashed lines.

The conductor 123 can be provided along the outer periphery of the display portion. For example, the conductor 123 may be provided along one side of the outer periphery of the display portion or two or more sides of the outer periphery of the display portion. That is, the top surface shape of the conductor 123 can be a band shape, an L shape, a square bracket shape, or a quadrangle in the case where the top surface shape of the display portion is a rectangle.

Figure 29B:
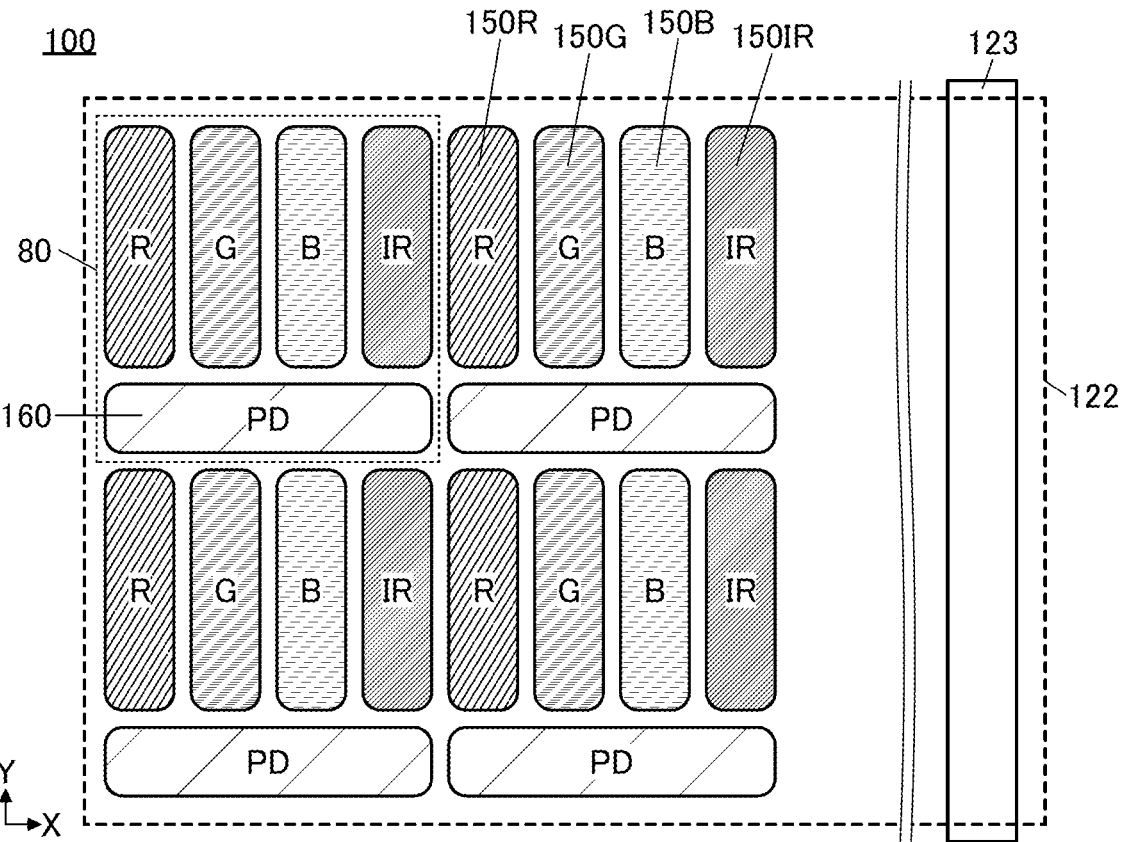

FIG. 29B is a schematic plan view illustrating a structure example of the display apparatus 100, which is a modification example of the display apparatus 100 illustrated in FIG. 29A. The display apparatus 100 illustrated in FIG. 29B is different from the display apparatus 100 in FIG. 29A in that light-emitting devices 150IR that emit infrared light are included. The light-emitting devices 150IR can emit near-infrared light (light with a wavelength greater than or equal to 750 nm to less than or equal to 1300 nm), for example.

In the example illustrated in FIG. 29B, the light-emitting devices 150IR as well as the light-emitting devices 150R, 150G, and 150B are arranged in the X direction, and the light-receiving devices 160 are arranged thereunder. The light-receiving devices 160 each have a function of detecting infrared light.

FIG. 30A is a cross-sectional view taken along dashed-dotted line A1-A2 in FIG. 29A, and FIG. 30B is a cross-sectional view taken along dashed-dotted line B1-B2 in FIG. 29A. FIG. 30C is a cross-sectional view taken along dashed-dotted line C1-C2 in FIG. 29A, and FIG. 30D is a cross-sectional view taken along dashed-dotted line D1-D2 in FIG. 29A. The light-emitting devices 150R, the light-emitting devices 150G, the light-emitting devices 150B, and the light-receiving devices 160 are provided over the insulator 111. In the case where the display apparatus 100 includes the light-emitting devices 150IR, the light-emitting devices 150IR are provided over the insulator 111.

In the case where the expression "B over A" or "B under A" is used in this specification and the like, for example, A and B do not always need to include a region where they are in contact with each other.

FIG. 30A illustrates a cross-sectional structure example of the light-emitting devices 150R, 150G, and 150B shown in FIG. 29A. FIG. 30B illustrates a cross-sectional structure example of the light-receiving device 160 shown in FIG. 29A.

The light-emitting device 150R includes a conductor 121R functioning as a pixel electrode, a hole-injection layer 85R, a hole-transport layer 86R, a light-emitting layer 87R, an electron-transport layer 88R, a common layer 89, and the conductor 122. The light-emitting device 150G includes a conductor 121G functioning as a pixel electrode, a hole-injection layer 85G, a hole-transport layer 86G, a light-emitting layer 87G, an electron-transport layer 88G, the common layer 89, and the conductor 122. The light-emitting device 150B includes a conductor 121B functioning as a pixel electrode, a hole-injection layer 85B, a hole-transport layer 86B, a light-emitting layer 87B, an electron-transport layer 88B, the common layer 89, and the conductor 122. The light-receiving device 160 includes a conductor 121PD functioning as a pixel electrode, a hole-transport layer 86PD, a light-receiving layer 90, an electron-transport layer 88PD, the common layer 89, and the conductor 122.

As the conductor 121R, the conductor 121G, and the conductor 121B, for example, the conductor 121*a*, the conductor 121*b*, and the conductor 121*c* shown in FIG. 17 can be used.

The common layer 89 has a function of an electron-injection layer in the light-emitting device 150. Meanwhile, the common layer 89 has a function of an electron-transport layer in the light-receiving device 160. Therefore, the light-receiving device 160 does not necessarily have to include the electron-transport layer 88PD.

The hole-injection layer 85, the hole-transport layer 86, the electron-transport layer 88, and the common layer 89 can also be referred to as functional layers.

The conductor 121, the hole-injection layer 85, the hole-transport layer 86, the light-emitting layer 87, and the electron-transport layer 88 can each be separately provided for each device. The light-emitting devices 150R, 150G, and 150B and the light-receiving devices 160 include the common layer 89 and the conductor 122 in common.

The light-emitting devices 150 and the light-receiving devices 160 may each include a hole-blocking layer and an electron-blocking layer other than the layers illustrated in FIG. 30A. The light-emitting devices 150 and the light-receiving devices 160 may each include a layer containing a bipolar substance (a substance with a high electron-transport property and a high hole-transport property).

An insulating layer 92 is provided to cover an end portion of the conductor 121R, an end portion of the conductor 121G, an end portion of the conductor 121B, and an end portion of the conductor 121PD. End portions of the insulating layer 92 are preferably tapered. Note that the insulating layer 92 is not necessarily provided.

The hole-injection layer 85R, the hole-injection layer 85G, the hole-injection layer 85B, and the hole-transport layer 86PD each have, for example, a region in contact with a top surface of the conductor 121 and a region in contact with a surface of the insulating layer 92. Furthermore, an end portion of the hole-injection layer 85R, an end portion of the hole-injection layer 85G, an end portion of the hole-injection layer 85B, and an end portion of the hole-transport layer 86PD are positioned over the insulating layer 92.

A gap is provided between the common layer 89 and the insulating layer 92. This can inhibit contact between the common layer 89 and each of a side surface of the light-emitting layer 87, a side surface of the light-receiving layer 90, a side surface of the hole-transport layer 86, and a side surface of the hole-injection layer 85. Thus, a short circuit in the light-emitting devices 150 and a short circuit in the light-receiving devices 160 can be inhibited.

The shorter the distance between the adjacent light-emitting layers 87 is, the more easily the gap is formed, for example. For example, when the distance is less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm, the gap can be favorably formed.

A protective layer 91 is provided over the conductor 122. The protective layer 91 has a function of preventing diffusion of impurities such as water into each light-emitting element from the above.

The protective layer 91 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 91.

A stack of an inorganic insulating film and an organic insulating film can be used as the protective layer 91. For example, a structure where an organic insulating film is provided between a pair of inorganic insulating films is preferably employed. Furthermore, an organic insulating film preferably functions as a planarization film. In that case, a top surface of the organic insulating film can be flat, resulting in improved coverage with an inorganic insulating film thereover and an enhanced barrier property. A top surface of the protective layer 91 is flat; thus, in the case where a structure (e.g., a color filter, an electrode of a touch sensor, or a lens array) is provided above the protective layer 91, the influence of an uneven shape due to a structure below the protective layer 91 can be reduced.

FIG. 30C illustrates a cross-sectional structure example of the display apparatus 100 in the Y direction, specifically, a cross-sectional structure example of the light-emitting device 150R and the light-receiving device 160. Note that the light-emitting device 150G and the light-emitting device 150B can also be arranged in the Y direction like the light-emitting device 150R.

FIG. 30D illustrates a connection portion 93 in which the conductor 123 functioning as a connection electrode and the conductor 122 functioning as a common electrode are electrically connected to each other. In the connection portion 93, the conductor 122 is provided over and in contact with the conductor 123, and the protective layer 91 is provided to cover the conductor 122. The insulating layer 92 is provided so as to cover end portions of the conductor 123.

FIG. 30A shows the light-emitting device 150 in which the conductor 121, the hole-injection layer 85, the hole-transport layer 86, the light-emitting layer 87, the electron-transport layer 88, the common layer (electron-injection layer) 89, and the conductor 122 are provided in this order from the bottom, and the light-receiving device 160 in which the conductor 121PD, the hole-transport layer 86PD, the light-receiving layer 90, the electron-transport layer 88PD, the common layer 89, and the conductor 122 are provided in this order from the bottom; however, one embodiment of the present invention is not limited to this example. For example, in the light-emitting device 150, a conductor functioning as a pixel electrode, an electron-injection layer, an electron-transport layer, a light-emitting layer, a hole-transport layer, a hole-injection layer, and a conductor functioning as a common electrode may be provided in this order from the bottom; in the light-receiving device 160, a conductor functioning as a pixel electrode, an electron-transport layer, a light-receiving layer, a hole-transport layer, and the conductor functioning as the common electrode may be provided in this order from the bottom. In this case, the hole-injection layer of the light-emitting device 150 can be a common layer, which can be provided between the hole-transport layer and the common electrode of the light-receiving device 160. The electron-injection layer can be provided separately for each light-emitting device 150.

Note that this embodiment can be combined with any of the other embodiments described in this specification as appropriate.

Embodiment 4

In this embodiment, a display module using the display apparatus of one embodiment of the present invention is described.

<Structure Example of Display Module>

First, a display module including the display apparatus of one embodiment of the present invention is described.

Figures 31A, 31B:
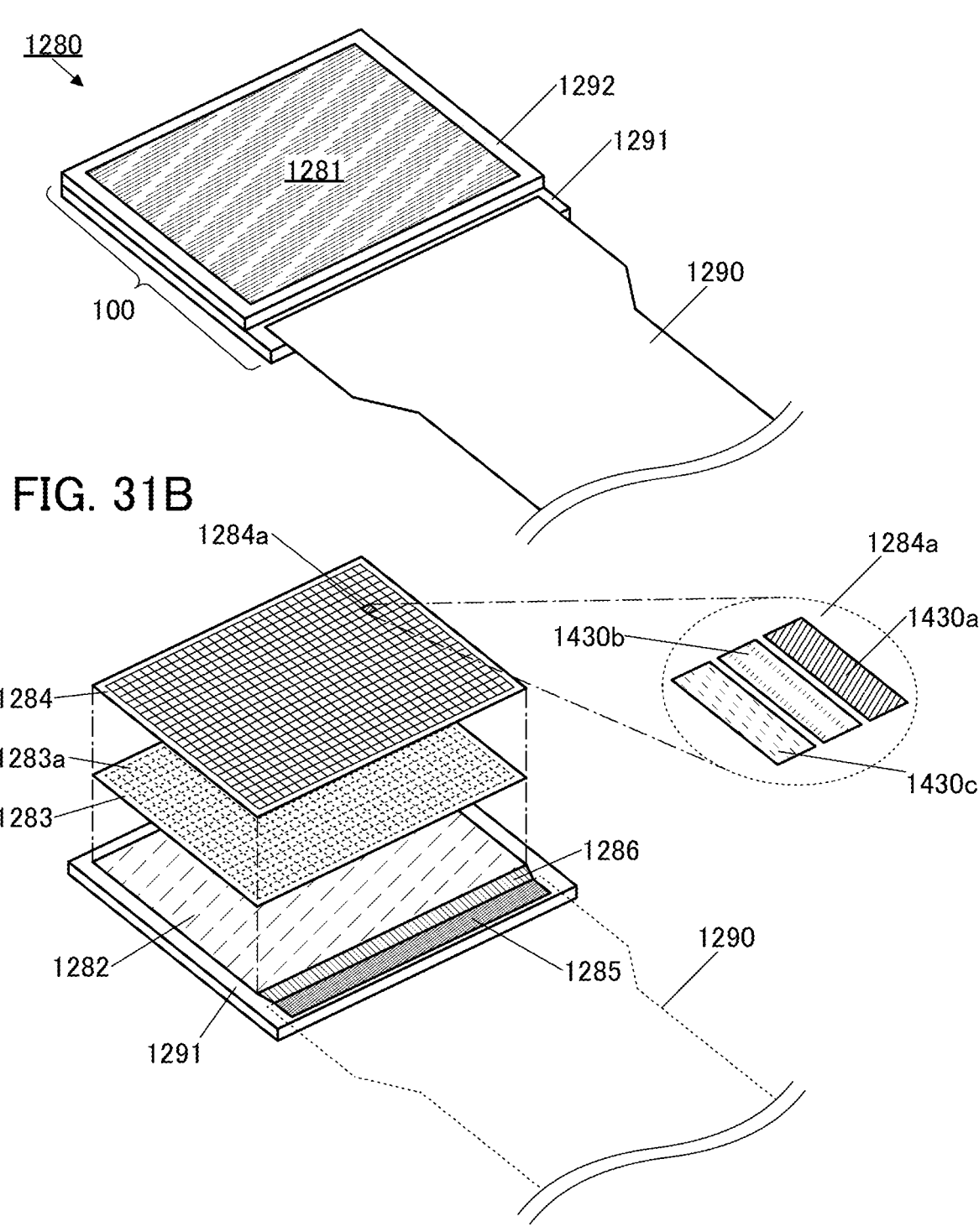
FIG. 31A and FIG. 31B are diagrams illustrating a structure example of a display module.

FIG. 31A is a perspective view of a display module 1280. The display module 1280 includes the display apparatus 100 and an FPC 1290.

The display module 1280 includes a substrate 1291 and a substrate 1292. The display module 1280 includes a display portion 1281. The display portion 1281 is a region of the display module 1280 where an image is displayed and is a region where light emitted from pixels provided in a pixel portion 1284 described later can be seen.

FIG. 31B is a perspective view schematically illustrating a structure on the substrate 1291 side. Over the substrate 1291, a circuit portion 1282, a pixel circuit portion 1283 over the circuit portion 1282, and the pixel portion 1284 over the pixel circuit portion 1283 are stacked. In addition, a terminal portion 1285 for connection to the FPC 1290 is included in a portion not overlapping with the pixel portion 1284 over the substrate 1291. The terminal portion 1285 and the circuit portion 1282 are electrically connected to each other through a wiring portion 1286 formed of a plurality of wirings.

Note that the pixel portion 1284 and the pixel circuit portion 1283 correspond to the pixel layer PXAL described above, for example. The circuit portion 1282 corresponds to the circuit layer SICL described above, for example.

The pixel portion 1284 includes a plurality of pixels 1284*a* arranged periodically. An enlarged view of one pixel 1284*a* is shown on the right side in FIG. 31B. The pixel 1284*a* includes a light-emitting device 1430*a*, a light-emitting device 1430*b*, and a light-emitting device 1430*c* which are different in the emission color. Note that the light-emitting device 1430*a*, the light-emitting device 1430*b*, and the light-emitting device 1430*c* correspond to the light-emitting device 150*a*, the light-emitting device 150*b*, and the light-emitting device 150*c* described above. The above-described light emitting devices may be arranged in a stripe pattern as illustrated in FIG. 31B. Alternatively, a variety of kinds of patterns such as a delta pattern or a PenTile pattern can be employed.

The pixel circuit portion 1283 includes a plurality of pixel circuits 1283*a* arranged periodically.

One pixel circuit 1283*a* is a circuit that controls light emission from three light-emitting devices included in one pixel 1284*a*. One pixel circuit 1283*a* may be provided with three circuits each of which controls light emission of one light-emitting device. For example, the pixel circuit 1283*a* can include at least one selection transistor, one current control transistor (driving transistor), and a capacitor for one light-emitting device. In this case, a gate signal is input to a gate of the selection transistor, and a source signal is input to one of a source and a drain of the selection transistor. With such a structure, an active-matrix display apparatus is achieved.

The circuit portion 1282 includes a circuit for driving each of the pixel circuits 1283*a* in the pixel circuit portion 1283. For example, one or both of a gate line driver circuit and a source line driver circuit are preferably included. In addition, one or more selected from an arithmetic circuit, a memory circuit, and a power supply circuit may be included.

The FPC 1290 serves as a wiring for supplying a video signal, a power supply potential, or the like to the circuit portion 1282 from the outside. An IC may be mounted on the FPC 1290.

The display module 1280 can have a structure in which one or both of the pixel circuit portion 1283 and the circuit portion 1282 are stacked below the pixel portion 1284; thus, the aperture ratio (the effective display area ratio) of the display portion 1281 can be significantly high. For example, the aperture ratio of the display portion 1281 can be higher than or equal to 40% and lower than 100%, preferably higher than or equal to 50% and lower than or equal to 95%, and further preferably higher than or equal to 60% and lower than or equal to 95%. Furthermore, the pixels 1284*a* can be arranged extremely densely and thus the display portion 1281 can have greatly high resolution. For example, the pixels 1284*a* are preferably arranged in the display portion 1281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 1280 has extremely high resolution, and thus can be suitably used for a device for VR such as a head-mounted display or a glasses-type device for AR. For example, even in the case of a structure in which the display portion of the display module 1280 is seen through a lens, pixels of the extremely-high-resolution display portion 1281 included in the display module 1280 are prevented from being seen when the display portion is enlarged by the lens, so that display providing a high sense of immersion can be performed. Without being limited thereto, the display module 1280 can be suitably used for electronic devices including a relatively small display portion. For example, the display module 1280 can be favorably used in a display portion of an electronic device to be worn on a human body, such as a wrist-watch type electronic device.

Note that this embodiment can be combined with any of the other embodiments described in this specification as appropriate.

Embodiment 5

In this embodiment, an example of a head-mounted display including a display apparatus will be described as an example of an electronic device of one embodiment of the present invention.

Figure 32A:
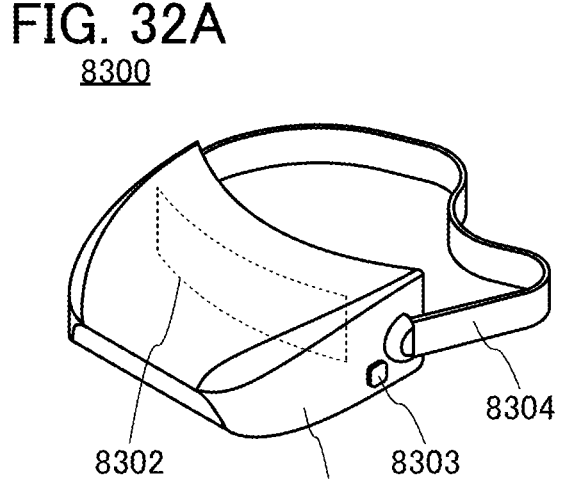
FIG. 32A to FIG. 32F are diagrams illustrating structure examples of an electronic device.
Figure 32B:
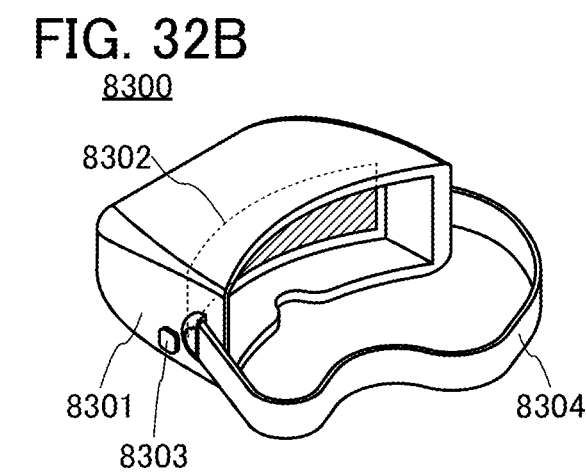

FIG. 32A and FIG. 32B illustrate external views of a head-mounted display 8300.

The head-mounted display 8300 includes a housing 8301, a display portion 8302, an operation button 8303, and a band-shaped fixing unit 8304.

The operation button 8303 has a function of a power button, for example. The head-mounted display 8300 may include a button other than the operation button 8303.

Figure 32C:
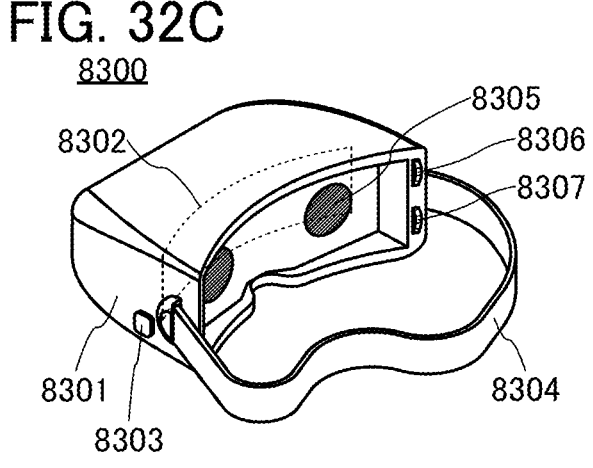

As illustrated in FIG. 32C, lenses 8305 may be provided between the display portion 8302 and the user's eyes. The user can see magnified images on the display portion 8302 through the lenses 8305, leading to a higher realistic sensation. In that case, as illustrated in FIG. 32C, a dial 8306 for changing the position of the lenses and adjusting visibility may be included.

The display portion 8302 can use the display apparatus of one embodiment of the present invention. The display apparatus of one embodiment of the present invention has an extremely high resolution; thus, even when an image is magnified using the lenses 8305 as in FIG. 32C, the user does not perceive pixels, and a more realistic image can be displayed.

FIG. 32A to FIG. 32C each illustrate an example in which one display portion 8302 is provided. This structure can reduce the number of components.

The display portion 8302 can display an image for the right eye and an image for the left eye side by side on a right region and a left region, respectively. Thus, a three-dimensional image using binocular disparity can be displayed.

One image which can be seen by both eyes may be displayed on the entire display portion 8302. A panorama image can thus be displayed from end to end of the field of view, which can provide a higher sense of reality.

Here, the head-mounted display 8300 preferably has a mechanism for changing the curvature of the display portion 8302 to an optimal value in accordance with the size of the user's head, the position of the user's eyes, or the like. For example, the user himself/herself may adjust the curvature of the display portion 8302 by operating a dial 8307 for adjusting the curvature of the display portion 8302. Alternatively, a sensor for detecting the size of the user's head, the position of the user's eyes, or the like (e.g., a camera, a contact sensor, or a noncontact sensor) may be provided on the housing 8301, and a mechanism for adjusting the curvature of the display portion 8302 on the basis of data detected by the sensor may be provided.

In the case where the lenses 8305 are used, a mechanism for adjusting the position and angle of the lenses 8305 in synchronization with the curvature of the display portion 8302 is preferably provided. Alternatively, the dial 8306 may have a function of adjusting the angle of the lenses.

Figure 32D:
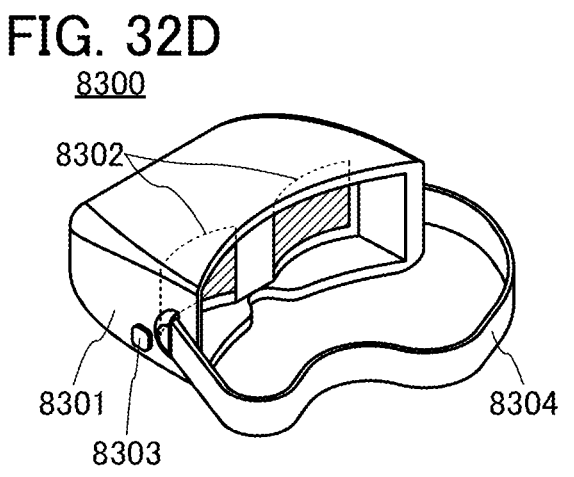
Figure 32E:
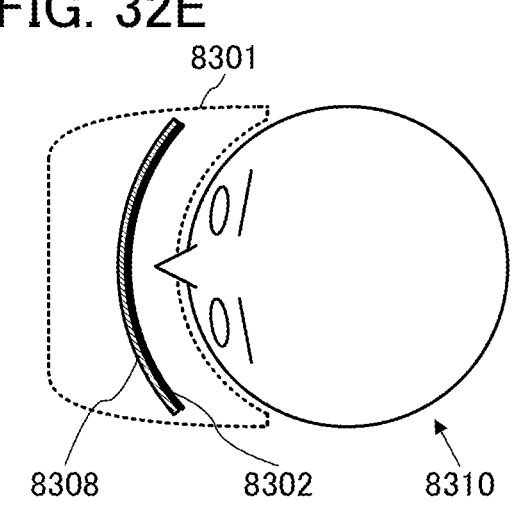
Figure 32F:
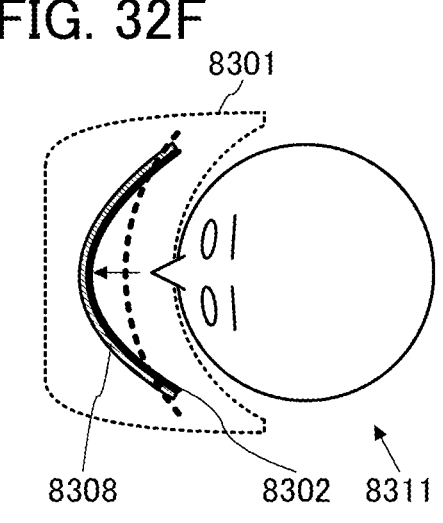

FIG. 32E and FIG. 32F illustrate an example of including a driver portion 8308 that controls the curvature of the display portion 8302. The driver portion 8308 is fixed to at least a part of the display portion 8302. The driver portion 8308 has a function of changing the shape of the display portion 8302 when the part that is fixed to the display portion 8302 changes in shape or moves.

FIG. 32E is a schematic diagram illustrating the case where a user 8310 having a relatively large head wears the housing 8301. In that case, the driver portion 8308 adjusts the shape of the display portion 8302 so that the curvature is relatively small (the radius of curvature is large).

By contrast, FIG. 32F illustrates the case where a user 8311 having a smaller head than the user 8310 wears the housing 8301. The user 8311 has a shorter distance between the eyes than the user 8310. In that case, the driver portion 8308 adjusts the shape of the display portion 8302 so that the curvature of the display portion 8302 is large (the radius of curvature is small). In FIG. 32F, the position and shape of the display portion 8302 in FIG. 32E are denoted by a dashed line.

When the head-mounted display 8300 has such a mechanism for adjusting the curvature of the display portion 8302, an optimal display can be offered to a variety of users of all ages and genders.

When the curvature of the display portion 8302 is changed in accordance with contents displayed on the display portion 8302, the user can have a more realistic sensation. For example, shaking can be expressed by vibrating the curvature of the display portion 8302. In this way, it is possible to produce various effects according to the scene in contents, and provide the user with new experiences. A further realistic display can be provided when the display portion 8302 operates in conjunction with a vibration module provided in the housing 8301.

Note that the head-mounted display 8300 may include two display portions 8302 as illustrated in FIG. 32D.

Since the two display portion 8302 are included, the user's eyes can see their respective display portions. Thus, a high-resolution image can be displayed even when a three-dimensional display using parallax is performed. In addition, the display portion 8302 is curved around an arc with the user's eye as an approximate center. Thus, distances between the user's eye and display surfaces of the display portion become equal; thus, the user can see a more natural image. Even when the luminance or chromaticity of light from the display portion is changed depending on the angle at which the user see it, since the user's eye is positioned in a normal direction of the display surface of the display portion, the influence of the change can be substantially ignorable and thus a more realistic image can be displayed.

Note that this embodiment can be combined with any of the other embodiments described in this specification as appropriate.

Embodiment 6

In this embodiment, a display module that can be fabricated using the display apparatus of one embodiment of the present invention is described.

Figures 33A, 33B:
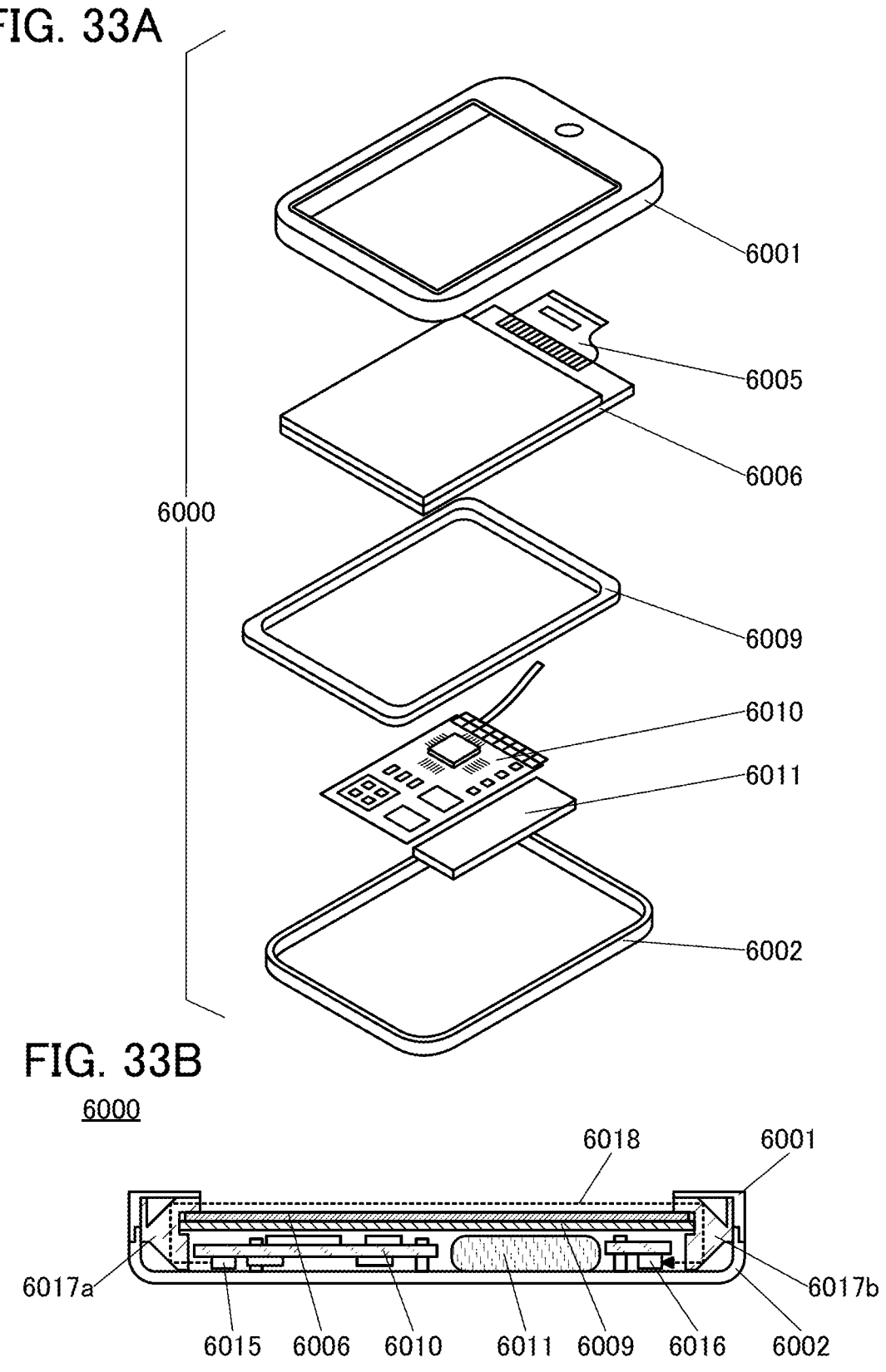
FIG. 33A and FIG. 33B are diagrams illustrating a structure example of a display module.

In a display module 6000 illustrated in FIG. 33A, a display apparatus 6006 to which an FPC 6005 is connected, a frame 6009, a printed circuit board 6010, and a battery 6011 are provided between an upper cover 6001 and a lower cover 6002.

A display apparatus fabricated using the display apparatus of one embodiment of the present invention can be used as the display apparatus 6006, for example. With the display apparatus 6006, a display module with extremely low power consumption can be achieved.

The shape and size of the upper cover 6001 and the lower cover 6002 can be changed as appropriate in accordance with the size of the display apparatus 6006.

The display apparatus 6006 may have a function of a touch panel.

The frame 6009 may have one or more selected from a function of protecting the display apparatus 6006, a function of blocking electromagnetic waves generated by the operation of the printed circuit board 6010, and a function of a heat dissipation plate.

The printed circuit board 6010 includes a power supply circuit, a signal processing circuit for outputting a video signal and a clock signal, a battery control circuit, and the like.

FIG. 33B is a schematic cross-sectional view of the display module 6000 including an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display apparatus 6006 overlaps with the printed circuit board 6010 and the battery 6011 with the frame 6009 therebetween. The display apparatus 6006 and the frame 6009 are fixed to the light guide portion 6017a and the light guide portion 6017b.

Light 6018 emitted from the light-emitting portion 6015 travels over the display apparatus 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display apparatus 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

The light guide portion 6017a and the light guide portion 6017b which transmit the light 6018 allow the light-emitting portion 6015 and the light-receiving portion 6016 to be placed under the display apparatus 6006, inhibiting a malfunction of the touch sensor due to external light reaching the light-receiving portion 6016. Particularly when a resin that absorbs visible light and transmits infrared rays is used, a malfunction of the touch sensor can be inhibited more effectively. Note that this embodiment can be combined with any of the other embodiments described in this specification as appropriate.

Embodiment 7

In this embodiment, examples of an electronic device for which the display apparatus of one embodiment of the present invention can be used are described.

Figures 34A, 34B:
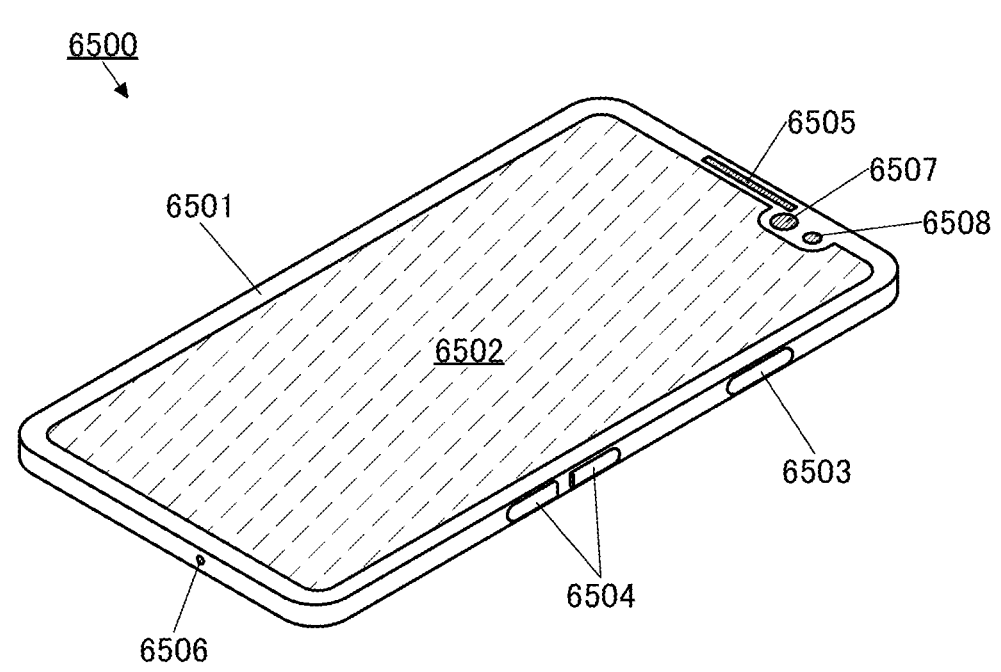
FIG. 34A and FIG. 34B are diagrams illustrating a structure example of an electronic device.

An electronic device 6500 illustrated in FIG. 34A is a portable information terminal that can be used as a smartphone.

The electronic device 6500 includes a housing 6501, a display portion 6502, a power button 6503, buttons 6504, a speaker 6505, a microphone 6506, a camera 6507, and a light source 6508. The display portion 6502 has a touch panel function.

The display apparatus of one embodiment of the present invention can be used in the display portion 6502.

FIG. 34B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with an adhesive layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel can be used as the display panel 6511, for example. Thus, an extremely lightweight electronic device can be obtained. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

Note that this embodiment can be combined with any of the other embodiments described in this specification as appropriate.

Embodiment 8

In this embodiment, electronic devices each including a display apparatus fabricated using one embodiment of the present invention are described.

Electronic devices described below as examples each include the display apparatus of one embodiment of the present invention in a display portion. Thus, the electronic devices achieve high resolution.

One embodiment of the present invention includes the display apparatus and one or more selected from an antenna, a battery, a housing, a camera, a speaker, a microphone, a touch sensor, and an operation button.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

A display portion in an electronic device of one embodiment of the present invention can display a video with a resolution of, for example, full high definition, 4K2K, 8K4K, 16K8K, or higher.

As examples of the electronic device, electronic devices having a relatively large screen, such as a television device, a laptop personal computer, a monitor device, digital signage, a pachinko machine, and a game machine are given. In addition, as examples of the electronic device, a digital camera, a digital video camera, a digital photo frame, a mobile phone device, a portable game machine, a portable information terminal, and an audio reproducing device are given.

An electronic device to which one embodiment of the present invention is applied can be incorporated along a flat surface or a curved surface of an interior or an exterior of a building (e.g., a house) or a moving vehicle (e.g., an automobile).

Figure 35A:
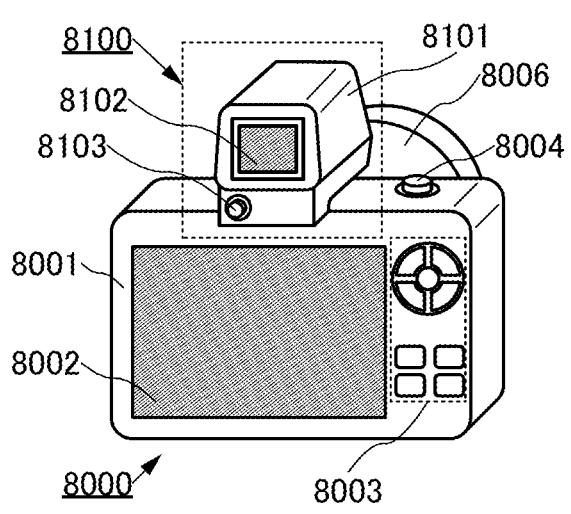
FIG. 35A to FIG. 35C are diagrams illustrating structure examples of electronic devices.

FIG. 35A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100 or a stroboscope can be connected to the housing.

The finder 8100 includes a housing 8101, a display portion 8102, or a button 8103.

The housing 8101 is attached to the camera 8000 with the mount engaging with a mount of the camera 8000. In the finder 8100, a video received from the camera 8000 can be displayed on the display portion 8102.

The button 8103 has a function of a power button, for example.

The display apparatus of one embodiment of the present invention can be used for the display portion 8002 of the camera 8000 and the display portion 8102 of the finder 8100. Note that a finder may be incorporated in the camera 8000.

Figure 35B:
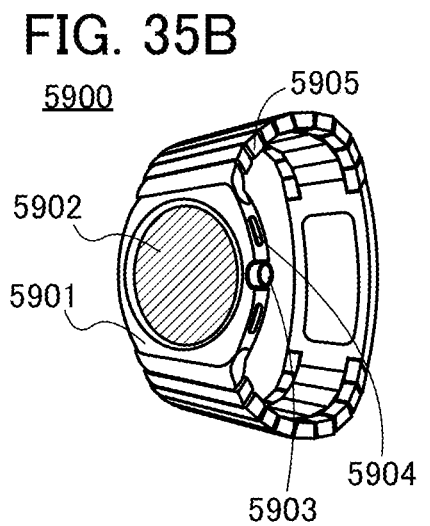

FIG. 35B is an external view of an information terminal 5900 that is an example of a wearable terminal. The information terminal 5900 includes a housing 5901, a display portion 5902, an operation button 5903, an operator 5904, and a band 5905.

The wearable terminal can display an image with high display quality on the display portion 5902 by including the display apparatus described in the above embodiment.

Figure 35C:
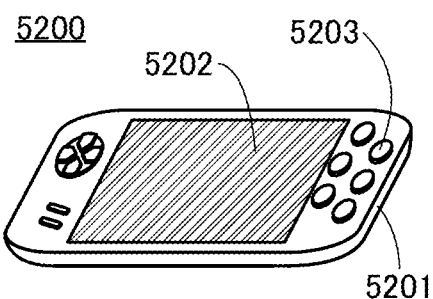

FIG. 35C is a diagram illustrating the appearance of a portable game machine 5200 which is an example of a game machine. The portable game machine 5200 includes a housing 5201, a display portion 5202, and a button 5203.

Videos displayed on the portable game machine 5200 can be output with a television device, a personal computer display, a game display, or a display apparatus provided in a head-mounted display.

The portable game machine 5200 can display an image with high display quality on the display portion 5202 by including the display apparatus described in the above embodiment. In addition, the portable game machine 5200 with low power consumption can be provided. Moreover, heat generation from a circuit can be reduced owing to low power consumption; thus, the influence of heat generation on the circuit itself, a peripheral circuit, and a module can be reduced.

Figure 36A:
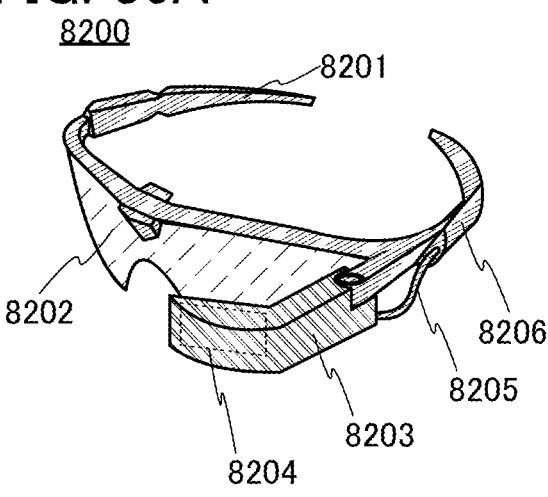
FIG. 36A to FIG. 36D are diagrams illustrating structure examples of electronic devices.

FIG. 36A is a diagram illustrating appearance of a head-mounted display 8200.

The head-mounted display 8200 includes a mounting portion 8201, a lens 8202, a main body 8203, a display portion 8204, and a cable 8205. In addition, a battery 8206 is incorporated in the mounting portion 8201.

The cable 8205 supplies power from the battery 8206 to the main body 8203. The main body 8203 includes a wireless receiver and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display apparatus of one embodiment of the present invention can be used for the display portion 8204.

Figure 36B:
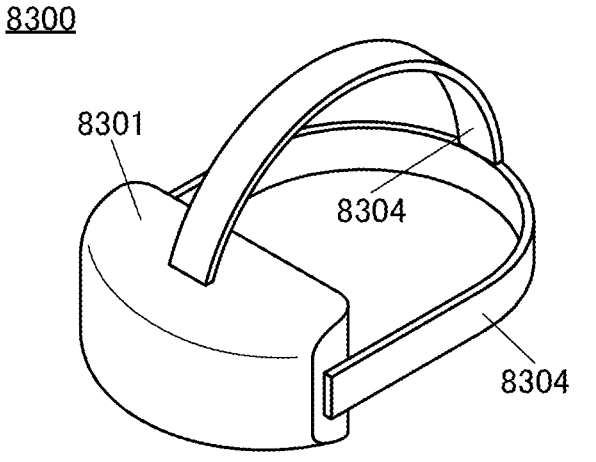
Figure 36C:
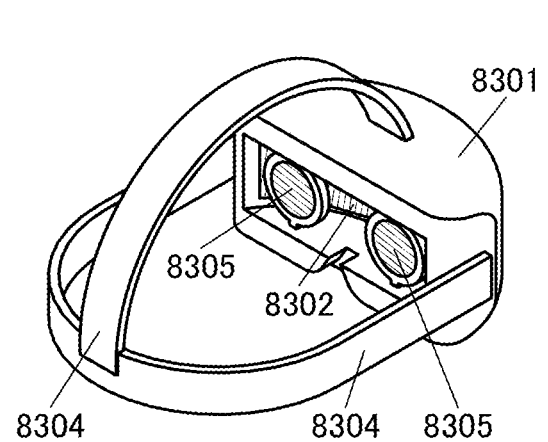
Figure 36D:
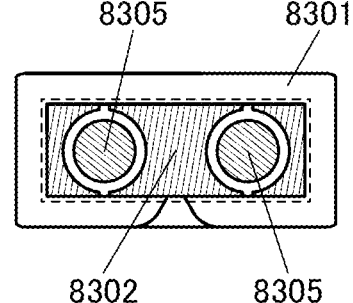

FIG. 36B, FIG. 36C, and FIG. 36D are diagrams illustrating appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably curved and placed because the user can feel a high realistic sensation. In addition, when another image displayed on a different region of the display portion 8302 is viewed through the lenses 8305, three-dimensional display using parallax can also be performed. Note that the number of display portions 8302 provided is not limited to one; two display portions 8302 may be provided so that one display portion is provided for one eye of the user.

Note that the display apparatus of one embodiment of the present invention can be used in the display portion 8302. The display apparatus including the semiconductor device of one embodiment of the present invention has an extremely high resolution; thus, even when a video is magnified by the lenses 8305 as in FIG. 36D, the user does not perceive pixels, and a more realistic video can be displayed.

Note that this embodiment can be combined with any of the other embodiments described in this specification as appropriate.

REFERENCE NUMERALS

SICL: circuit layer, LINL: wiring layer, PXAL: pixel layer, BS1: substrate, BS2: substrate, LIA: region, DRV: driver circuit region, ALP: pixel array, LD: local driver circuit, SD: driver circuit, GD: driver circuit, CON: controller, PG: voltage generation circuit, ARA: pixel region, PX: pixel circuit, SL: wiring, GL: wiring, SSW: switch, GSW: switch, CNT1A: conductor, CNT1B: conductor, CNT2: conductor, ER: conductor, ERA: conductor, LRA: low-resistance region, LRA3: low-resistance region, SHA: semiconductor region, DDL: separation layer, MSK: insulator, INS1: insulator, INS2: insulator, INS3: insulator, INS4: insulator, WTr: writing transistor, GE: conductor, SHB: semiconductor region, LRB: low-resistance region, EML: layer, OSL: layer, ANO: wiring, GL1: wiring, GL2: wiring, GL3: wiring, V0: wiring, VCOM: wiring, 10: display apparatus, 10A: display apparatus, 10B: display apparatus, 30: driver circuit, 80: pixel, 85R: hole-injection layer, 85G: hole-injection layer, 85B: hole-injection layer, 86R: hole-transport layer, 86G: hole-transport layer, 86B: hole-transport layer, 86PD: hole-transport layer, 87R: light-emitting layer, 87G: light-emitting layer, 87B: light-emitting layer, 88R: electron-transport layer, 88G: electron-transport layer, 88B: electron-transport layer, 88PD: electron-transport layer, 89: common layer, 90: light-receiving layer, 91: connection layer, 92: insulating layer, 93: connection portion, 100: display apparatus, 102: substrate, 111: insulator, 112: insulator, 113: insulator, 113a: insulator, 113b: insulator, 113c: insulator, 114: insulator, 121a: conductor, 121b: conductor, 121c: conductor, 121R: conductor, 121G: conductor, 121B: conductor, 121PD: conductor, 121CM: conductor, 122: conductor, 123: conductor, 141a: EL layer, 141b: EL layer, 141c: EL layer, 142: EL layer, 150: light-emitting device, 150a: light-emitting device, 150b: light-emitting device, 150c: light-emitting device, 150R: light-emitting device, 150G: light-emitting device, 150B: light-emitting device, 150IR: light-emitting device, 160: light-receiving device, 161: resin layer, 162a: coloring layer, 162b: coloring layer, 162c: coloring layer, 164: adhesive layer, 165: adhesive layer, 200: transistor, 202: insulator, 210: substrate, 214: insulator, 216: conductor, 220: insulator, 222: insulator, 224: insulator, 226: insulator, 228: conductor, 230: conductor, 250: insulator, 252: insulator, 256: conductor, 300: transistor, 310: substrate, 312: element separation layer, 313: semiconductor region, 314a: low-resistance region, 314b: low-resistance region, 315: insulator, 316: conductor, 317: insulator, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 376: conductor, 380: insulator, 400: pixel circuit, 400A: pixel circuit, 400B: pixel circuit, 400C: pixel circuit, 400D: pixel circuit, 400E: pixel circuit, 400F: pixel circuit, 400G: pixel circuit, 400H: pixel circuit, 500: transistor, 500A: transistor, 500B: transistor, 500C: transistor, 500D: transistor, 503: conductor, 503a: conductor, 503b: conductor, 512: insulator, 514: insulator, 516: insulator, 522: insulator, 524: insulator, 530: oxide, 530a: oxide, 530b: oxide, 530ba: region, 530bb: region, 530bc: region, 540: conductor, 540a: conductor, 540b: conductor, 541: insulator, 541a: insulator, 541b: insulator, 542: conductor, 542a: conductor, 542b: conductor, 544: insulator, 550: insulator, 550a: insulator, 550b: insulator, 552: insulator, 554: insulator, 560: conductor, 560a: conductor, 560b: conductor, 571: insulator, 571a: insulator, 571b: insulator, 574: insulator, 576: insulator, 580: insulator, 581: insulator, 600: capacitance, 600A: capacitance, 1280: display module, 1281: display portion, 1290: FPC, 1283: pixel circuit portion, 1283a: pixel circuit, 1284: pixel portion, 1284a: pixel, 1285: terminal portion, 1286: wiring portion, 1291: substrate, 1292: substrate, 1430a: light-emitting device, 1430b: light-emitting device, 1430c: light-emitting device, 4400a: light-emitting unit, 4400b: light-emitting unit, 4411: light-emitting layer, 4412: light-emitting layer, 4413: light-emitting layer, 4420: layer, 4420-1: layer, 4420-2: layer, 4430: layer, 4430-1: layer, 4430-2: layer, 4440: intermediate layer, 5200: portable game machine, 5201: housing, 5202: display portion, 5203: button, 5900: information terminal, 5901: housing, 5902: display portion, 5903: operation button, 5904: operator, 5905: band, 6000: display module, 6001: upper cover, 6002: lower cover, 6005: FPC, 6006: display apparatus, 6009: frame, 6010: printed circuit board, 6011: battery, 6015: light-emitting portion, 6016: light-receiving portion, 6017a: light guide portion, 6017b: light guide portion, 6018: light, 6500: electronic device, 6501: housing, 6502: display portion, 6503: power supply button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8303: operation button, 8304: fixing unit, 8305: lens, 8306: dial, 8307: dial, 8308: driver portion, 8310: user, 8311: user This application is based on Japanese Patent Application Serial No. 2021-060330 filed on Mar. 31, 2021, the entire contents are hereby incorporated herein by reference.

The invention claimed is:

1. A display apparatus comprising:

a first layer; and a second layer over the first layer, wherein the first layer comprises a first driver circuit and a second driver circuit, wherein the second layer comprises a first pixel region and a second pixel region, wherein the first pixel region comprises a first pixel circuit, wherein the second pixel region comprises a second pixel circuit, wherein the first pixel region comprises a region overlapping with the first driver circuit, wherein the second pixel region comprises a region overlapping with the second driver circuit, wherein the first pixel circuit is electrically connected to the first driver circuit through a first wiring, wherein the second pixel circuit is electrically connected to the second driver circuit through a second wiring, wherein the first wiring is electrically connected to the second wiring through a switch, wherein when the switch is off, the first driver circuit is configured to transmit first image data to the first pixel circuit and the second driver circuit is configured to transmit second image data to the second pixel circuit, and wherein when the switch is on, the first driver circuit is configured to transmit the first image data to the first pixel circuit and to transmit the second image data to the second pixel circuit.

2. The display apparatus according to claim 1, wherein the switch is included in the first layer or the second layer.

3. The display apparatus according to claim 1, wherein the first layer comprises a first substrate, wherein the second layer comprises a second substrate, wherein each of the first substrate and the second substrate is a semiconductor substrate containing silicon as a material, wherein a channel formation region of each transistor included in the first driver circuit and the second driver circuit contains silicon included in the first substrate, and wherein a channel formation region of each transistor included in the first pixel region and the second pixel region contains silicon included in the second substrate.

4. The display apparatus according to claim 1, wherein the first layer comprises a first substrate, wherein the first substrate is a semiconductor substrate containing silicon as a material, wherein each transistor included in the first driver circuit and the second driver circuit is a transistor formed over the first substrate, and wherein each transistor included in the first pixel region and the second pixel region is a transistor containing a metal oxide in a channel formation region.

5. An electronic device comprising:

the display apparatus according to claim 1; and a housing.

6. A method of manufacturing a semiconductor device comprising a second substrate, wherein the second substrate is a semiconductor substrate containing silicon as a material, wherein the method comprises a first step to a seventh step, wherein the first step comprises a step of forming a separation layer over the second substrate, wherein the second step comprises a step of forming a well in a region of the second substrate other than a region where the separation layer is formed, wherein the third step comprises a step of forming a first insulator over a part of a region of the second substrate where the well is formed, wherein the fourth step comprises a step of forming a first low-resistance region and a second low-resistance region in a region of the second substrate other than regions where the separation layer and the first insulator are formed, wherein the fifth step comprises a step of transferring the process to the sixth step in the case where a malfunction occurs in one of a first driver circuit and a second driver circuit included in a first substrate, and transferring the process to the seventh step in the case where a malfunction occurs in neither the first driver circuit nor the second driver circuit included in the first substrate, wherein the sixth step comprises a step of removing the first insulator and a step of forming a third low-resistance region in a region of the second substrate where the first insulator is formed, and wherein the seventh step comprises a step of forming a second insulator over the second substrate, a step of providing an opening in a region of the second insulator overlapping with the separation layer, the first low-resistance region, and the second low-resistance region, and a step of forming a conductor in the opening.

* * * * *